(12) United States Patent
Yamamoto et al.

(10) Patent No.: US 7,375,013 B2
(45) Date of Patent: May 20, 2008

(54) SEMICONDUCTOR INTEGRATED CIRCUIT DEVICE AND PROCESS FOR MANUFACTURING THE SAME

(75) Inventors: Naoki Yamamoto, Kawaguchi (JP); Yoshikazu Tanabe, Iruma (JP); Hiroshige Kogayu, Fussa (JP); Takehiko Yoshida, Tokai (JP)

(73) Assignee: Renesas Technology Corp., Tokyo (JP)

( * ) Notice: Subject to any disclaimer, the term of this patent is extended or adjusted under 35 U.S.C. 154(b) by 11 days.

(21) Appl. No.: 11/396,000

(22) Filed: Apr. 3, 2006

(65) Prior Publication Data

US 2006/0175651 A1    Aug. 10, 2006

Related U.S. Application Data

(62) Division of application No. 10/468,462, filed as application No. PCT/JP01/09548 on Oct. 31, 2001, now Pat. No. 7,053,459.

(30) Foreign Application Priority Data

Mar. 12, 2001    (JP) .............................. 2001-069518

(51) Int. Cl.
  *H01L 21/28* (2006.01)
  *H01L 21/44* (2006.01)
(52) U.S. Cl. ...................... 438/583; 438/630; 438/651; 438/683; 438/755
(58) Field of Classification Search ................ 438/583, 438/630, 651, 655, 656, 683, 755
  See application file for complete search history.

(56) References Cited

U.S. PATENT DOCUMENTS

| | | | |
|---|---|---|---|
| 4,282,270 A | 8/1981 | Nozaki et al. ................ 427/93 |
| 4,505,028 A | 3/1985 | Kobayashi et al. ........... 29/578 |
| 5,088,314 A | 2/1992 | Takashi ..................... 73/23.21 |
| 5,202,096 A | 4/1993 | Jain ........................... 422/190 |
| 5,387,540 A | 2/1995 | Poon et al. ................... 437/67 |
| 5,693,578 A | 12/1997 | Nakanishi et al. .......... 437/238 |
| 5,719,410 A | 2/1998 | Suehiro et al. ............. 257/777 |
| 6,066,508 A | 5/2000 | Tanabe et al. ................ 438/38 |
| 6,856,001 B2 | 2/2005 | Rhodes ........................ 257/519 |
| 2001/0042344 A1 | 11/2001 | Ohmi et al. .................. 48/204 |
| 2001/0050686 A1 | 12/2001 | Allen ........................ 345/543 |

(Continued)

FOREIGN PATENT DOCUMENTS

EP    0 964 437    12/1999

(Continued)

OTHER PUBLICATIONS

Maeda, K., *Latest LSI Processing Technology*, Kogyo Chosakai Publishing Co., 1983, pp. 111-113 (with English translation).

(Continued)

*Primary Examiner*—Fernando L. Toledo
(74) *Attorney, Agent, or Firm*—Miles & Stockbridge P.C.

(57) ABSTRACT

Formation of an $WN_X$ film 24 constituting a barrier layer of a gate electrode 7A having a polymetal structure is effected in an atmosphere containing a high concentration nitrogen gas, whereby release of N (nitrogen) from the $WN_X$ film 24 is suppressed in the heat treatment step after the formation of the gate electrode 7A.

33 Claims, 71 Drawing Sheets

U.S. PATENT DOCUMENTS

| | | | |
|---|---|---|---|
| 2002/0011632 A1 | 1/2002 | Komori | 257/393 |
| 2002/0056874 A1 | 5/2002 | Ohtake et al. | 257/336 |

FOREIGN PATENT DOCUMENTS

| | | |
|---|---|---|
| JP | 56-107552 | 8/1981 |
| JP | 59-10271 | 1/1984 |
| JP | 60-72229 | 4/1985 |
| JP | 60-89943 | 5/1985 |
| JP | 60-107840 | 6/1985 |
| JP | 60-123060 | 7/1985 |
| JP | 61-127123 | 6/1986 |
| JP | 61-127124 | 6/1986 |
| JP | 61-150236 | 7/1986 |
| JP | 61-152076 | 7/1986 |
| JP | 61-267365 | 11/1986 |
| JP | 1-94657 | 4/1989 |
| JP | 2-35775 | 2/1990 |
| JP | 3-119763 | 5/1991 |
| JP | 3-147328 | 6/1991 |
| JP | 5-141871 | 6/1993 |
| JP | 5-144804 | 6/1993 |
| JP | 5-152282 | 6/1993 |
| JP | 6-115903 | 4/1994 |
| JP | 6-120206 | 4/1994 |
| JP | 6-163871 | 6/1994 |
| JP | 6-333918 | 12/1994 |
| JP | 7-94716 | 4/1995 |
| JP | 7-94731 | 4/1995 |
| JP | 7-321102 | 12/1995 |
| JP | 8-83772 | 3/1996 |
| JP | 8-264531 | 10/1996 |
| JP | 9-75651 | 3/1997 |
| JP | 9-172011 | 6/1997 |
| JP | 9-298170 A | 11/1997 |
| JP | 10-223900 | 8/1998 |
| JP | 10-335652 | 12/1998 |
| JP | 10-340909 | 12/1998 |
| JP | 11-26395 | 1/1999 |
| JP | 11-31666 | 2/1999 |
| JP | 11-102877 | 4/1999 |
| JP | 11-204456 | 7/1999 |
| JP | 11-330468 | 11/1999 |
| JP | 2000-22154 | 1/2000 |
| JP | 2000-36593 A | 2/2000 |
| JP | 2000-68502 A | 3/2000 |
| JP | 2000-118491 | 4/2000 |
| JP | 2000-294562 | 10/2000 |
| JP | 2000-331978 | 11/2000 |
| JP | 2000-349285 | 12/2000 |
| JP | 2001-7329 | 1/2001 |
| JP | 2001-15754 | 1/2001 |
| JP | 2001-189448 | 7/2001 |
| JP | 2002-16248 | 1/2002 |
| WO | WO97/28085 | 8/1997 |
| WO | WO98/39802 | 9/1998 |

OTHER PUBLICATIONS

Yamada, M., *Handbook of Semiconductor Processing*, Ch. 1, Section 17, pp. 153-157, Oct. 15, 1996.

A. Noya et al., "Barrier Properties of W2N and ZrN films in poly-metal gate electrodes", *Technical Report of The Institute of Electronics, Information and Communication Engineers*, Oct. 1999, pp. 57-62 (with English Abstract).

Yasushi Akasaka et al., "Low-Resistivity Poly-Metal Gate Electrode Durable for High-Temperature Processing," *IEEE Transactions on Electron Devices*, vol. 43, No. 11, Nov. 1996, pp. 1864-1869.

K. Nakajima et al., "Formation Mechanism of Ultrathin WSiN Barrier Layer in a W/WN$_x$/Si System," *Applied Surface Science 117/118* (1997), pp. 312-316.

Gekkan, *Semiconductor World*, vol. 14, No. 14, Nov. 1995, pp. 161-165.

F. Ohtake et al., "A Thin Amorphous Silicon Buffer Process for Suppression of W polymetal Gate Depletion in PMOS", *2000 Symposium on VLSI Technology Digest of Technical Papers*, Jun. 13-15, 2000, pp. 74-75.

E. Kolawa et al., "$W_xN_{1-x}$ Alloys as Diffusion Barriers between Al and Si", J. Appl. Phys. 64 (5), Sep. 1, 1988, pp. 2787-2789.

J. Jung et al., "A Fully Working 0.14 μm DRAM Technology with Polymetal (W/WNx/Poly-Si) Gate", *Electron Devices Meeting*, IEDM Technical Digest, Dec. 10-13, 2000, pp. 365-368.

K. Nakajima et al., "Poly-metal Gate Process-Ultrathin WSiN Barrier Layer Impermeable to Oxidant In-diffusion During Si Selective Oxidation," Advanced Metallization Conference Japan Session, Tokyo University, 1995.

Y. Hiura et al., "Integration Technorology of Polymetal (W/WSiN/Poly-Si) Dual Gate CMOS for 1Gbit DRAMs and Beyond", *Electron Devices Meeting*, IEDM Technical Digest, Dec. 1998, pp. 389-392.

K. Nakamura et al., "Hydrogen-Radical-Balance Steam Oxidation Technology for Ultra-Thin Oxide with High Reliability," *Proceedings of the 45th Symposium on Seminconductors and Integrated Circuits Technology*, Tokyo, Japan, Dec. 1993, pp. 128-133.

E. Kneer et al., "Electrochemistry of Chemical Vapor Deposited Tungsten Films with Relevance to Chemical Mechanical Polishing," *J. Electrochem. Soc.*, vol. 143, No. 12, Dec. 1996, pp. 4095-4100.

(a) $W + 3H_2O \rightleftharpoons WO_3 + 3H_2$
(b) $Mo + 2H_2O \rightleftharpoons MoO_2 + 2H_2$
(c) $2Ta + 5H_2O \rightleftharpoons Ta_2O_5 + 5H_2$
(d) $Si + 2H_2O \rightleftharpoons SiO_2 + 2H_2$
(e) $Ti + 2H_2O \rightleftharpoons TiO_2 + 2H_2$

FIG. 20
(a)
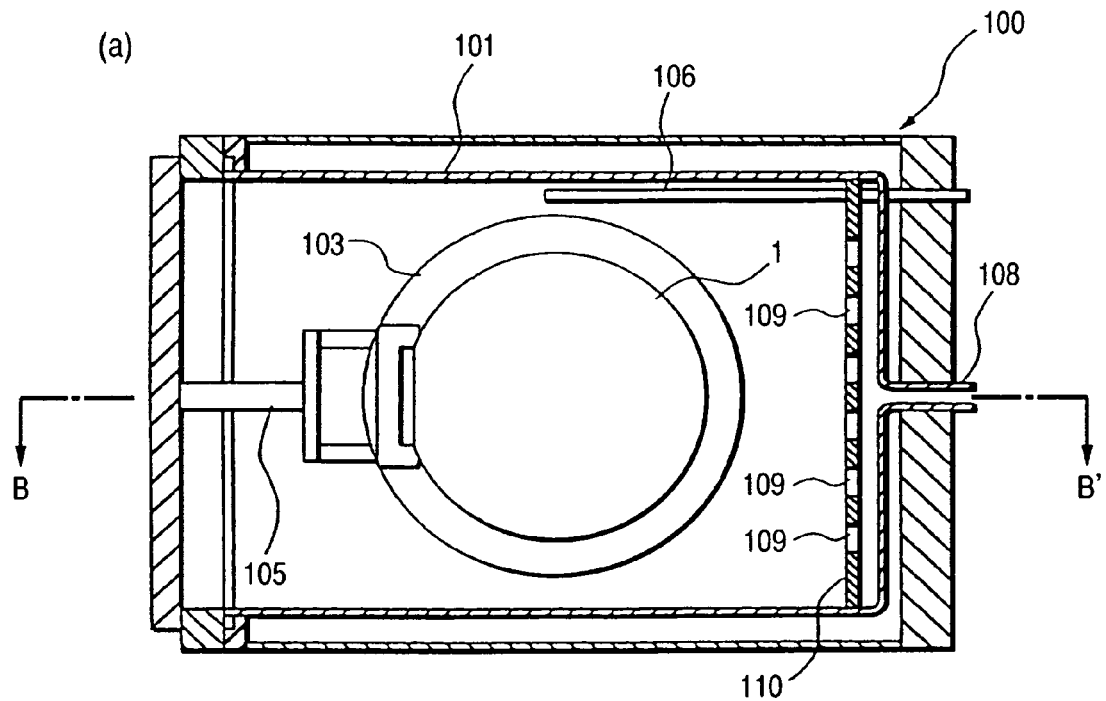
(b)
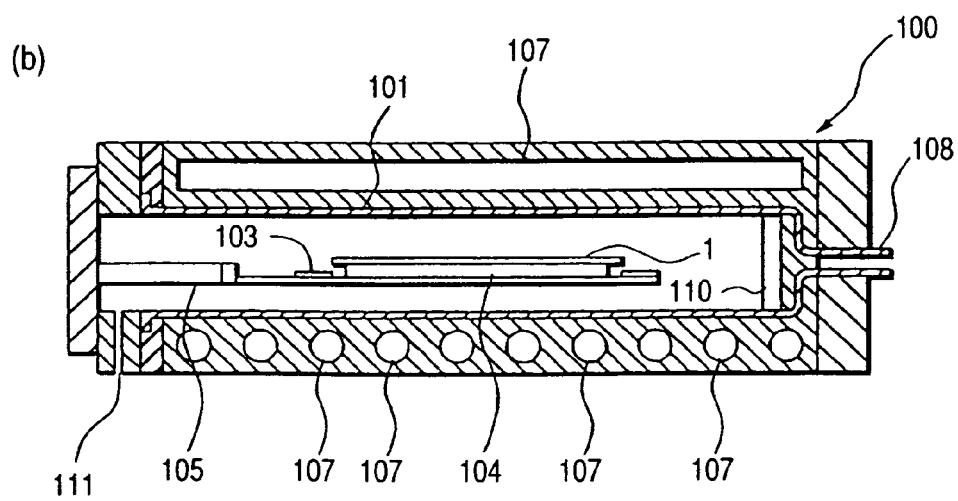

FIG. 47
(a)
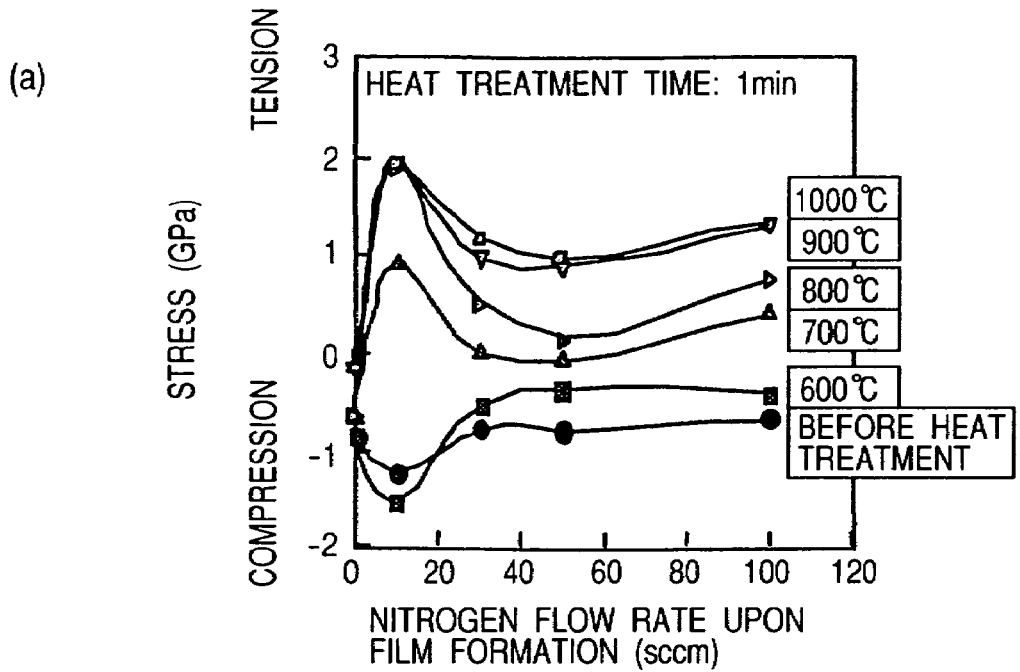
(b)
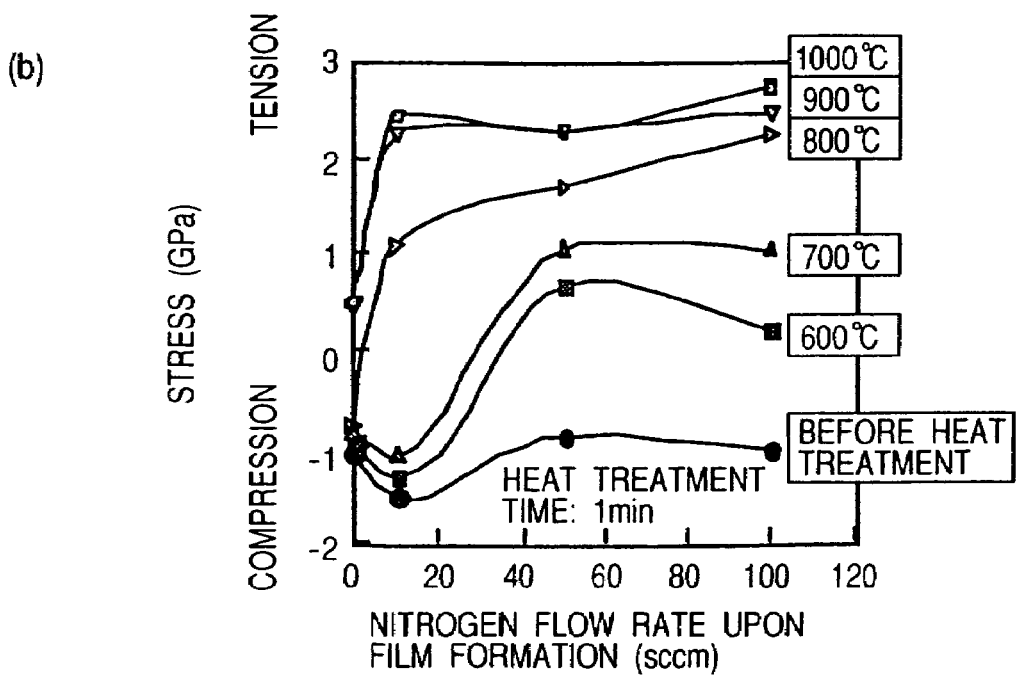

| ITEM | | | 1 | 2 | 3 | 4 | 5 | 6 | 7 | 8 | 9 | 10 |
|---|---|---|---|---|---|---|---|---|---|---|---|---|
| W-1 (FOR SILICIDATION) | | d=7nm | | ○ | ○ | ○ | ○ | ○ | ○ | ○ | ○ | ○ |
| WNx | AMOUNT OF SPUTTERING N GAS N=30% | d=10nm | | ◎ | | | | | | | | |
| | | d=12nm | | | ◎ | | | | | | | |
| | | d=15nm | ○ | | | ◎ | | | | | | |
| | N=50% | d=10nm | | | | | ◎ | | | | | |
| | | d=12nm | | | | | | ◎ | | | | |
| | | d=15nm | | | | | | | ◎ | | | |
| | N=80% | d=10nm | | | | | | | | ◎ | | |
| | | d=12nm | | | | | | | | | ◎ | |
| | | d=15nm | | | | | | | | | | ◎ |
| W-2 | | d=50nm | ○ | ○ | ○ | ○ | ○ | ○ | ○ | ○ | ○ | ○ |

| ITEM | | | 1 | 2 | 3 | 4 | 5 | 6 | 7 | 8 | 9 | 10 |
|---|---|---|---|---|---|---|---|---|---|---|---|---|
| GATE BREAKDOWN VOLTAGE (V) | NFG (PLATE) | Tox=4nm | -5.0 | -0.7 | -1.7 | -2.7 | -5.0 | -5.0 | -5.0 | -5.0 | -5.0 | -5.0 |
| | | Tox=8nm | -6.5 | -0.8 | -3.8 | -3.3 | -6.5 | -6.5 | -6.5 | -6.5 | -6.5 | -6.5 |
| | PFG (PLATE) | Tox=4nm | 5.0 | 0.5 | 0.5 | 0.5 | 3.8 | 5.0 | 5.0 | 5.0 | 5.0 | 5.0 |
| | | Tox=8nm | 6.5 | 0.5 | 0.5 | 0.7 | 5.7 | 6.5 | 6.5 | 6.5 | 6.5 | 6.5 |
| FG CONTACT RESISTANCE (kΩ) | NFG | 1μm=1μm | 6.14 | 0.96 | 13.3 | 23.5 | 5.6 | 8.44 | 11.8 | 10.5 | 9.37 | 8.79 |
| | PFG | 1μm=1μm | 11.6 | 16.6 | 18.6 | 16.7 | 11.9 | 23.8 | 28.3 | 26.58 | 25.6 | 24.5 |

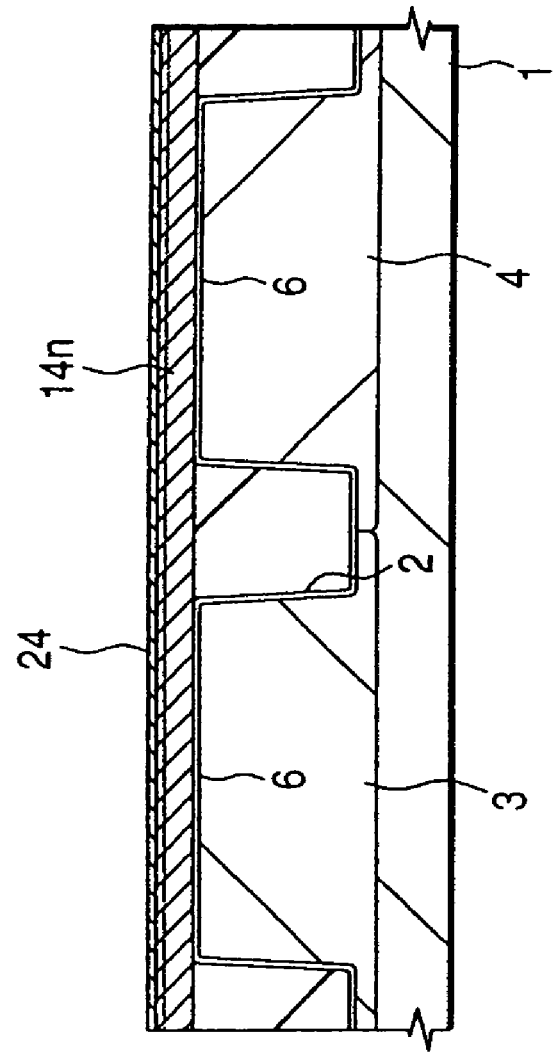
FIG. 54

SEMICONDUCTOR INTEGRATED CIRCUIT DEVICE AND PROCESS FOR MANUFACTURING THE SAME

CROSS-REFERENCE TO RELATED APPLICATION

This application is a division of application Ser. No. 10/468,462 filed Aug. 20, 2003, now U.S. Pat. No. 7,053,459 which is a 371 of PCT/JP01/09548 filed Oct. 31, 2001.

TECHNICAL FIELD

The present invention relates to a semiconductor integrated circuit device and a technique for manufacturing the same, particularly, to a technique effective when applied to the manufacture of a semiconductor integrated circuit device having an MISFET (Metal Insulator Semiconductor Field Effect Transistor) with a polymetal structure in which a gate electrode is formed using a film stack of polycrystalline silicon and a refractory metal.

BACKGROUND ART

Descriptions on general polymetal gates or metal gates can be found, for example, in Japanese Patent Laid-Open No. Sho 60(1985)-89943, Japanese Patent Laid-Open No. Sho 61(1986)-150236, Japanese Patent Laid-Open No. Sho 60(1985)-72229, Japanese Patent Laid-Open No. Sho 59(1984)-10271, Japanese Patent Laid-Open No. Sho 56(1981)-107552, Japanese Patent Laid-Open No. Sho 61(1986)-127123, Japanese Patent Laid-Open No. Sho 61(1986)-127124, Japanese Patent Laid-Open No. Sho 60(1985)-123060, Japanese Patent Laid-Open No. Sho 61(1986)-152076, Japanese Patent Laid-Open No. Sho 61(1986)-267365, Japanese Patent Laid-Open No. Hei 1(1989)-94657, Japanese Patent Laid-Open No. Hei 8(1996)-264531, Japanese Patent Laid-Open No. Hei 3(1991)-119763, Japanese Patent Laid-Open No. Hei 7(1995)-94716, U.S. Patent Official Gazette, that is, U.S. Pat. No. 4,505,028, U.S. Pat. No. 5,719,410, U.S. Pat. No. 5,387,540, *IEEE Transaction Electron devices*, Vol. 43, No. 11, November 1996, Akasaka et al, p. 1864-1869, Elsevier, *Applied Surface Science* 117/118 (1997) 312-316, Nakajima et al, and Nakajima et al, *Advanced metalization conference*, Japan Session, Tokyo Univ. (1995).

With regards to oxynitriding treatment, descriptions can be found in U.S. Pat. No. 4,282,270, while descriptions on hydrogen exhaust gas treatment can be found in U.S. Pat. No. 5,202,096, U.S. Pat. No. 5,088,314, Japanese Patent Laid-Open No. Hei 8(1996)-83772, and Japanese Patent Laid-Open No. Hei 9(1997)-75651.

With regards to the problems of water content and oxidation, there are descriptions, for example, in Japanese Patent Laid-Open No. Hei 7(1995)-321102, Japanese Patent Laid-Open No. Sho 60(1985)-107840 and U.S. Pat. No. 5,693,578.

With regards to synthesis of water using a catalyst, there are descriptions, for example, in Japanese Patent Laid-Open No. Hei 6(1994)-333918, Japanese Patent Laid-Open No. Hei 6(1994)-115903, Japanese Patent Laid-Open No. Hei 5(1993)-152282, Japanese Patent Laid-Open No. Hei 6(1994)-163871, Japanese Patent Laid-Open No. Hei 5(1993)-141871, Japanese Patent Laid-Open No. Hei 5(1993)-144804, Japanese Patent Laid-Open No. Hei 6(1994)-120206, Nakamura et al, *Proceedings of the 45$^{th}$ Symposium on Semiconductors and Integrated circuit Technology*, Tokyo Dec. 1-2, 1993, the Electronic materials committee, p. 128-133.

DISCLOSURE OF THE INVENTION

In CMOS LSI which constitutes its circuits by MOSFETs having a gate length as minute as 0.18 μm or less or DRAM which uses a similar gate layer for gate electrodes and interconnects, a gate forming process using a low resistance conductive material containing a metal layer tends to be employed in order to reduce gate delay or signal delay at interconnects, thereby securing a high-speed operation.

As such a low-resistance gate electrode material, so-called polymetal obtained by stacking a refractory metal film on a polycrystalline silicon film is regarded promising. Since the polymetal has sheet resistance of about 2 $\Omega/\square$, it is usable not only as a gate electrode material but also a wiring material. As the refractory metal, W (tungsten) and Mo (molybdenum) are used, because they favorably exhibit low resistance even in a low temperature process of 800° C. or less, and high electromigration resistance. Direct stacking of such a refractory metal film on a polycrystalline silicon film lowers adhesion therebetween or undesirably forms a high resistance silicide layer on the interface therebetween during a high-temperature heat treatment process, so that an actual polymetal gate has a three-layer structure having a barrier layer made of a metal nitride film such as $WN_X$ (tungsten nitride) interposed between the polycrystalline silicon film and refractory metal film.

As a result of the investigation by the present inventors, however, it has been revealed that when a gate electrode is composed of three layers having, interposed between a polycrystalline silicon film and a refractory metal film, a barrier layer made of a metal nitride film such as $WN_X$ (tungsten nitride), N (nitrogen) is released from the $WN_X$ film during the heat treatment step after formation of the gate electrode and the $WN_X$ film loses its function as a barrier layer, leading to an increase in the contact resistance on the interface between the refractory metal film and the polycrystalline silicon film.

An object of the present invention is to provide, in a gate electrode with a three-layer structure having a barrier layer made of a metal nitride film interposed between a polycrystalline silicon film and a refractory metal film, a technique capable of preventing an increase in contact resistance on the interface between the refractory metal film and polycrystalline silicon film.

The above-described and the other objects and novel features of the present invention will be apparent by the description herein and accompanying drawings.

Of the inventions disclosed in this application, typical ones will next be summarized briefly.

A process for manufacturing a semiconductor integrated circuit device according to the present invention comprises:

(a) forming a gate insulating film over a silicon-base surface region which lies over the first main surface of a wafer and has silicon as one of the principal constituents, (b) forming, over the gate insulating film, a first silicon-base film having silicon as one of the principal constituents, (c) doping an impurity into the first silicon-base film by ion implantation, (d) after the step (c), forming, over the first silicon-base film, a non-doped second silicon-base film having silicon as one of the principal constituents, (e) forming, over the second silicon-base film, a tungsten nitride film, which has a nitrogen content of 7% or greater upon completion of the element, by sputtering, and (f) forming, over the nitride film, a refractory metal film containing tungsten or molybdenum as a principal component.

Another process for manufacturing a semiconductor integrated circuit device of the present invention comprises:

(a) forming a gate insulating film over a silicon-base surface region which lies over the first main surface of a wafer and has silicon as one of the principal constituents, (b) forming, over the gate insulating film, a first silicon base film having an impurity doped therein, (c) forming, over the first silicon-base film, a non-doped second silicon-base film having silicon as one of the principal constituents, (d) forming, over the second silicon-base film, a tungsten nitride film, which has a nitrogen content of 7% or greater upon completion of the element, by sputtering, and (e) forming, over the nitride film, a refractory metal film containing tungsten or molybdenum as a principal component.

BRIEF DESCRIPTION OF THE DRAWINGS

FIG. 20(a) is a schematic view of a single wafer processing oxidation furnace to be used for the manufacture of the semiconductor integrated circuit device according to the one embodiment of the present invention; and 20(b) is a cross-sectional view taken along a line B-B' of (a);

FIGS. 47(a) and 47(b) are graphs of film stresses measured when the $WN_X$ film is heat treated at various temperatures at varied nitrogen gas flow rates while keeping the flow rate of an argon gas constant;

FIG. 54 is a fragmentary cross-sectional view of a semiconductor substrate illustrating the manufacturing process of the semiconductor integrated circuit device according to the still further embodiment of the present invention;

BEST MODE FOR CARRYING OUT THE INVENTION

Figure 1:
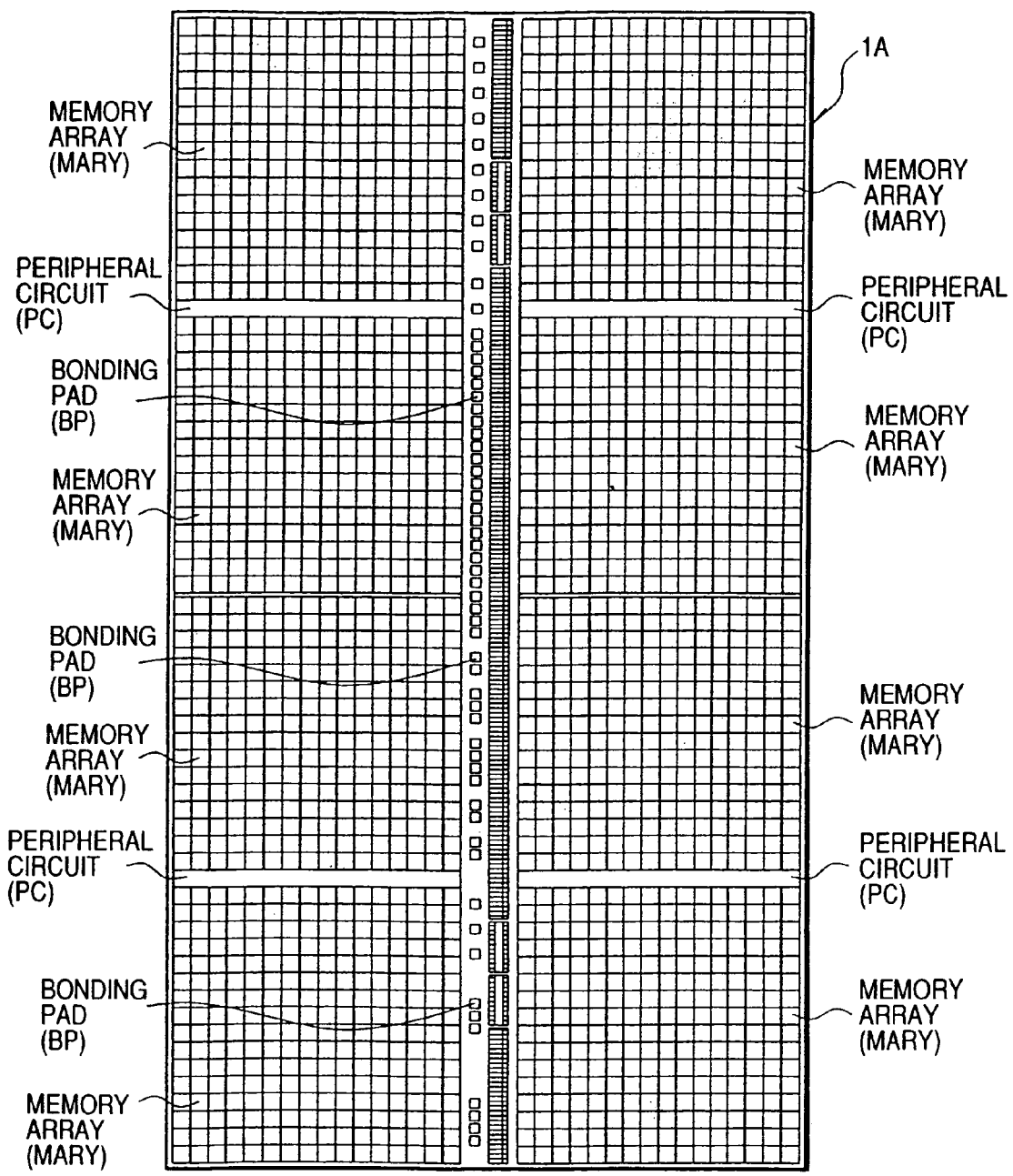
FIG. 1 is an overall plan view of a semiconductor chip having, formed thereon, a semiconductor integrated circuit device according to one embodiment of the present invention.

Embodiments of the present invention will next be described specifically based on accompanying drawings. In all the drawings for describing the below-described embodiments, members having like function will be identified by like reference numerals and overlapping descriptions will be omitted. In the below-described embodiments, descriptions of the same or similar part will not be repeated in principle unless otherwise particularly necessary.

In the below-described embodiments, a description will be made after divided in plural sections or in plural embodiments if necessary for convenience's sake. These plural sections or embodiments are not independent each other, but in a relation such that one is a modification example, details or complementary description of a part or whole of the other one unless otherwise specifically indicated. In the below-described embodiments, when a reference is made to the number of elements (including the number, value, amount and range), the number of elements is not limited to a specific number but can be not greater than or less than the specific number unless otherwise specifically indicated or in the case it is principally apparent that the number is limited to the specific number. Moreover in the below-described embodiments, it is needless to say that the constituting elements (including element steps) are not always essential unless otherwise specifically indicated or in the case where it is principally apparent that they are essential.

Similarly, in the below-described embodiments, when a reference is made to the shape or positional relationship of the constituting elements, that substantially analogous or similar to it is also embraced unless otherwise specifically indicated or in the case where it is utterly different in principle. This also applies to the above-described value and range.

The term "semiconductor integrated circuit wafer" or "semiconductor wafer" means a silicon single crystal substrate (generally, a substantially disk-shape), sapphire substrate, glass substrate, or the other insulating, semi-insulating or semiconductor substrate, as well as a composite substrate thereof used for the manufacture of semiconductor integrated circuits. The term "semiconductor integrated circuit device" (or "electronic device", "electronic circuit device", etc.) means not only that formed over a single crystal silicon substrate but also that formed over the above-described substrate or another substrate such as SOI (Silicon On Insulator) substrate, a substrate for manufacturing TFT (Thin Film Transistor) liquid crystals, or a substrate for manufacturing STN (Super Twisted Nematic) liquid crystals, unless otherwise indicated that the term "semiconductor integrated circuit device" does not mean that formed over such a substrate.

When a reference is made to a material, a gas composition or the like, it includes not only a pure material but also a material containing it as a principal constituent, unless otherwise stated. This means that addition of another constituent is permitted.

With regards to the gas composition, an additive gas, dilution gas, auxiliary gas or the like having a secondary effect can also be added, as well as a main reactive gas or treatment gas.

The term "silicon oxide film" means a silicon oxide film containing various additives or auxiliary components, more specifically, PSG (Phospho Silicate Glass) film, BPSG (Boro-Phospho Silicate Glass) film, TEOS (Tetra-Ethoxy Silane) oxide film and silicon oxynitride film, and in addition, a single film or composite film thereof, unless otherwise stated that the term "silicon oxide film" does not mean such a film.

The term "silicon nitride" as used herein means not only $Si_3N_4$ but also an insulating film made of a nitride of silicon having a similar composition.

The term "gate oxide film" means, in addition to a silicon thermal oxide film and a silicon oxynitride film, the other thermal oxide films, deposited films and coated films. Examples of its material include non-silicon metal oxides other than silicon oxide film, insulating nitrides such as silicon nitride and composite films thereof.

The term "silicon" or "silicon-base" as used herein to refer to a material of a conductive region on a substrate surface or a conductive region of a deposited film includes comparatively pure silicon members, silicon added with an impurity or additive, and conductive members having silicon as a principal constituent (for example, a silicon-base alloy such as SiGe alloy containing at least 50% of Ge is included. A gate polysilicon portion or channel region is, for example, made of SiGe). Unless there exists a technical conflict, these materials are allowed to have high resistance just after formation.

Some of deposited films which are amorphous just after deposition however become polycrystalline by the heat treatment conducted later. Such films are sometimes indicated as the latter form in order to avoid conflict in expression, unless otherwise particularly required. For example, polycrystalline silicon (polysilicon) is in the amorphous form just after deposition, but it becomes polycrystalline silicon by the heat treatment which will be conducted later. It is needless to say that polycrystalline silicon is usable from the beginning. The film in the amorphous form just after deposition has such advantages that channeling in ion implantation can be prevented, difficulty in processing depending on the form of grain mass such as dry etching can be avoided and sheet resistance after heat treatment is low.

The other techniques relating to the enforcement of the present invention are disclosed in detail in the following applications in which the present inventors have participated: Japanese Patent Application 2000-118491, Japanese Patent Laid-Open No. Hei 09(1997)-172011, Japanese Patent Laid-Open No. Hei 10(1998)-335652, Japanese Patent Laid-Open No. Hei 10(1998)-340909, Japanese Patent Laid-Open No. Hei 11(1999)-330468, Japanese Patent Laid-Open No. 10(1998)-349285, U.S. Pat. No. 6,066,508, International Publication WO98/39802 and International Publication WO97/28085.

Embodiment 1

FIG. 1 is an overall plan view of a semiconductor chip 1A having DRAM (Dynamic Random Access Memory) of this Embodiment formed thereon. The rectangular semiconductor chip 1A has, on the main surface thereof, DRAM having a memory capacity of 256 Mbit (megabit). This DRAM has mainly a memory region made of a plurality of memory arrays (MARY) and a peripheral circuit region PC disposed around the memory part. At the center of the semiconductor chip 1A, a plurality of bonding pads BP to which connecting terminals such as a bonding wire are connected are arranged in one row.

Figure 2:
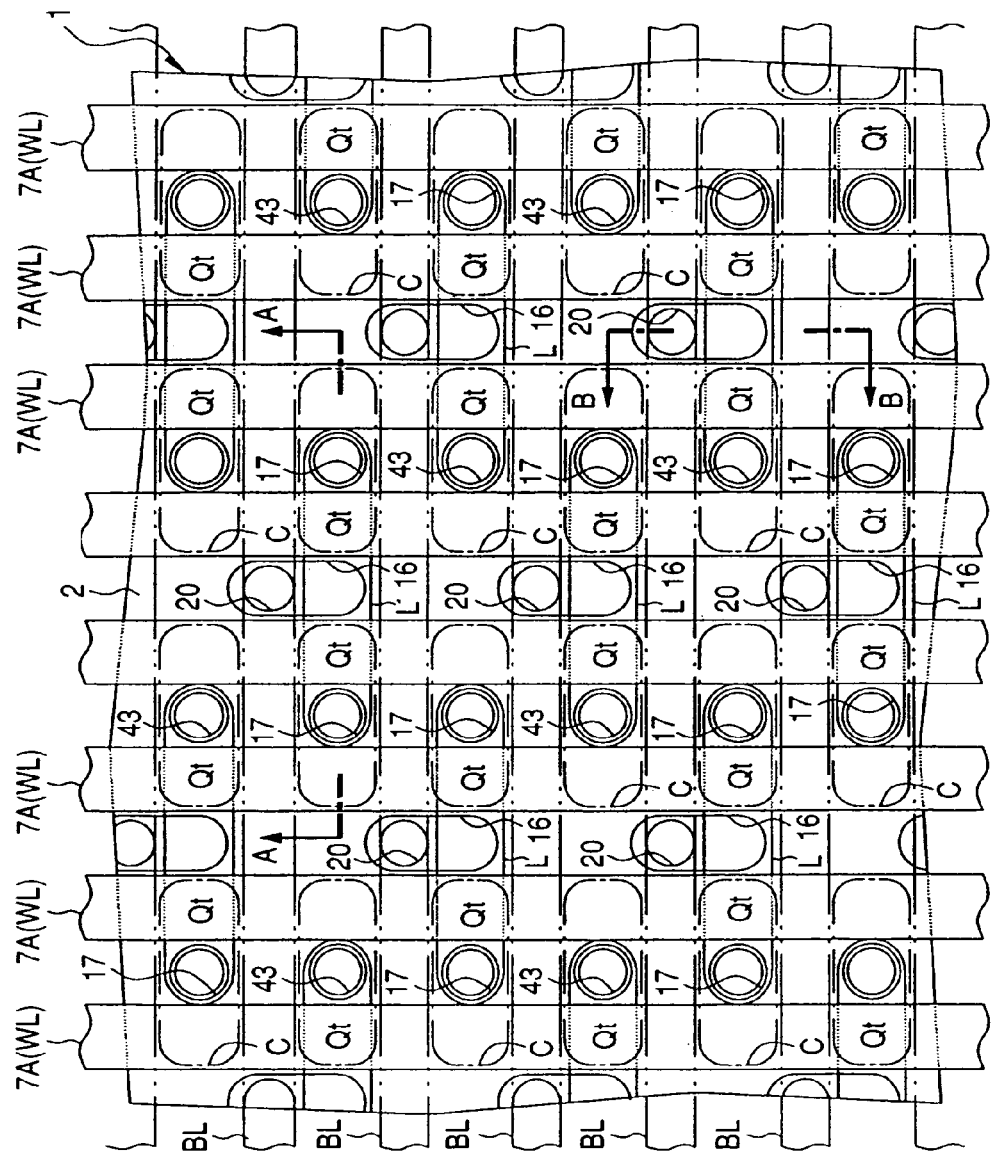
FIG. 2 is a fragmentary plan view of the semiconductor integrated circuit device according to the one embodiment of the present invention.
Figure 3:
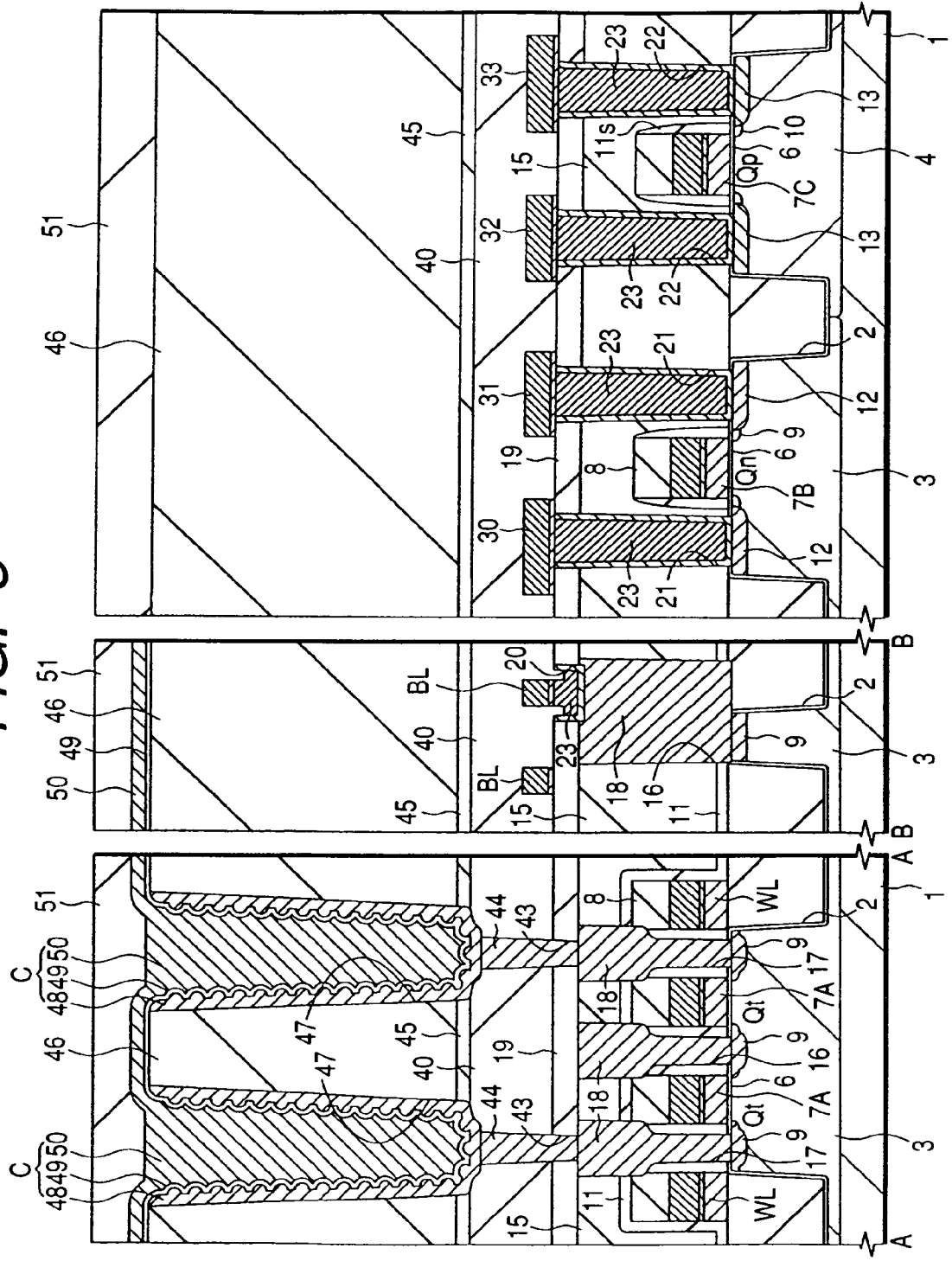
FIG. 3 is a fragmentary cross-sectional view of the semiconductor integrated circuit device according to the one embodiment of the present invention.

FIG. 2 is a plan view of a semiconductor substrate illustrating some of the memory arrays (MARY) of the DRAM, and FIG. 3 is a fragmentary cross-sectional view of a semiconductor substrate illustrating the DRAM. A left-side area of FIG. 3 is a cross-sectional view taken along a line A-A of FIG. 2; a central area is a cross-sectional view taken along a line B-B of FIG. 2; and a right-side area is a cross-sectional view illustrating a part of peripheral circuit region (PC).

Over the main surface of a semiconductor substrate (which will hereinafter be called "substrate" simply, or may be called "semiconductor wafer" or simply "wafer") 1 made of, for example, p-type single crystal silicon, an isolation trench 2, p-type well 3 and n-type well 4 are formed. Over the p-type well of the memory array, a plurality of memory cells each having an n-channel type memory cell selecting MISFET (Metal Insulator Semiconductor Field Effect Transistor) Qt and an information storage capacitor C formed thereover are formed.

The memory cell selecting MISFETQt is composed mainly of a gate insulating film 6, a gate electrode 7A constituting a word line WL in a region other than the active region L, and a pair of n-type semiconductor regions (source, drain) 9,9. The gate electrode 7A (word line WL) is formed of a conductive film of a so-called polymetal structure having an $WN_X$ (tungsten nitride) film and an W film stacked over an n-type polycrystalline silicon film doped, for example, with P (phosphorus).

The peripheral circuit portion PC of the DRAM is formed of a so-called complementary MIS circuit having a plurality of n-channel type MISFETQn and a plurality of p-channel type MISFETQp. The n-channel type MISFETQn is formed over the p-type well 3 and is composed mainly of the gate insulating film 6, gate electrode 7b and a pair of $n^+$type semiconductor regions (source, drain) 12,12. The p-channel type MISFETQp is formed over the p-type well 4 and is composed mainly of the gate insulating film 6, gate electrode 7C and a pair of $P^+$ type semiconductor regions (source, drain) 13,13. The gate electrodes 7B,7C are each made of a conductive film having a similar polymetal structure to that of the gate electrode 7A (word line WL) of the memory cell selecting MISFETQt. Over the sidewalls of each of the gate electrodes 7B,7C, sidewall spacers 11s made of a silicon nitride film are formed.

Over the memory cell selecting MISFETQt, n-channel type MISFETQn and p-channel type MISFETQp, a silicon nitride film 11 and an interlayer insulating film 15 are formed to cover the upper portion and sidewalls of the gate electrode 7A (word line WL). The interlayer insulating film 15 is formed of, for example, an SPG (Spin On Glass) film (a silicon oxide insulating film formed by the coating method) and a double-layer silicon oxide film formed thereover.

Over the pair of the n-type semiconductor regions 9,9 constituting the source and drain of the memory cell selecting MISFETQt, contact holes 16,17 are formed by making a hole in the interlayer insulating film 15 and the silicon nitride film 11 therebelow. These contact holes 16,17 are filled with a plug 18 composed, for example, of an n-type polycrystalline silicon film doped with P (phosphorus).

Over the interlayer insulating film 15, a silicon oxide film 19 is formed. In the silicon oxide film 19 over one of the contact holes 16,17 (contact hole 16), a through-hole 20 is formed. This through-hole 20 is disposed over the isolation trench 2 outskirts of the active region L and a plug 23 formed of a double-layer conductive film obtained by stacking a W film over a TiN (titanium nitride) film one after another is embedded inside of the through-hole. The plug 23 embedded in the through-hole 20 is electrically connected to one (the n-type semiconductor region 9 possessed in common by two memory cell selecting MISFETQt) of the source and drain of the memory cell selecting MISFETQt via the plug 18 buried in the contact hole 16.

In the silicon oxide film 19 and underlying interlayer insulating film 15 of the peripheral circuit portion, contact holes 21 and 22 are formed. The contact hole 21 is formed over the pair of $n^+$ type semiconductor regions (source, drain) 12,12 constituting the source and drain of the n-channel type MISFETQn, while the contact hole 22 is formed over the pair of $p^+$ type semiconductor regions (source, drain) 13,13 constituting the source and drain of the p-channel type MISFETQp. Inside of these contact holes 21,22 is embedded a plug 23 formed of a similar conductive material to that used for the plug 23 embedded in the through-hole 20 of the memory array.

Over the silicon oxide film 19 of the memory array, a plurality of bit lines BL for reading the data of the memory cell are formed. These bit lines BL are disposed above the isolation trench 2 and extend in a direction at right angles to the gate electrode 7A (word line WL) while having the same width and same spacing. The bit lines BL are each electrically connected, via the plug 23 in the through-hole 20 formed in the underlying silicon oxide film 19 and the plug 18 in the contact hole 16, to one of the source and drain (n-type semiconductor region 9) of the memory cell selecting MISFETQt. The bit line BL is formed of, for example, a conductive film having a W film stacked over a $WN_X$ film.

Over the silicon oxide film 19 in the peripheral circuit portion PC, first-level interconnects 30 to 33 are formed. These interconnects 30 to 33 are each made of a similar conductive film to that of the bit lines BL. As described later, these interconnects are formed simultaneously with the bit lines BL. The interconnects 30,31 are electrically connected to the source and drain ($n^+$ type semiconductor regions 12) of the n-channel type MISFETQn via the plug 23 inside of the contact hole 21 formed in the silicon oxide films 19,15, while the interconnects 32,33 are electrically connected to the source and drain ($p^+$ type semiconductor regions 13) of the p-channel type MISFETQp via the plug 23 inside of the contact hole 22 formed in the silicon oxide films 19,15.

Over the bit lines BL and first-level interconnects 30 to 33, an interlayer insulating film 40 is formed. The interlayer insulating film 40 is, as the underlying interlayer insulating film 15, made of a spin-on-glass film and double-layer silicon oxide film formed thereover, and it is planarized so that the film height becomes almost equal over the whole region of the substrate 1.

In the interlayer insulating film 40 and underlying silicon oxide film 19 of the memory array, a through-hole 43 is formed. The through-hole 43 is disposed right above the contact hole 17. Inside of the through-hole 43, a plug 44 made of a P (phosphorus)-doped n-type polycrystalline silicon film is embedded.

Over the interlayer insulating film 40, a silicon nitride film 45 and a thick silicon oxide film 46 are formed. Inside of a deep trench 47 formed in the silicon oxide film 46 of the memory array, an information storage capacitor C composed of a lower electrode 48, a capacitive insulating film 49 and an upper electrode 50 is formed. The lower electrode 48 of the information storage capacitor C is made of, for example, a low-resistance n-type polycrystalline silicon film doped with P (phosphorus) and is electrically connected to the other one of the n-type semiconductor regions (source, drain) 9 of the memory cell selecting MISFETQt via the through-hole 43 and contact hole 17 which lie under the lower electrode. The capacitive insulating film 49 of the information storage capacitor C is made of, for example, a $Ta_2O_5$ (tantalum oxide) film, while the upper electrode 50 is made of, for example, a TiN film.

Over the information storage capacitor C, a silicon oxide film 51 is formed. Two or more layers of an Al interconnect are formed thereover, but they are not illustrated.

In the next place, one example of a manufacturing process of the DRAM according to this Embodiment having a constitution as described above will be described in the order of steps based on FIGS. 4 to 37.

Figure 4:
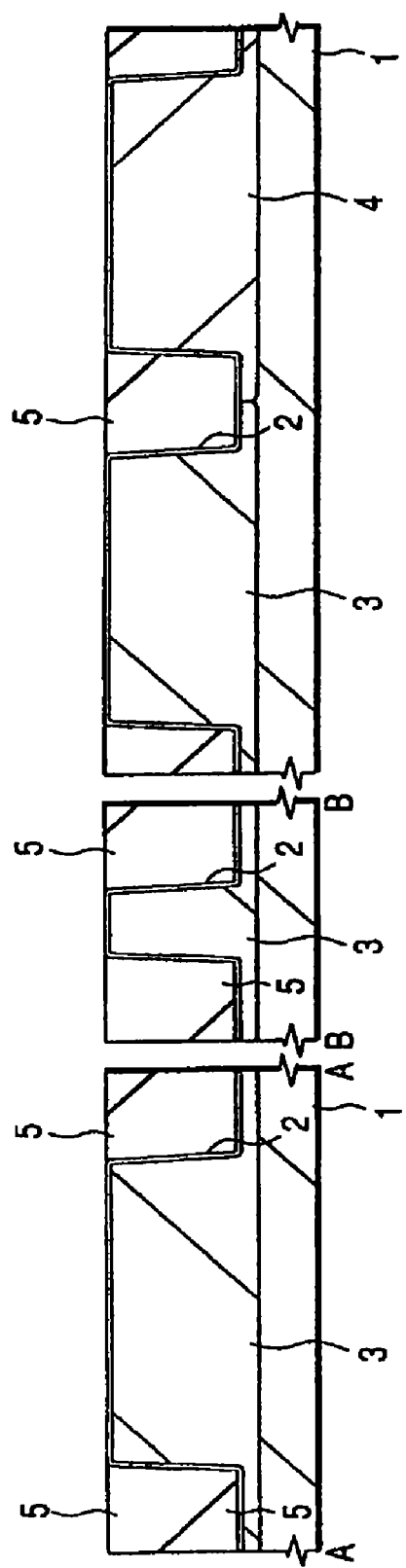
FIG. 4 is a fragmentary cross-sectional view of a semiconductor substrate illustrating a manufacturing process of the semiconductor integrated circuit device according to the one embodiment of the present invention.
Figure 5:
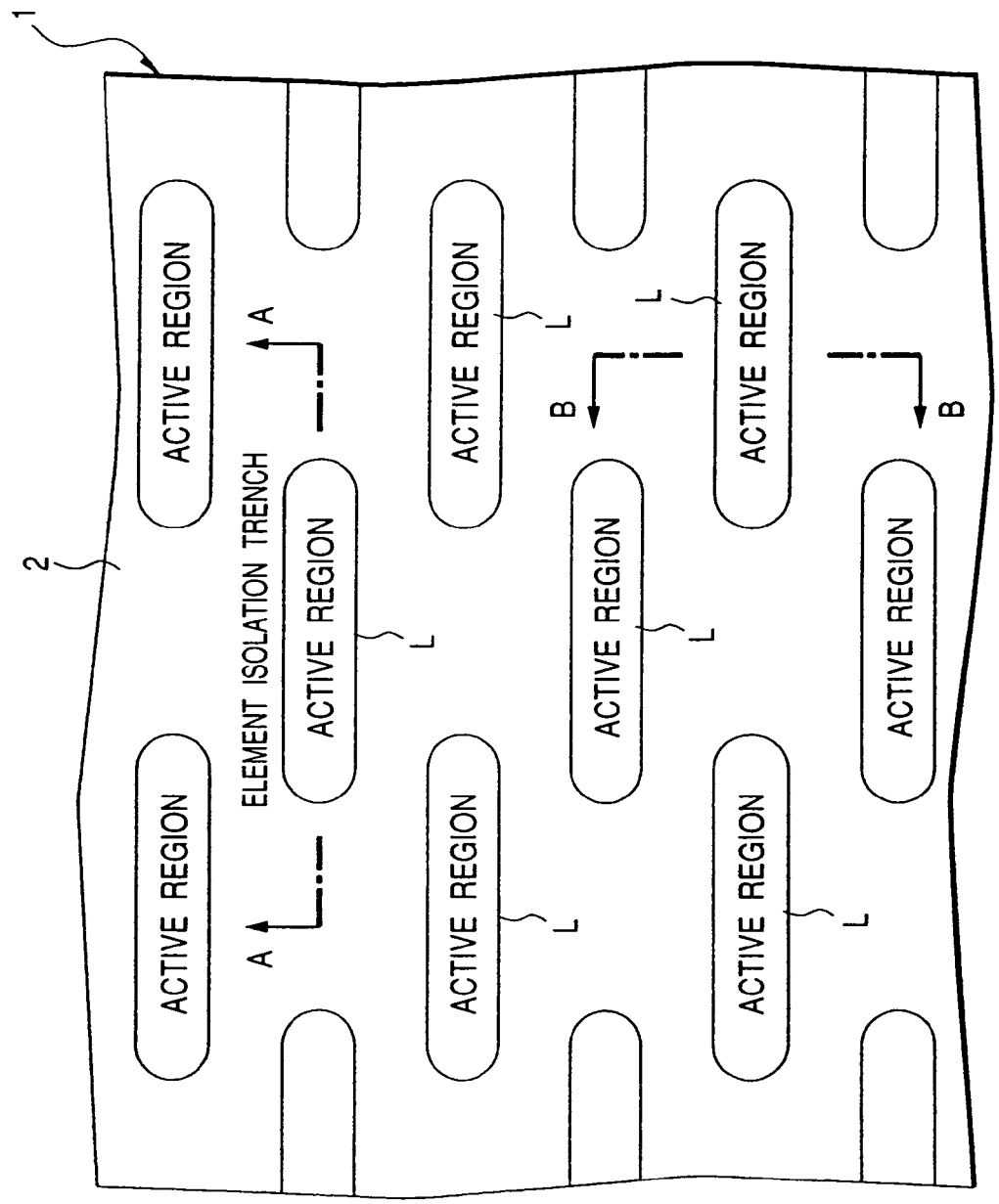
FIG. 5 is a fragmentary plan view of a semiconductor substrate illustrating the manufacturing process of the semiconductor integrated circuit device according to the one embodiment of the present invention.

As illustrated in FIG. 4, a substrate (wafer) 1 made of, for example, p-type single crystal silicon is prepared. After formation of an isolation trench 2 on the main surface of the substrate, B (boron) is ion-implanted into a part of the substrate 1, while P (phosphorus) is ion-implanted into the other part of the substrate. The substrate 1 is heat treated at about 950° C. for 10 minutes or so to diffuse these impurities, whereby a p-type well 3 and an n-type well 4 are formed. The isolation trench 2 is formed, for example, by etching an isolation region of the substrate 1 to form a trench of about 350 nm deep, depositing a silicon oxide film 5 inside of the trench and over the substrate 1 by CVD (Chemical Vapor Deposition), and removing an unnecessary portion of the silicon oxide film 5 outside the trench by chemical mechanical polishing (CMP). As illustrated in FIG. 5, by forming this isolation trench 4, a plurality of active regions L having a slender island-like pattern surrounded by the isolation trench 2 are formed over the substrate 1 of the memory array.

Figure 6:
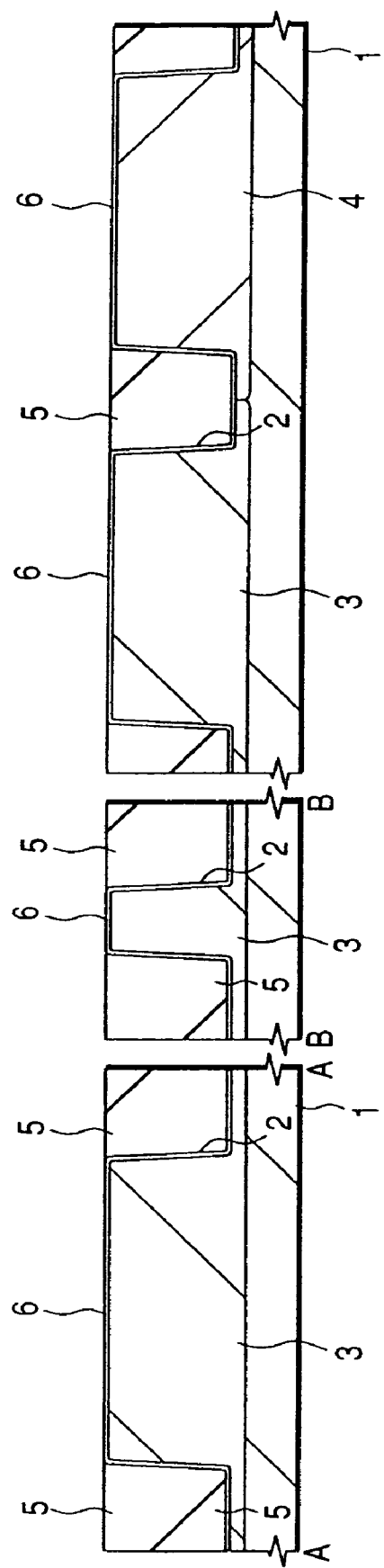
FIG. 6 is a fragmentary cross-sectional view of a semiconductor substrate illustrating the manufacturing process of the semiconductor integrated circuit device according to the one embodiment of the present invention.

After the surface of the substrate 1 is washed with hydrofluoric acid, the substrate 1 is subjected to steam oxidation to form a clean gate insulating film 6 made of a silicon oxide film over the surfaces of the p-type well 3 and n-type well 4, as illustrated in FIG. 6. The gate insulating film 6 has a film thickness of, for example, 6 nm. The gate insulating film 6 may be made of, instead of a silicon oxide film, a silicon oxynitride film, silicon nitride film, or a composite insulating film of a silicon oxide film and a silicon nitride film.

Figure 7:
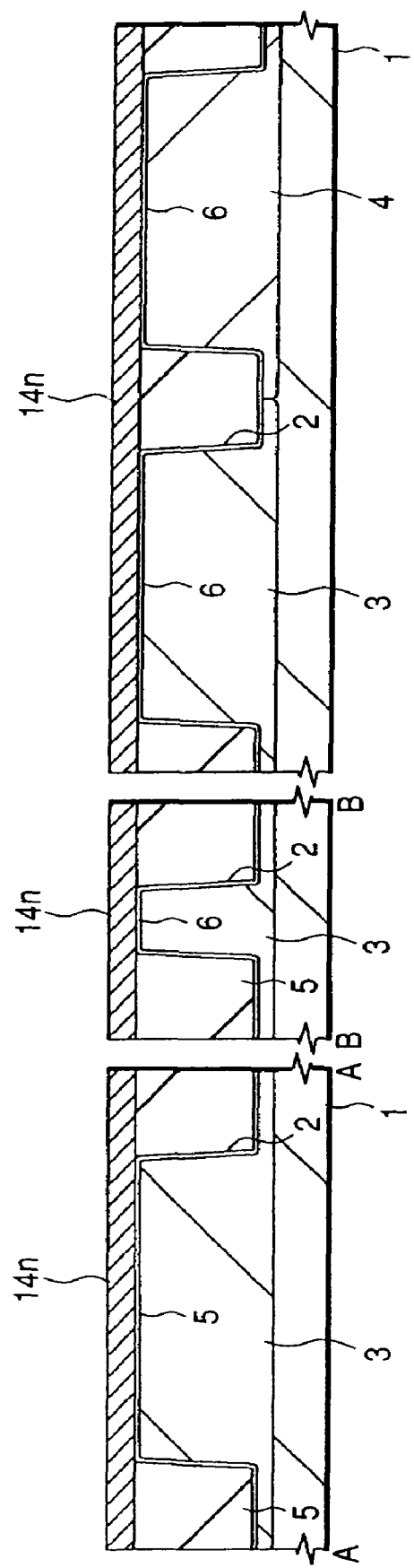
FIG. 7 is a fragmentary cross-sectional view of a semiconductor substrate illustrating the manufacturing process of the semiconductor integrated circuit device according to the one embodiment of the present invention.

As illustrated in FIG. 7, a P (phosphorus)-doped n-type polycrystalline silicon film 14n is deposited over the gate insulating film 6. Deposition of this polycrystalline silicon film 14n is effected (film forming temperature: about 630° C.) by CVD using, for example, monosilane ($SiH_4$) and phosphine ($PH_3$) as a source gas to give a film thickness of about 70 nm. The P concentration of the polycrystalline silicon film 14n is adjusted to $1.0 \times 10^{19}$ $cm^3$ or greater in order to reduce electric resistance.

The polycrystalline silicon film 14n may be replaced with a silicon film containing Ge (germanium) in an amount ranging from 5% to 50% at the maximum. Incorporation of Ge in silicon is advantageous, because it brings about a reduction in contact resistance with the upper $WN_X$ film which owes to narrowing of the band gap in silicon or a rise in solid solubility limit of the impurity. Germanium is incorporated in silicon not only by introducing Ge into a silicon film by ion implantation but also by depositing a Ge-containing silicon film by CVD using monosilane ($SiH_4$) and $GeH_4$.

Figure 8:
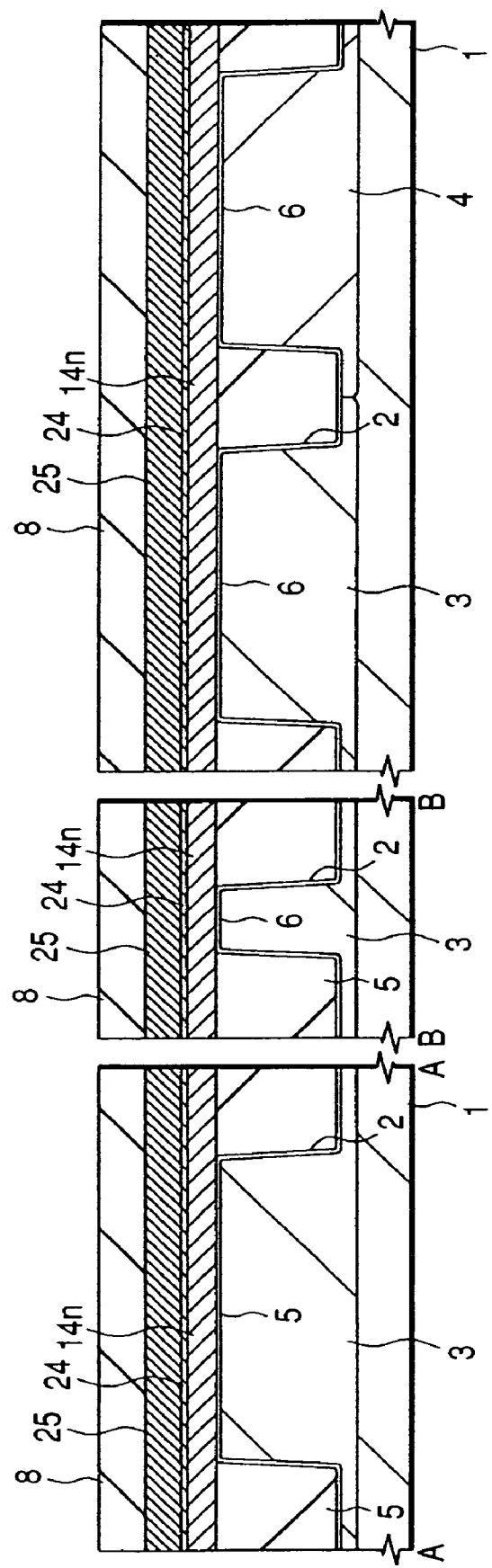
FIG. 8 is a fragmentary cross-sectional view of a semiconductor substrate illustrating the manufacturing process of the semiconductor integrated circuit device according to the one embodiment of the present invention.

After the surface of the polycrystalline silicon film 14n is washed with hydrofluoric acid, a $WN_X$ film 24 of about 7 nm thickness and a W film 25 of about 70 nm thickness were deposited successively over the polycrystalline silicon film 14n as illustrated in FIG. 8 by sputtering, followed by deposition of a silicon nitride film 8 of about 160 nm thickness over the W film 25 by CVD. The $WN_X$ film 24 functions as a barrier layer for preventing the reaction between the polycrystalline silicon film 14n and W film 25. Upon formation of the silicon nitride film 8, it is recommended to deposit a silicon nitride film as thin as about 10 nm over the W film 25 by plasma CVD, which is a method capable of forming a film at a relatively low temperature (around 480° C.), removing a gas component from the silicon nitride film by lamp annealing at about 950° C. for 10 seconds or so and deposit another silicon nitride film of about 150 nm thickness by low-temperature CVD (film forming temperature: around 780° C.) in order to obtain a dense film. Alternatively, after deposition of a silicon oxide film over the W film 25 by plasma CVD, the silicon nitride film 8 may be deposited thereover by low-pressure CVD.

Figure 9:
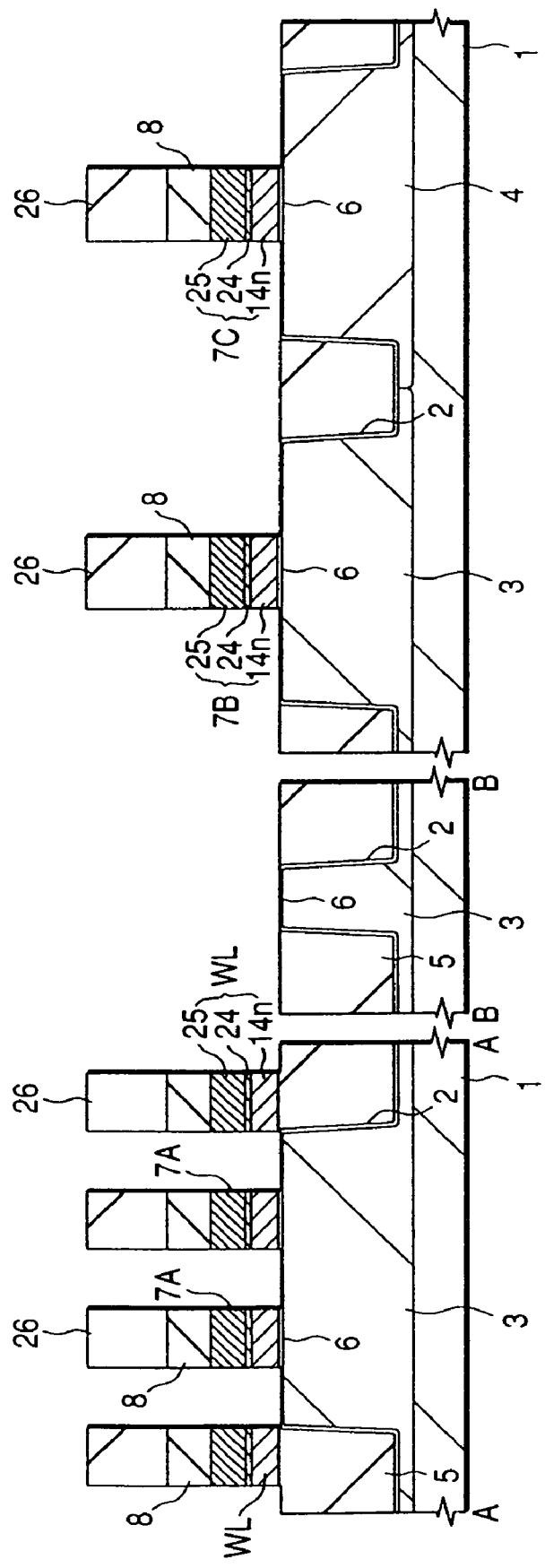
FIG. 9 is a fragmentary cross-sectional view of a semiconductor substrate illustrating the manufacturing process of the semiconductor integrated circuit device according to the one embodiment of the present invention.
Figure 10:
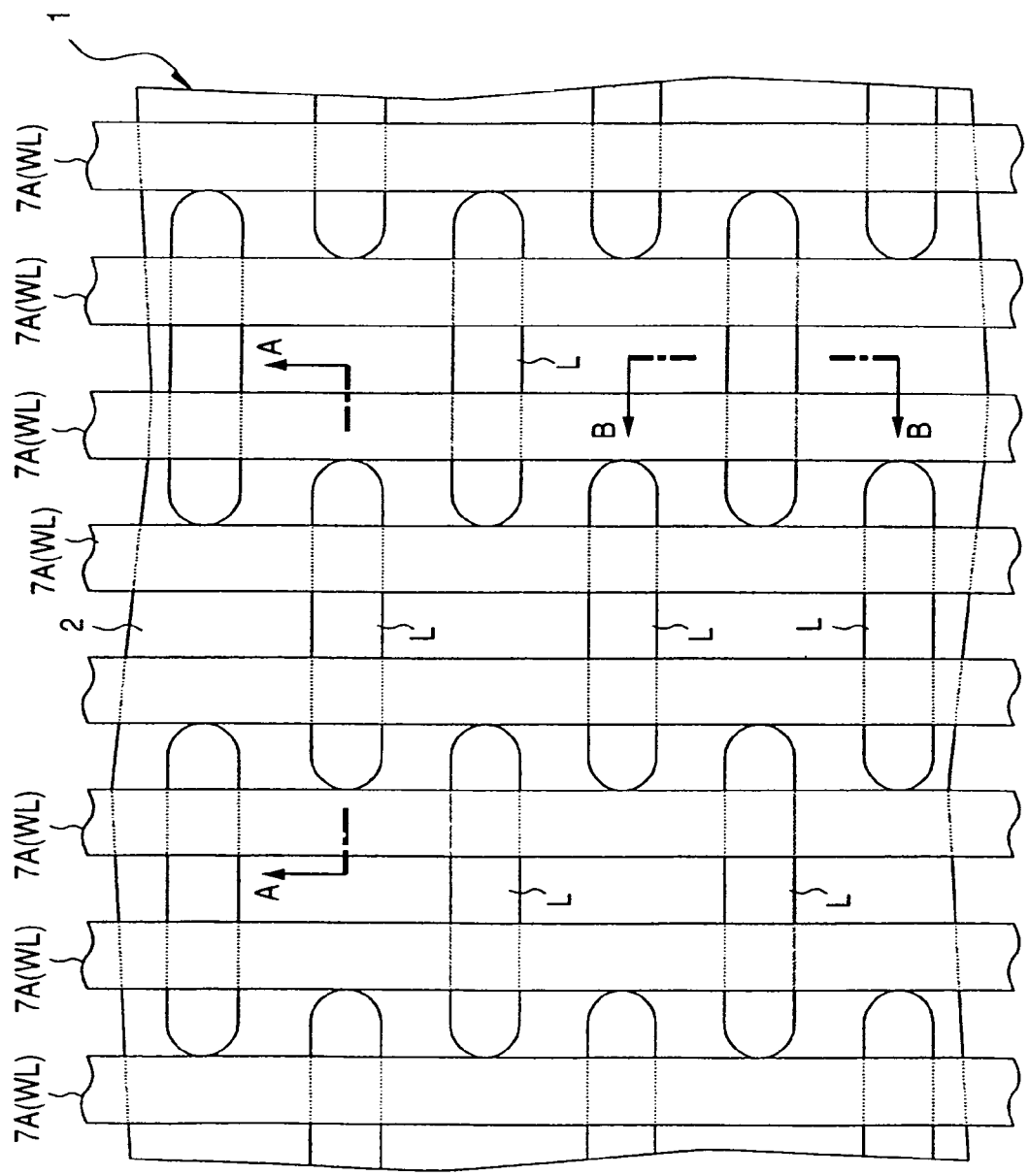
FIG. 10 is a fragmentary plan view of a semiconductor substrate illustrating the manufacturing process of the semiconductor integrated circuit device according to the one embodiment of the present invention.

As illustrated in FIG. 9, with a photoresist film 26 formed over the silicon nitride film 8 as a mask, the silicon nitride film 8, W film 24, $WN_X$ film 25 and polycrystalline silicon film 14n are dry etched successively, whereby a gate electrode 7A (word line WL) is formed over the gate insulating film 6 of the memory array and gate electrodes 7B,7C over the gate insulating film 6 of the peripheral circuit portion. As illustrated in FIG. 10, the gate electrode 7A (word line WL) is formed to extend in a direction at right angles to a long side of the active region L. The line width (gate length) of the gate electrode 7A (word line WL) and the distance between two adjacent gate electrodes 7A (word lines WL) are each, for example, 0.13 to 0.14 μm.

By adopting a polymetal structure wherein the conductive materials constituting each of the gate electrode 7A (word line WL), and gate electrodes 7B,7C are partially made of a low resistance metal (W), a sheet resistance can be reduced to about 2 Ω/□ or less and gate delay can be suppressed, making it possible to actualize a DRAM of high-speed operation.

Figure 11:
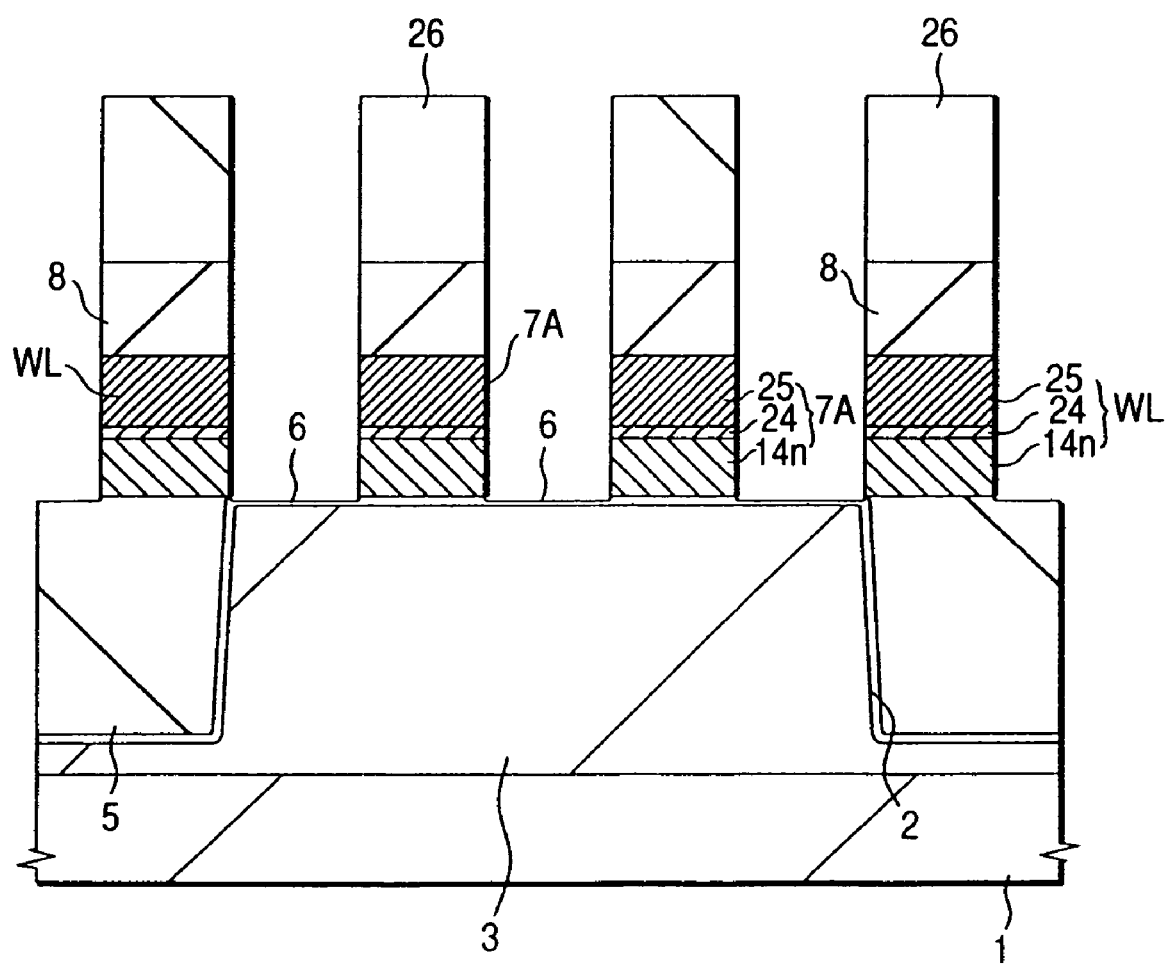
FIG. 11 is a enlarged fragmentary cross-sectional view of a semiconductor substrate illustrating the manufacturing process of the semiconductor integrated circuit device according to the one embodiment of the present invention.

In the above-described dry etching step for the formation of the gate electrodes 7A (word line WL), 7B and 7C, it is desired not to completely remove the gate insulating film 6 and leave it thin (for example, about 3 nm) over the surface of the substrate 1 around the gate electrodes 7A (word line WL), 7B and 7C as illustrated in FIG. 11. If the substrate 1 underlying the gate insulating film 6 is exposed by this dry etching, contamination (pollutant) containing W, which is one of the gate electrode materials, directly adheres to the surface of the substrate 1 in the heat treatment step which will be conducted later, which presumably forms a reaction product such as W silicides unremovable by the ordinary washing treatment.

Figure 12:
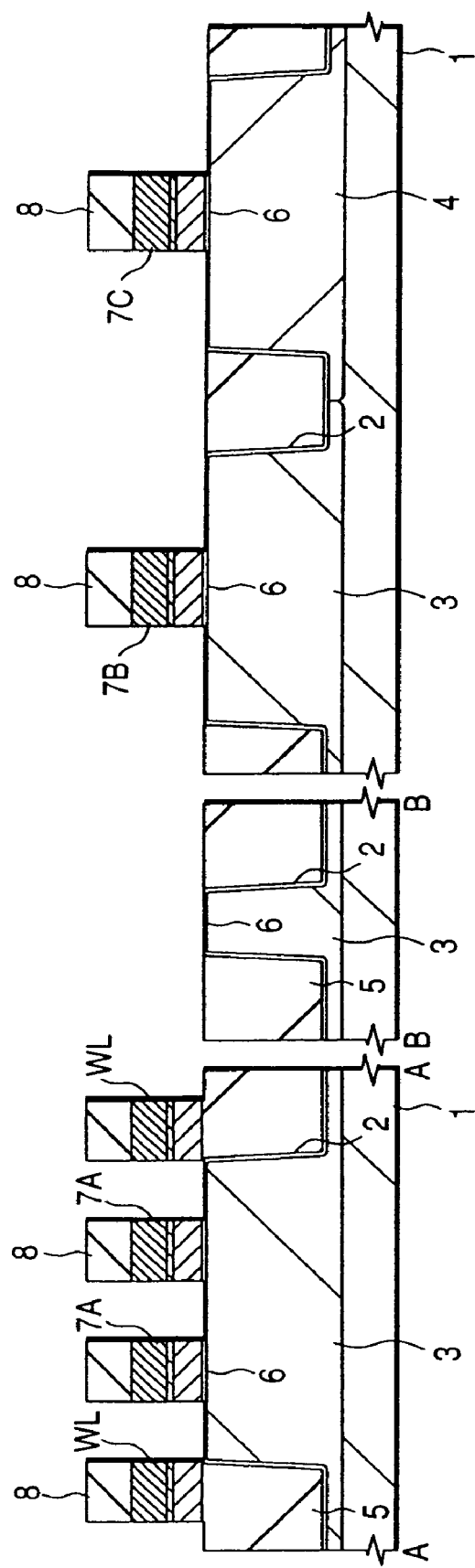
FIG. 12 is a fragmentary cross-sectional view of a semiconductor substrate illustrating the manufacturing process of the semiconductor integrated circuit device according to the one embodiment of the present invention.

The substrate 1 is then transferred from the dry etching apparatus to an ashing apparatus, in which the photoresist film 26 is removed by ashing with $O_2$ plasma as illustrated in FIG. 12.

Figure 13:
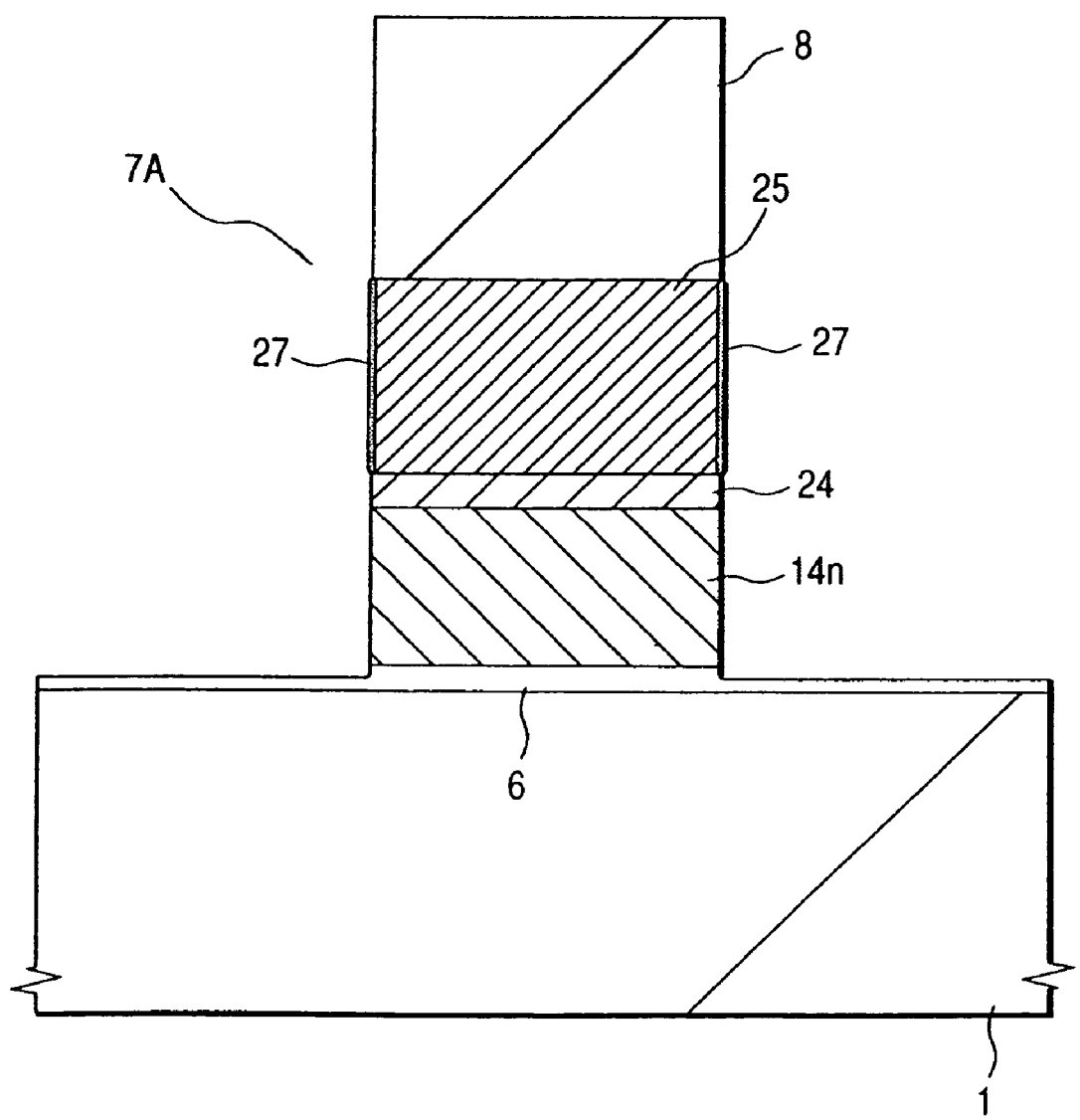
FIG. 13 is an enlarged fragmentary cross-sectional view of a semiconductor substrate illustrating the manufacturing process of the semiconductor integrated circuit device according to the one embodiment of the present invention.

During transfer of the substrate 1 from the dry etching apparatus to the ashing apparatus, the surface of the substrate 1 is exposed to air. In addition, while the photoresist film 26 is removed by ashing with $O_2$ plasma, the surface of the substrate 1 is exposed to an $O_2$ plasma atmosphere. When the ashing is completed, an undesirable oxide ($WO_X$) 27 is formed, as illustrated in FIG. 13, on the surface of the W film 25 exposed from the sidewalls of each of the gate electrodes 7A, 7B and 7C. This oxide 27 sublimes in the subsequent heat treatment step. After adhesion to the inside walls of the heat treatment chamber, it re-deposits on the surface of the substrate 1 and causes, as contamination, a deterioration in properties of the element (refresh failure in the case of DRAM).

As described above, dry etching for the formation of the gate electrodes 7A,7B,7C inevitably removes the gate insulating film 6 below the sidewalls or in the peripheral areas of the gate electrodes 7A,7B,7C to some extent, making the film thinner than that before dry etching (refer to FIG. 13). If the thinned film is left as is, inconveniences such as lowering in gate breakdown voltage occur. In order to regenerate a film to make up for a removed portion of the gate insulating film 6, re-oxidation treatment is conducted in the following manner.

Figure 14:
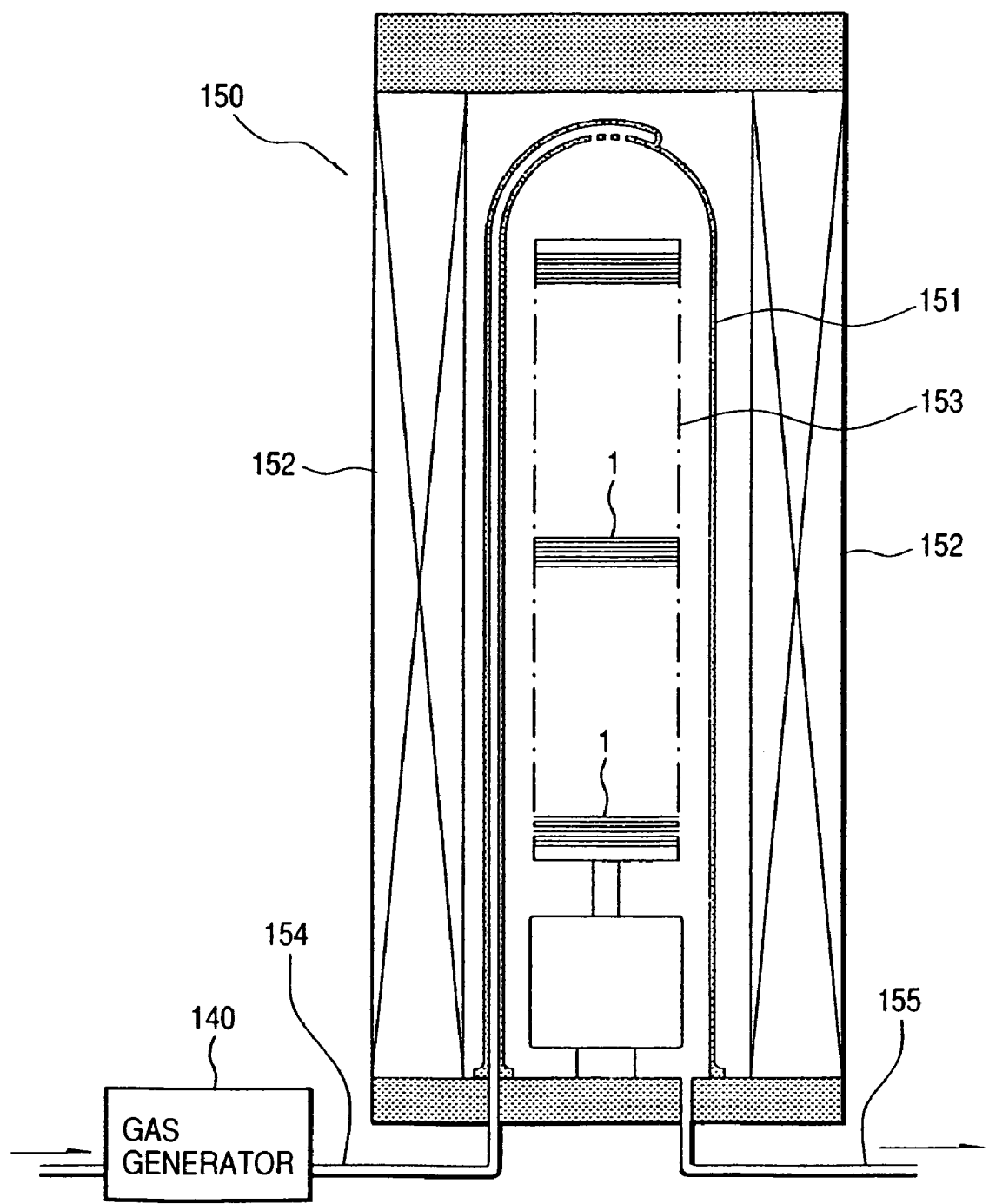
FIG. 14 is a schematic view of a batch-system vertical oxidation furnace to be used for the manufacture of the semiconductor integrated circuit device according to the one embodiment of the present invention.

FIG. 14 is a schematic view illustrating one example of a batch-system vertical oxidation furnace to be used for the re-oxidation treatment of the gate insulating film 6. This vertical oxidation furnace 150 is equipped with a chamber 151 formed of a quartz tube and around the chamber, a heater 152 for heating the wafer (substrate) 1 is disposed. Inside of the chamber 151, a quartz boat 153 for holding a plurality of wafers 1 in parallel each other is installed. To the bottom of the chamber 151, a gas inlet pipe 154 for introducing a steam/hydrogen mixed gas and purge gas and an exhaust pipe 155 for discharging these gases are connected. To the other end of the gas inlet pipe 154, a gas generator 140 as illustrated in FIGS. 15 and 16 is connected.

Figure 15:
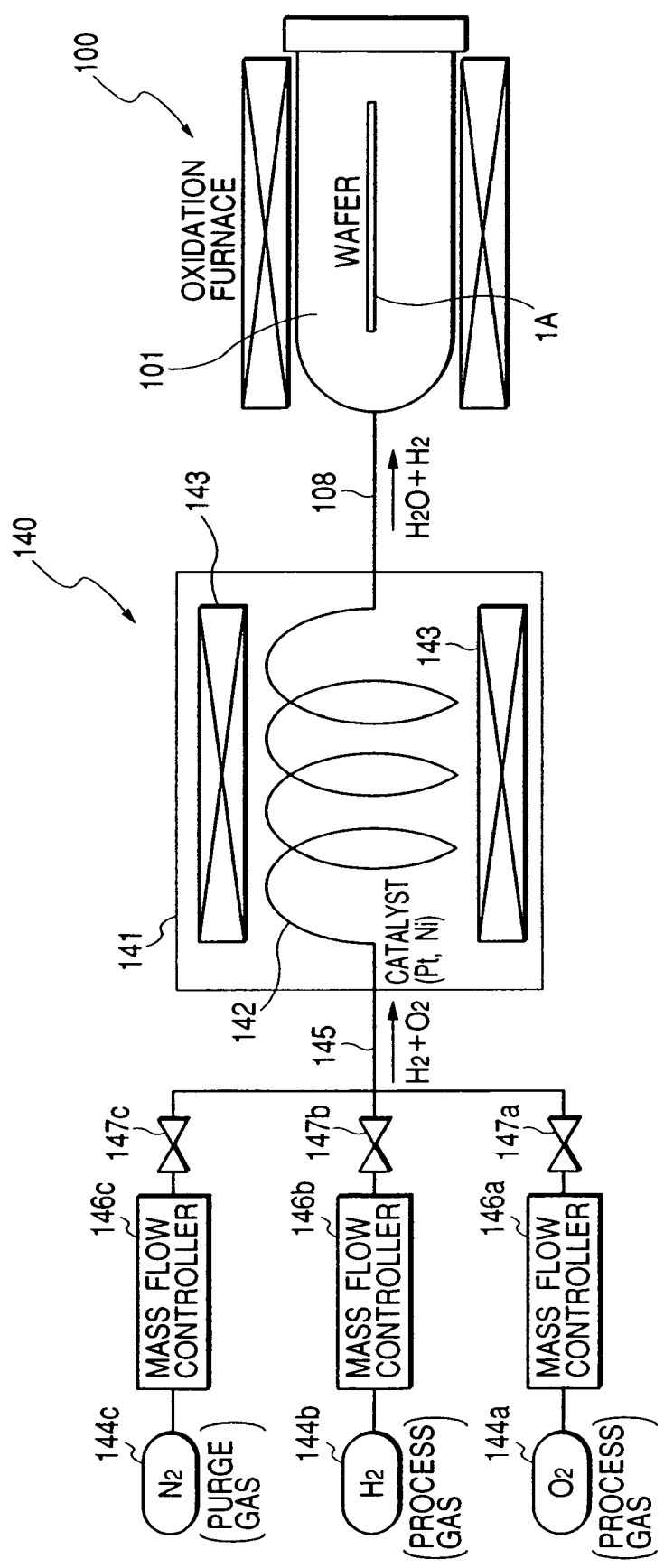
FIG. 15 is a schematic view illustrating a catalyst-system steam/hydrogen mixed gas generator connected to the batch system vertical oxidation furnace as illustrated in FIG. 14.
Figure 16:
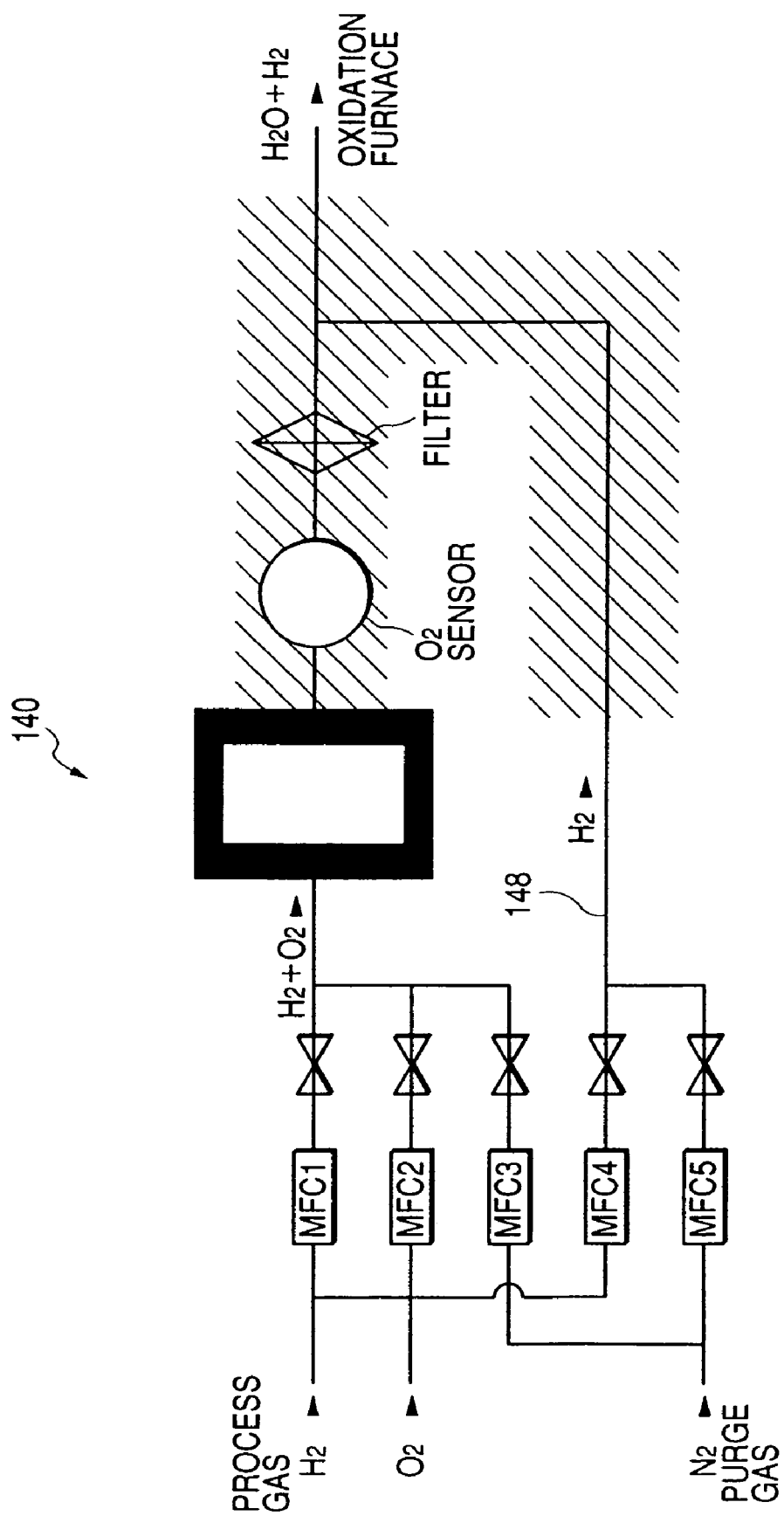
FIG. 16 is a pipe distribution diagram of the steam/hydrogen mixed gas generator as illustrated in FIG. 15.

FIG. 15 is a schematic view illustrating a catalyst-system steam/hydrogen mixed gas generator connected to the batch-system vertical oxidation furnace 150; and FIG. 16 is a pipe distribution diagram of the steam/hydrogen mixed gas generator. The gas generator 140 is equipped with a reactor 141 formed of a heat-resistant anticorrosive alloy and inside of the generator, a coil 142 made of a catalyst metal such as Pt (platinum), Ni (nickel) or Pd (palladium) and a heater 143 for heating the coil 142 are disposed. Into the reactor 141, process gases made of hydrogen and oxygen and a purge gas made of an inert gas such as nitrogen are introduced via a pipe 145 from gas reservoirs 144a, 144b and 144c. Between the gas reservoirs 144a, 144b and 144c and the pipe 145, mass flow controllers 146a, 146b, 146c for controlling a gas flow rate and on-off valves 147a, 147b and 147c for opening or closing a gas flow channel are disposed and by them, the flow rate of the gases to be introduced into the reactor 141 and the component ratio of the gases are controlled accurately.

The process gases (hydrogen and oxygen) introduced into the reactor 141 are brought into contact with the coil 142 heated to about 350 to 450° C. and excited, whereby hydrogen radicals are generated from hydrogen molecules ($H_2 \rightarrow 2H^*$) and oxygen radicals are generated from oxygen molecules ($O_2 \rightarrow 2O^*$). Since these two radicals are extremely chemically active, they react each other rapidly and generate water ($2H^* + O^* \rightarrow H_2O$). By introducing, into the reactor 141, a process gas containing hydrogen in an amount exceeding the molar ratio (hydrogen:oxygen=2:1) at which water is generated, a steam/hydrogen mixed gas is available. After the mixed gas is mixed with hydrogen fed through a dilution line 148 as illustrated in FIG. 16 to prepare a steam/hydrogen mixed gas having a desired water concentration, the resulting gas is introduced into the chamber 151 of the vertical oxidation furnace 150 through the gas inlet tube 154.

Such a catalyst-system gas generator 140 is capable of controlling the amounts of hydrogen and oxygen and their ratio, which take part in the formation of water, with high accuracy, so that the concentration of steam in the steam/hydrogen mixed gas to be introduced into the chamber 151 can be controlled accurately and at the same time, within a wide range of from very low concentration on the order of ppm to a high concentration of about several tens of percents. As soon as the process gas is introduced into the reactor 141, water is generated, so that a steam/hydrogen mixed gas having a desired steam concentration is available in real time. It is also possible to minimize mixing of foreign matters so that a clean steam/hydrogen mixed gas can be introduced into the chamber 151. The catalyst metal in the reactor 141 is not limited to the above-described ones insofar as it is capable of making hydrogen and oxygen into their radicals. The catalyst metal may be used after processing it into a coil; or it may be processed into a hollow tube or fine fibrous filter through which the process gas is caused to pass.

Figure 17:
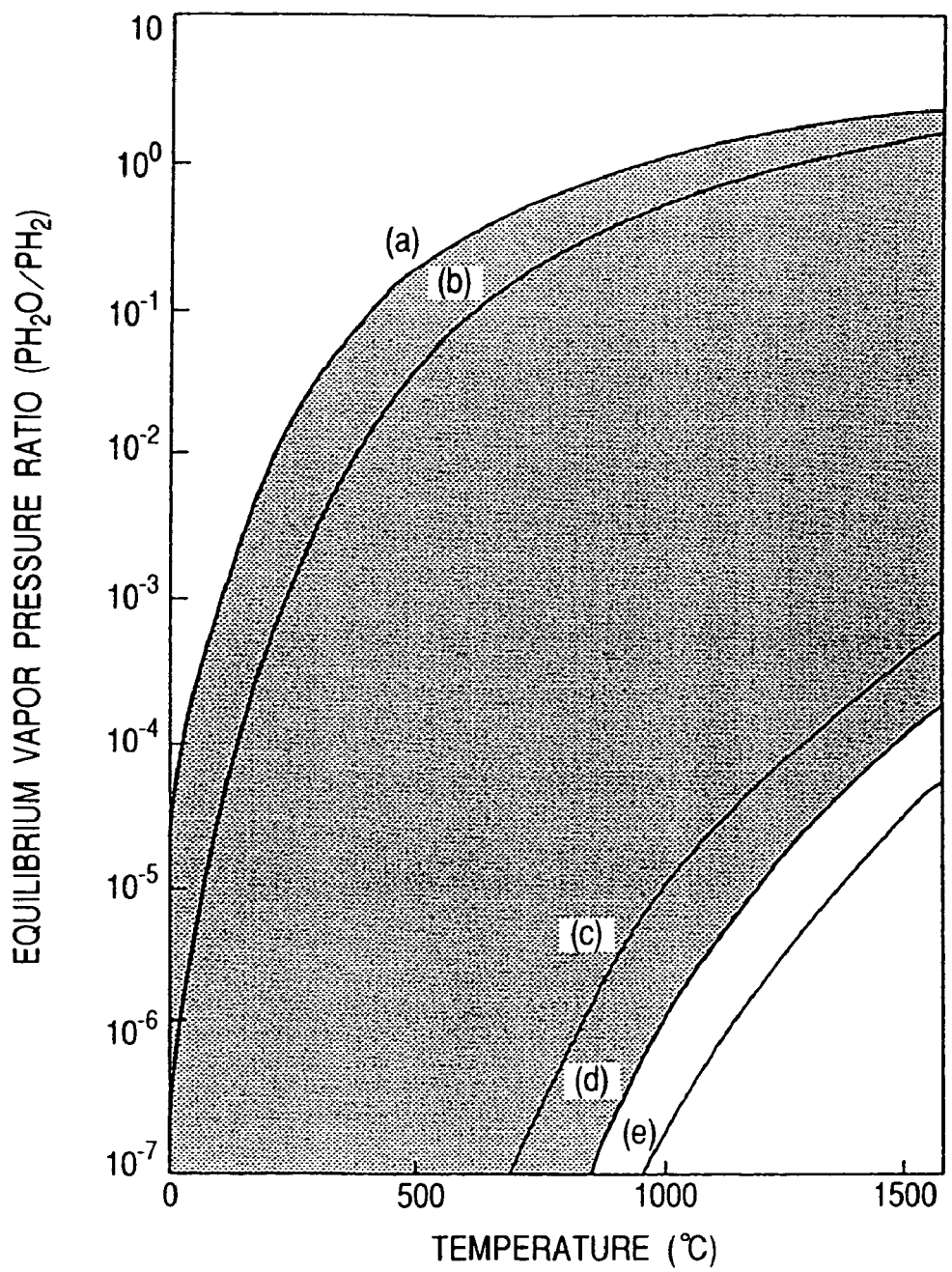
FIG. 17 is a graph showing temperature dependence of an equilibrium steam pressure ratio ($P_{H2O}/P_{H2}$) of redox reaction using a steam/hydrogen mixed gas.

FIG. 17 is a graph showing the dependence, on an equilibrium vapor pressure ratio ($P_{H2O}/P_{H2}$), of redox reaction using a steam/hydrogen mixed gas, in which curves (a) to (e) means equilibrium vapor pressure ratios of W, Mo, Ta (tantalum), Si and Ti (titanium), respectively. As illustrated, the substrate 1 made of silicon can be selectively oxidized without oxidizing the W film 25 and $WN_X$ film 24, which constitute the gate electrodes 7A, 7B and 7C, by setting a steam/hydrogen partial pressure ratio of the steam/hydrogen mixed gas to be introduced into the chamber 151 of the vertical oxidation furnace 150 within a range sandwiched between the curve (a) and curve (d). As illustrated in FIG. 17, oxidation rates of metals (W, Mo, Ta, and Ti) and silicon become greater as the steam concentration in the steam/hydrogen mixed gas increases. Accordingly, heightening of a steam concentration in the steam/hydrogen mixed gas to be introduced into the chamber 151 enables selective oxidation of silicon by heat treatment for a shorter period of time. When the metal portion of each of the gate electrodes 7A, 7B and 7C is made of Mo (molybdenum), adjustment of a steam/hydrogen partial pressure ratio within a range sandwiched between the curve (b) and curve (d) enables selective oxidation of only silicon without oxidizing the Mo film.

Figure 18:
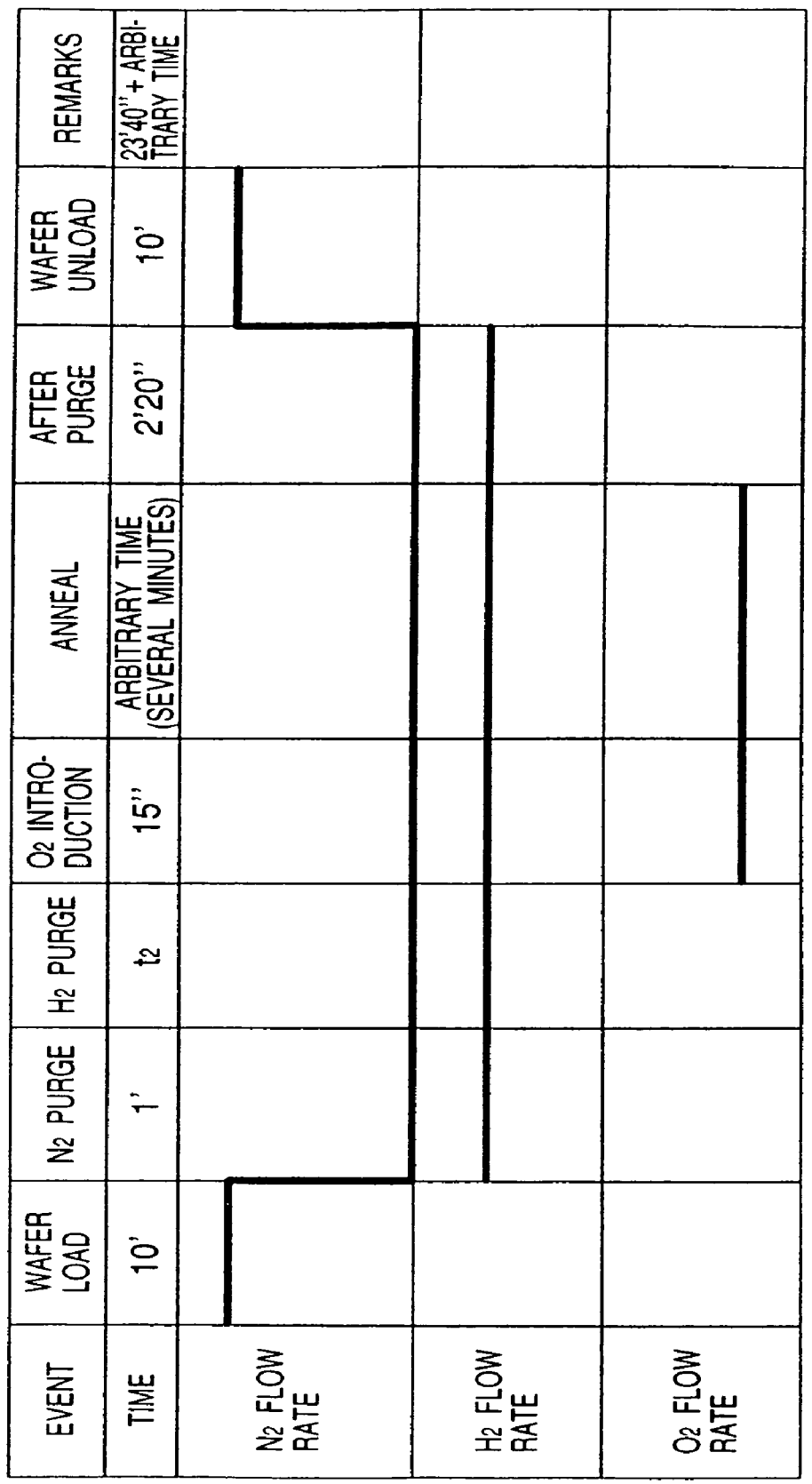
FIG. 18 illustrates a re-oxidation process sequence using the batch system vertical oxidation furnace as illustrated in FIG. 14.

While referring to FIG. 18, a description will next be made of one example of a re-oxidation process sequence using the batch-system vertical oxidation furnace 150.

First, in the chamber 151 filled with a purge gas (nitrogen), the quartz boat 153 having a plurality of wafers 1 supported thereon is loaded. It takes about 10 minutes to complete loading of the quartz boat 153. The purge gas (nitrogen) in the chamber 151 is heated in advance in order to shorten the temperature raising time of the wafer 1. The upper limit of the preheat temperature must however be adjusted to less than 500° C., because the oxide 27 formed over the sidewalls of the gate electrodes 7A, 7B and 7C tend to sublime at high temperatures.

The chamber 151 is then purged with a hydrogen gas introduced via the gas inlet pipe 154 for about 10 minutes, whereby the atmosphere of the chamber is converted into an atmosphere permitting reduction of the W oxide 27. While continuing supply of the hydrogen gas to the chamber 151, the wafer 1 is heated to 600° C. or greater, for example, up to 800° C. over about 30 to 40 minutes. In order to introduce the hydrogen gas alone in the chamber 151, it is only necessary to stop the supply of oxygen at a position just upstream of the reactor 141 and feed only hydrogen.

By heating the wafer 1 under conditions permitting reduction of the oxide 27 on the sidewalls of the gate electrodes 7A, 7B and 7C, most of the oxide 27 is reduced to W, making it possible to keep the sublimation amount of the oxide 27 in the chamber 151 at a markedly low level. This, in turn, leads to an improvement in the reliability and production yield of DRAM, because the substrate 1 during the re-oxidation step of the gate insulating film 6 can be protected greatly from contamination.

Oxygen and excess hydrogen are then introduced to the reactor 141 of the gas generator 140, whereby a steam/hydrogen mixed gas containing about 10%, in partial pressure ratio, of water generated from oxygen and hydrogen by the catalytic reaction is introduced into the chamber 151. While maintaining the temperature of the steam/hydrogen mixed gas in the chamber 151 at 800° C. and the pressure of it to fall within a subatmospheric region which is a region having a pressure of about 10% to 50% of the atmospheric pressure, the surface of the wafer 1 is subjected to oxidation treatment over 25 to 30 minutes. In some oxidation furnaces, oxidation treatment is conducted within a pressure region lower than the subatmospheric region. When the pressure is lower than the above-described region upon oxidation treatment, however, the oxide 27 remaining upon the sidewalls of the gate electrodes 7A, 7B and 7C tend to sublime. The pressure upon oxidation treatment is therefore desirably set about 1300 Pa or greater.

Figure 19:
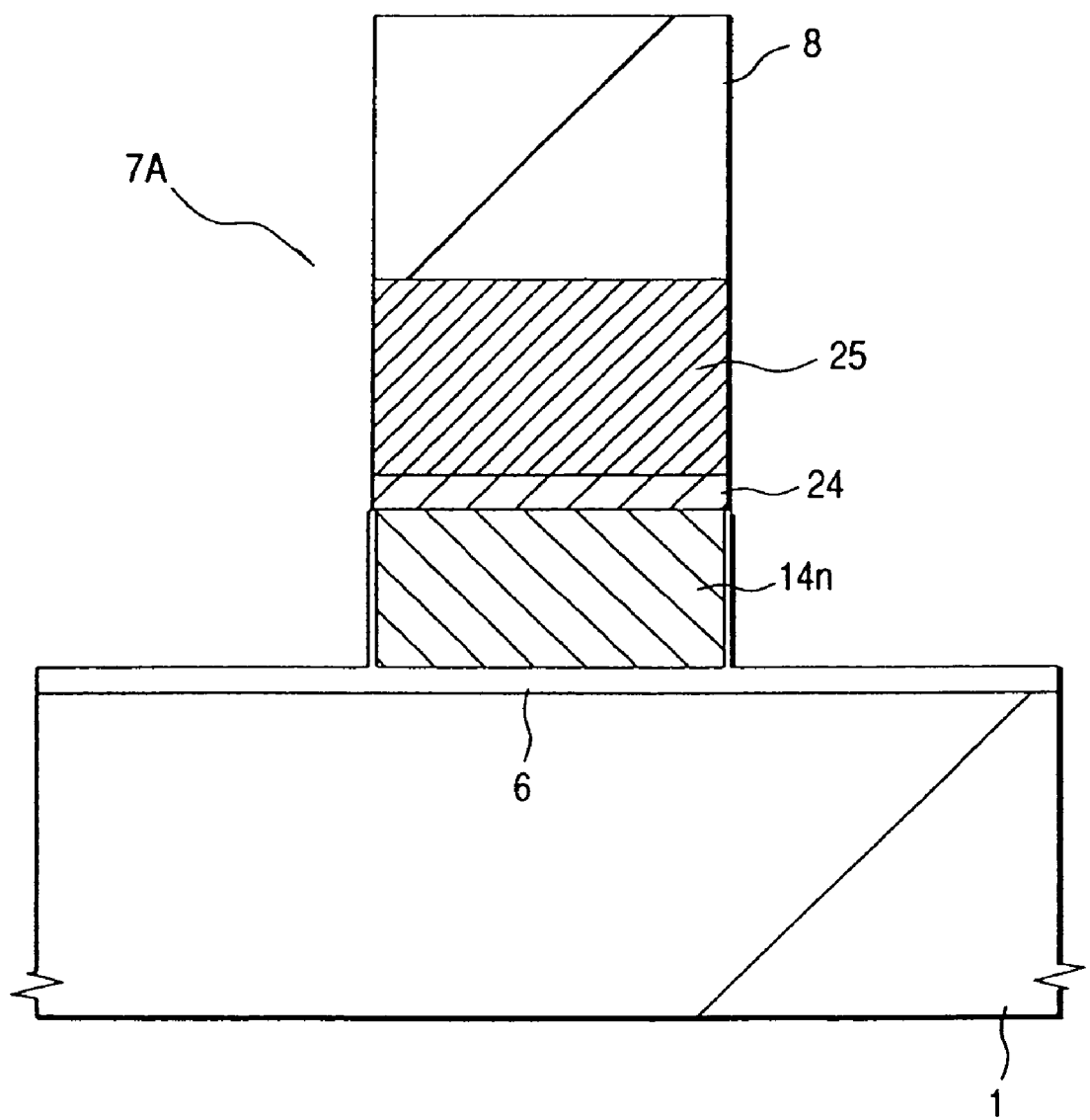
FIG. 19 is an enlarged fragmentary cross-sectional view of a semiconductor substrate illustrating the manufacturing process of the semiconductor integrated circuit device according to the one embodiment of the present invention.
Figure 21:
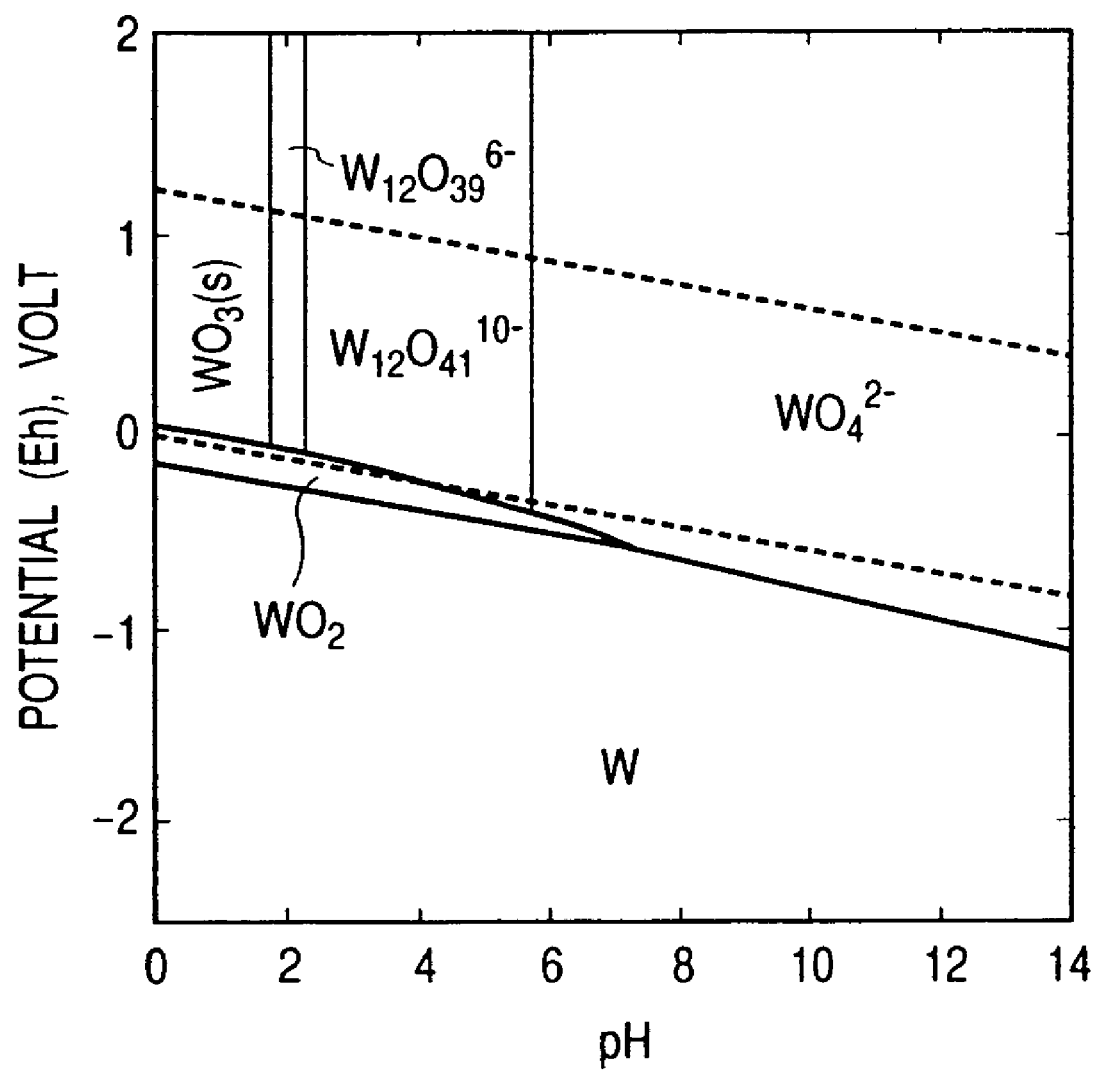
FIG. 21 is a state diagram illustrating the relationship between a redox potential of tungsten-water system and pH.

By the oxidation treatment as described above, the substrate 1 at the periphery of the gate electrodes 7A, 7B and 7C are re-oxidized and the gate insulating film 6, which was once thinned by the above-described etching step, acquires the initial thickness (6 nm) again as illustrated in FIG. 19. The W film 25 and $WN_X$ film 24 constituting the gate electrodes 7A, 7B and 7C are never oxidized by this oxidation treatment, because the steam/hydrogen partial pressure ratio of the steam/hydrogen mixed gas to be introduced in the chamber 151 is set within a range sandwiched between the curve (a) and curve (d).

While feeding the chamber 151 with hydrogen alone by blocking the supply of oxygen just upstream of the reactor 141, the temperature of the wafer 1 is lowered to less than 500° C., for example, down to 400° C. over about 30 to 40 minutes. Then, after supply of the hydrogen gas is stopped and the chamber 151 is purged with a nitrogen gas for about 10 minutes, the quartz boat 153 is unloaded from the chamber 151. If the switchover of the chamber 151 from a hydrogen gas atmosphere to a nitrogen gas atmosphere is performed at high temperatures, there is a potential danger of sublimation of the W film 25 which exists on the sidewalls of the gate electrodes 7A, 7B and 7C, or the oxide 27 which has remained on the sidewalls of the gate electrodes 7A, 7B and 7C without being removed by reduction. It is therefore desired to change the atmosphere from a hydrogen gas to a nitrogen gas after the temperature of the wafer 1 is lowered to about 300 to 200° C. When a request for the oxidation treatment time is not so severe, the oxidation of the W film 25 can, of course, be suppressed more effectively by carrying out the atmospheric switchover to a nitrogen gas after the temperature of the wafer 1 lowers to about 100° C., preferably 70° C. to room temperature.

The re-oxidation treatment of the gate insulating film 6 can also be conducted using a single wafer processing oxidation furnace adopting an RTA (Rapid Thermal Annealing) system. FIG. 20(a) is a schematic view illustrating one example of a single wafer processing oxidation furnace to be used for re-oxidation treatment, and FIG. 20(b) is a cross-sectional view taken along a line B-B' of FIG. 20(a).

This single wafer processing oxidation furnace 100 is equipped with a chamber 101 made of a multiwall quartz tube and the furnace has, at the lower portion thereof, a halogen lamp 107 for heating the wafer 1. Inside of the chamber 101, a disc-shaped linear ring 103 for uniformly dispersing the heat fed from the halogen lamp 107 all over the wafer 1 is accommodated and over the ring, a susceptor 104 for horizontally retaining the wafer 1 is placed. The linear ring 103 is made of a heat resisting material such as quartz or SiC (silicon carbide) and is supported by a supporting arm 105 which extends from the wall surface of the chamber 101. In the vicinity of the linear ring 103, a thermocouple 106 for measuring the temperature of the wafer 1 supported by the susceptor 104 is installed.

One end of a gas inlet tube 108 for introducing a steam/hydrogen mixed gas and a purge gas into the chamber 101 is connected to a part of the wall of the chamber 101. To the other end of the gas inlet tube 108, the catalyst-system gas generator 140 as illustrated in FIGS. 15 and 16 is connected. A partition 110 having numerous through holes 109 is provided in the vicinity of the gas inlet tube 108, and the gas introduced into the chamber 101 passes through these through holes 109 of this partition 110 and is uniformly distributed in the chamber 101. One end of an exhaust pipe 111 for discharging the gas introduced into the chamber 101 is connected to the other part of the wall of the chamber 101.

The re-oxidation process using the single wafer processing oxidation furnace 100 is substantially similar to that using the batch system vertical oxidation furnace 150 except that the wafer 1 is oxidized one by one. Since temperature increase or decrease of the wafer 1 by lamp heating does not take much time (usually, several seconds or so), the loading/unloading of the wafer 1 is conducted at room temperature.

One example of the re-oxidation process using the single wafer processing oxidation furnace 100 will next be described. The chamber 101 filled in advance with the purge gas (nitrogen) of room temperature is opened and the wafer 1 having gate electrodes 7A, 7B and 7C which have finished their formation step is loaded on the susceptor 104. The chamber 101 is then closed, followed by the introduction of a hydrogen gas thereinto, whereby the chamber 101 has a hydrogen gas atmosphere. While keeping this atmosphere, the wafer 1 is heated to 600° C. or greater, for example, up to 950° C. over about 5 seconds.

Then, oxygen and excess hydrogen are introduced into the reactor 141 of the gas generator 140 and a steam/hydrogen mixed gas containing about 10%, as a partial pressure ratio, of water generated by the catalytic action is introduced into the chamber 101. The halogen lamp 107 is turned on. While keeping the temperature of the steam/hydrogen mixed gas in the chamber 101 at 950° C., the surface of the wafer 101 is subjected to oxidation treatment over about 3 minutes.

After the halogen lamp 107 is turned off, the supply of the steam/hydrogen mixed gas is stopped and the chamber 101 is restored to a hydrogen atmosphere, the temperature of the wafer 1 is lowered to less than 500° C., for example, down to 400° C. over about 10 seconds, while keeping the hydrogen atmosphere. The supply of a hydrogen gas is then stopped and the chamber 101 is purged with a nitrogen gas. After the temperature in the chamber 101 is lowered to about room temperature, the wafer 1 is unloaded. Also in this case, the switchover from the hydrogen gas to the nitrogen gas is preferably conducted after the temperature of the wafer 1 is lowered to about 300 to 200° C. When a request for the oxidation treatment time is not so severe, the oxidation of the W film 25 can, of course, be suppressed more effectively by carrying out the atmospheric switchover to a nitrogen gas after the temperature of the wafer 1 lowers to about 100° C., more preferably to 70° C. to room temperature.

Similar to the re-oxidation treatment using the batch-system vertical oxidation furnace 150, such a re-oxidation treatment is capable of thickening the gate insulating film 6 without oxidizing the W film 25 and $WN_X$ film 24 constituting the gate electrodes 7A, 7B and 7C. In addition, by increasing or decreasing the temperature of the wafer 1 under conditions permitting reduction of the oxide 27 existing on the sidewalls of the gate electrodes 7A, 7B and 7C, the sublimation amount of the oxide 27 in the chamber 151 can be kept at a markedly low level, making it possible to keep the contamination of the substrate 1 during the re-oxidation treatment step of the gate insulating film 6 at a remarkably low level. It has been confirmed by the test made by the present inventors that irrespective of which of the batch-system vertical oxidation furnace 150 and the single wafer processing oxidation furnace 100 is employed, the amount of the oxide 27 deposited on the surface of the substrate 1 can be reduced by about two or three orders of magnitude, compared with a temperature increase or decrease in a nitrogen gas atmosphere, by a temperature increase up to a desired temperature and subsequent temperature decrease both in a reductive atmosphere with hydrogen.

In the above-described re-oxidation process, the temperature of the wafer 1 is increased or decreased in a hydrogen atmosphere, but atmosphere of another gas capable of reducing the W oxide, for example, ammonia ($NH_3$), Co or $N_2O$ is also usable. When such a gas is used, however, a pipe and the like of an oxidation furnace must be installed more. As the purge gas, a noble gas such as argon (Ar), helium (He) or xenon (Xe) is usable instead of nitrogen.

In the above-described re-oxidation process, the wafer 1 is oxidized using a steam/hydrogen mixed gas. Another gas capable of oxidizing silicon without oxidizing the W film or Mo film, for example, an oxidizing gas such as oxygen ($O_2$), NO, CO or $CO_2$, or a mixture thereof with a steam/hydrogen mixed gas is alternatively usable. Attention must however be paid upon use of Co or $CO_2$, because it may react with W or Mo during heat treatment and produce a foreign matter such as carbide.

When the above-described re-oxidation process is adopted, the contamination of the surface of the substrate 1 with the oxide can be suppressed to a very low level, which makes it possible to reduce the deposition amount of the oxide 27 on the surface of the substrate 1 by about two or three orders of magnitude, compared with the case where a temperature increase up to a desired temperature or the subsequent temperature decrease is conducted in a nitrogen gas atmosphere.

Even if the temperature increase or decrease of the wafer 1 is conducted in a reductive atmosphere in the above-described re-oxidation process, deposition of a trace amount of the oxide as a contaminant happens to occur during the re-oxidation process. In this case, the oxide as a contaminant is knocked on into the gate insulating film 6 upon the subsequent step of impurity ion implantation, presumably deteriorating the electrical properties of the resulting element.

It is therefore effective to wet wash the surface of the substrate (wafer) 1, prior to the subsequent ion implantation step, thereby reducing the contamination level with the oxide. This washing should however be conducted under the conditions not causing oxidation of the W film 25 exposed from the sidewalls of the gate electrodes 7A, 7B and 7C. In particular, the W film 25 exposed to the reductive atmosphere in the re-oxidation process has become more active, on its surface, than the W film without such a treatment and it has an enlarged surface area by the reduction of the oxide 27, so that the W film 25 tends to be oxidized easier than that before the re-oxidation process.

Accordingly, use of an oxidative solution must be avoided also in this washing step. In other words, it is desired to use a reductive solution for washing so as to prevent oxidation of the W film 25 and at the same time to remove the W oxide existing on the surface of the W film 25 exposed from the sidewalls of the gate electrodes 7A, 7B and 7C. The present inventors have found that in order to realize such conditions, it is desired to use water having properties near the boundary between a W existing region and a negative ion existing region of $WO_4$ in a tungsten-water redox potential/pH equilibrium diagram (this equilibrium diagram is described in Emil A. Knee, Chilkunda Raghunath, Srini Raghavan and Joong S. Jeon: Electrochemistry of Chemical Vapor Deposited Tungsten Films with Relevance to Chemical Mechanical Polishing, *J. Electrochem. Soc.*, Vo. 143, No. 12, pp. 4095-4100, December, 1966).

As a result of the test, when such water was used, elution of the W oxide ($WO_X$) existing on the surface of the W film in water as a negative ion of $WO_4$ occurred first, but thereafter, the surface of the W film was hardly oxidized.

Such a desirable effect was available when neutral or weakly-alkaline pure water or chemical solution having a pH falling within a range of from 6.5 or greater but less than 12, more preferably from 7 or greater but less than 10.5 was used. The contamination with oxide was removed by about three orders of magnitude only by washing with ultrapure water. When hydrogen-containing water obtained by adding about 0.2 mg/l to about 2 mg/l of a hydrogen gas to ultrapure water is used for washing, a removal ratio of the oxide contamination can be heightened by about 1.5 times compared with the use of pure water.

An aqueous solution made weakly alkaline by adding ammonia to the above-described ultrapure water or hydrogen-containing water may be used for heightening the elution efficiency of the oxide contamination. As a result of the test, addition of from 0.2 mmol to 120 mmol of ammonia to water made the pH 11.5 and changed a redox potential at 580 mV to a reduction potential of 870 mV, making it possible to elute the W oxide formed on the surface in water, thereby removing it without oxidizing the W film. This results suggest that the $WO_X$ deposited on the silicon oxide film around the gate electrodes can be removed by elution. This enables a reduction in the sublimation amount of the W oxide in the subsequent heat treatment step, thereby inhibiting contamination of LSI.

It is preferred that the above-described water or chemical solution is substantially free of hydrogen peroxide which easily oxidizes the W film. Even if it contains a trace amount of hydrogen peroxide, a volumetric ratio of hydrogen peroxide must be less than 0.3% supposing that hydrogen peroxide having a concentration of 30 wt. % is 100%.

When the wafer 1 is washed with the above-described water or chemical solution, a removal efficiency of the contaminant can be heightened further by applying mechanical vibration such as ultrasonic one to the wafer. In order to prevent re-deposition of the contaminant once removed, washing is preferably conducted using running water rather than static water. When washing is conducted using running water, an electric double layer formed on a water-$SiO_2$ interface and electrokinetic potential (zeta $\zeta$ potential) of running water bring about a deposited $WO_X$ removing effect, leading to heightening of a contamination reducing effect.

The W film exposed to reductive atmosphere in the re-oxidation process is oxidized easier than the W film without such a treatment so that the above-described washing must be conducted as soon as possible after the re-oxidation treatment. In this case, it is also effective to connect the oxidation furnace directly with a washing apparatus to prevent oxidation caused by contact with air during transfer.

Figure 22:
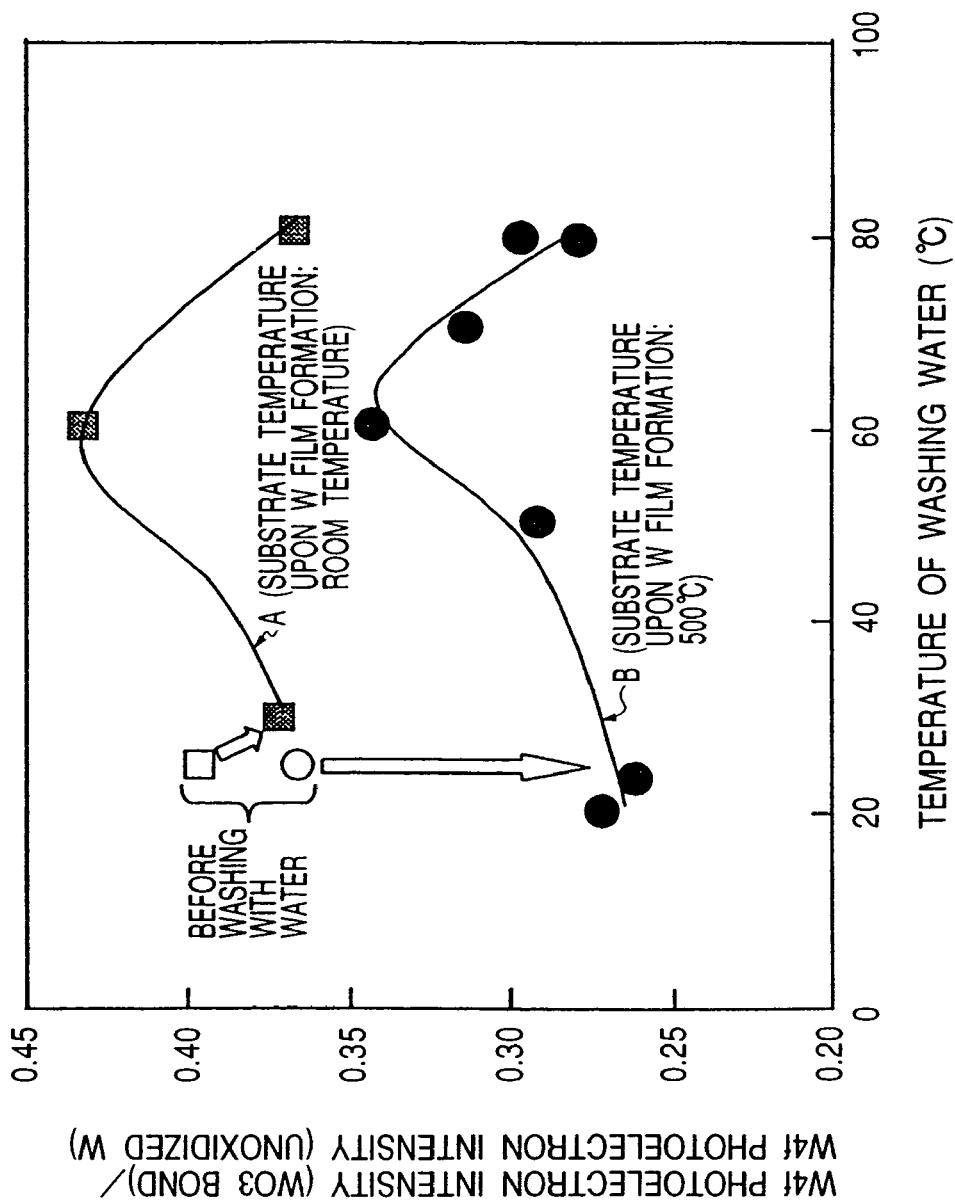
FIG. 22 is a graph illustrating the results of measuring, by total reflection X-ray fluorescence, an effect of water washing for the removal of a natural oxide film from the surface of a W film.

FIG. 22 is a graph illustrating the measurement results, by total reflection X-ray fluorescence, of water washing effect for removal of a natural oxide film formed on the surface of the W film. As the W film, respective films formed at room temperature and at 500° C. were used. Since the W film formed at 500° C. had higher crystallinity than the W film formed at room temperature, a natural oxide film was hardly be produced on the former film. In either film, a rise in water temperature from room temperature increased the production amount of the natural oxide film, but when the water temperature exceeded about 60° C., washing effect exceeded an increase in the production amount of the natural oxide film, resulting in a high removal effect. Based on the above-described finding, a natural oxide film can be removed efficiently by setting the temperature of water or chemical solution upon washing at room temperature to less than 50° C., or 70° C. or greater, more preferably at room temperature to less than 45° C., or 75° C. or greater.

Figure 23:
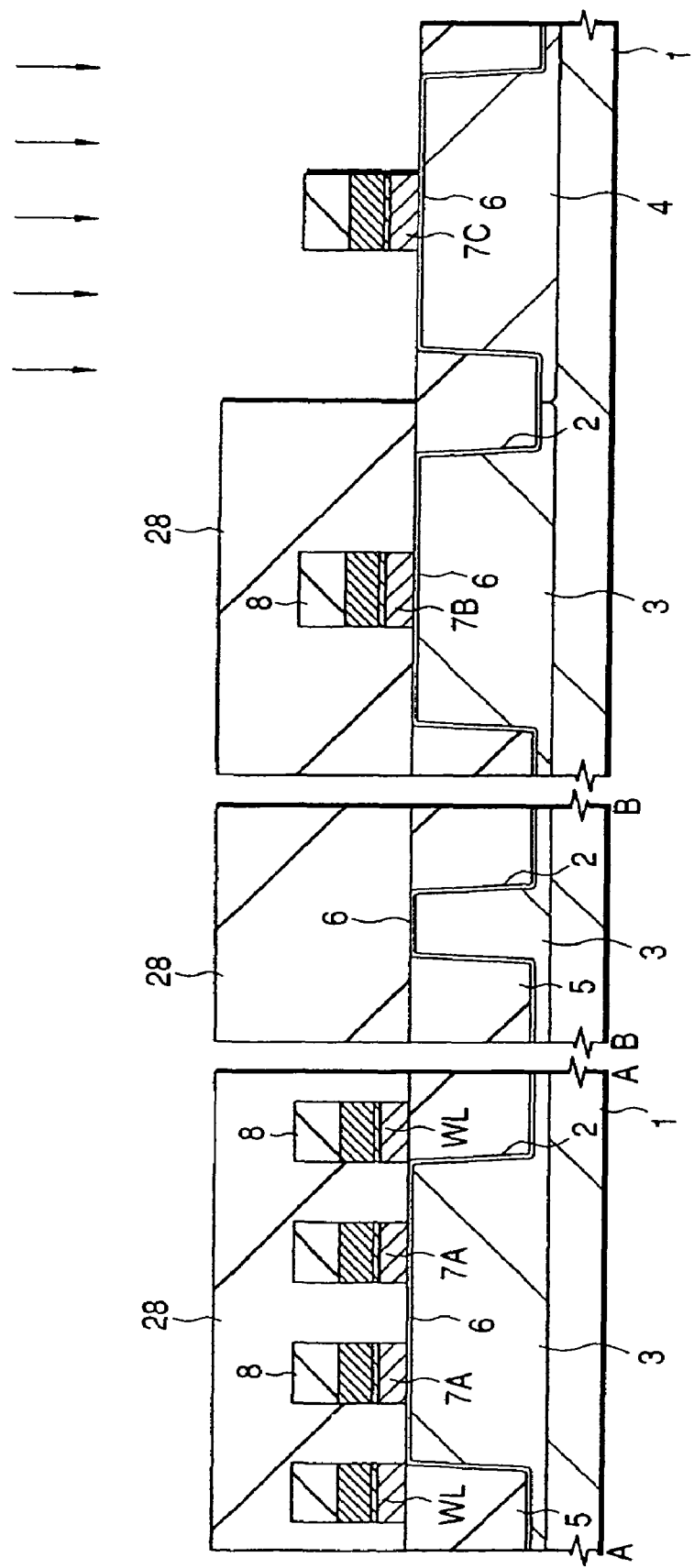
FIG. 23 is a fragmentary cross-sectional view of a semiconductor substrate illustrating the manufacturing process of the semiconductor integrated circuit device according to the one embodiment of the present invention.
Figure 24:
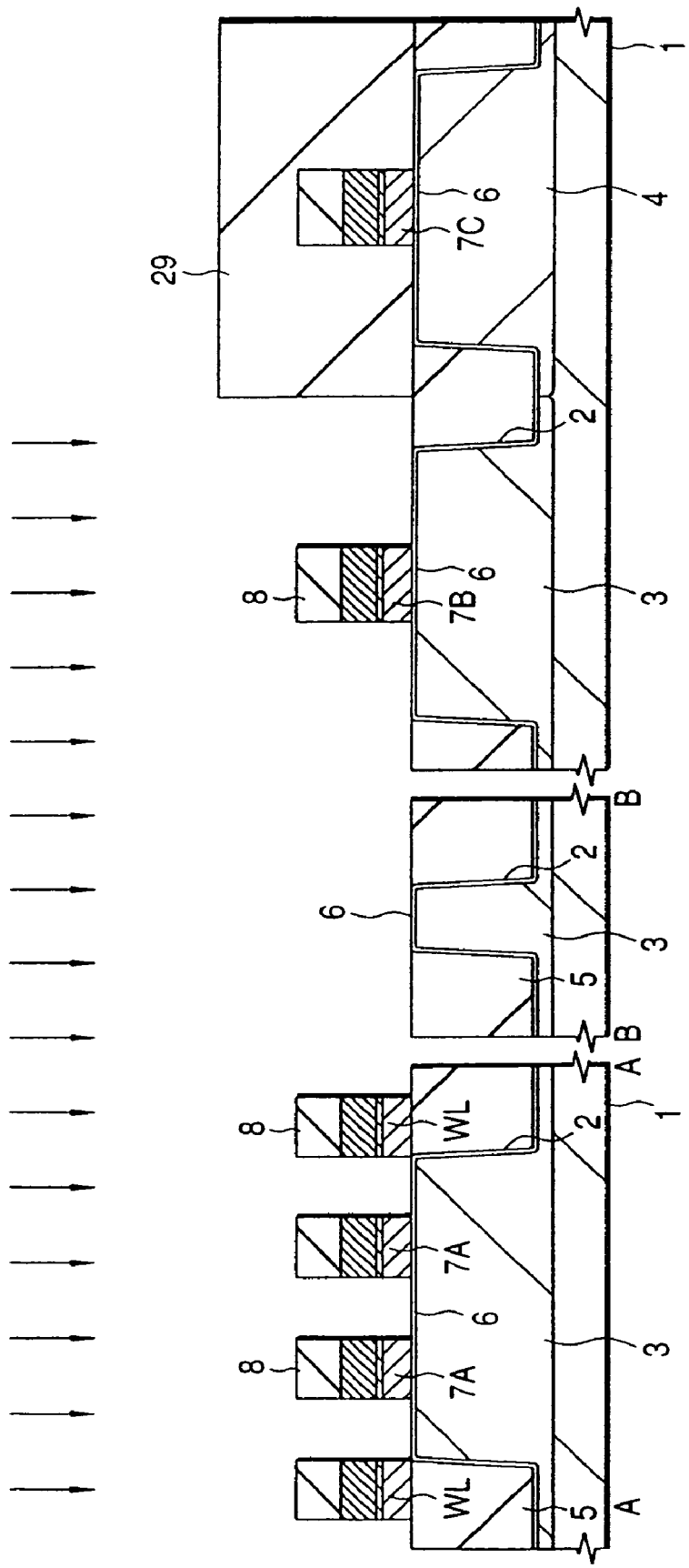
FIG. 24 is a fragmentary cross-sectional view of a semiconductor substrate illustrating the manufacturing process of the semiconductor integrated circuit device according to the one embodiment of the present invention.
Figure 25:
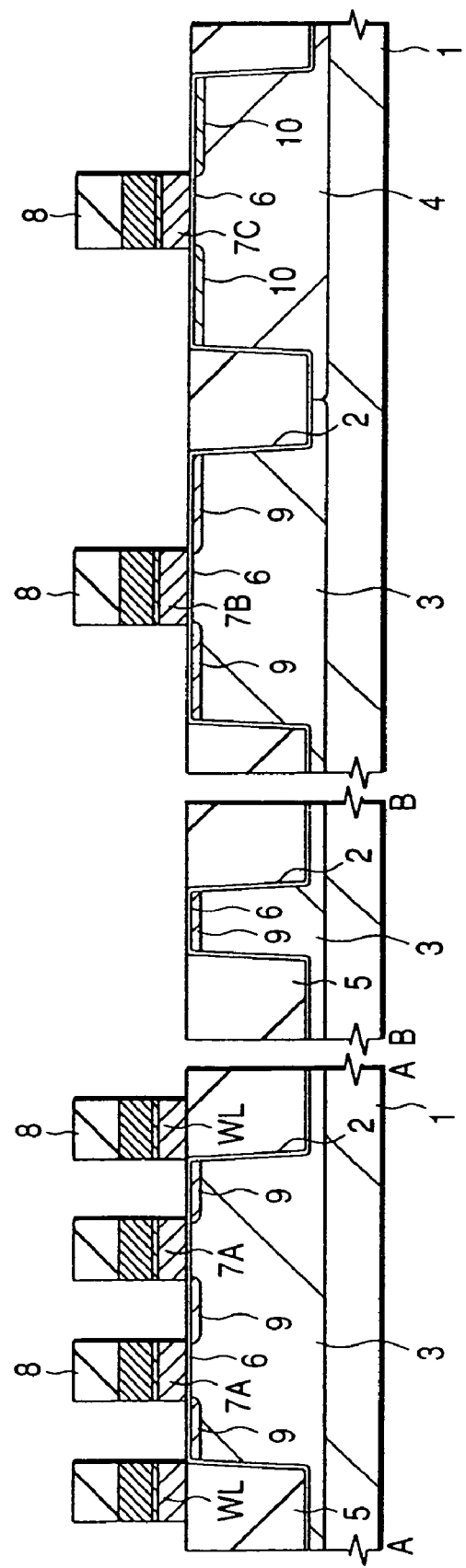
FIG. 25 is a fragmentary cross-sectional view of a semiconductor substrate illustrating the manufacturing process of the semiconductor integrated circuit device according to the one embodiment of the present invention.

As illustrated in FIG. 23, while the upper portion of the p type well 3 is covered with a photoresist film 28, B (boron) is ion-implanted into the n type well 4. After removal of the photoresist film 28 by ashing, the upper portion of the n type well 4 is covered with a photoresist film 29 and As (arsenic) is ion-implanted in the p type well 3 as illustrated in FIG. 24. The doses of B and As are each, for example, $3 \times 10^{13}$ atoms/cm$^2$.

After removal of the photoresist film 29 by ashing, the surface of the substrate 1 is wet washed to remove the ashing residue adhered to the surface of the substrate 1. Since this wet washing must be conducted under conditions not permitting oxidation of the W film (25) exposed from the sidewalls of the gate electrodes 7A, 7B and 8C, the above-described pure water or chemical solution used in the washing step just after the re-oxidation process is used.

The substrate 1 is then heat treated for about 10 seconds in a nitrogen gas atmosphere of about 950° C. by lamp annealing to electrically activate the above-described impurities, whereby n$^-$ type semiconductor regions 9 are formed in the p type well 3 on both sides of each of the gate electrodes 7A and 7B, while p$^-$ type semiconductor regions 10 are formed in the n type well 4 on both sides of the gate electrode 7C. The surface of the substrate 1 may thereafter be washed in order to remove a trace amount of oxide contamination which has sublimed from the sidewalls of the gate electrodes 7A, 7B and 7C as a result of the above-described heat treatment for activating the impurities and then, re-deposited on the surface of the substrate 1. For this washing, the above-described pure water or chemical solution used in the washing step just after the re-oxidation process is preferably employed.

Figure 26:
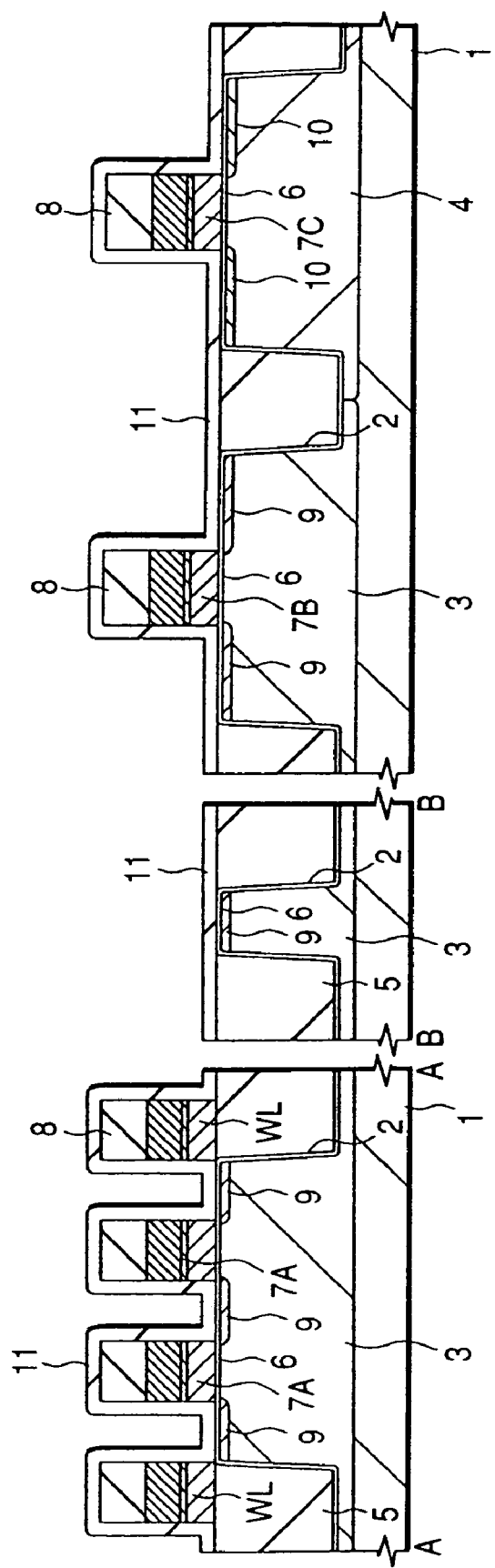
FIG. 26 is a fragmentary cross-sectional view of a semiconductor substrate illustrating the manufacturing process of the semiconductor integrated circuit device according to the one embodiment of the present invention.

As illustrated in FIG. 26, a silicon nitride film 11 of about 50 nm thickness is then deposited over the substrate 1. This silicon nitride film 11 is deposited, for example, by low-pressure CVD using, as source gases, monosilane ($SiH_4$) and ammonia ($NH_3$). The following is one example of the film formation flow of this silicon nitride film 11.

The wafer 1 is loaded in the chamber of a low-pressure CVD apparatus filled in advance with nitrogen. The pre-heating temperature in the chamber is set at less than 500° C. The chamber is fed with only ammonia, one of the source gases, and its atmosphere is changed to a W-oxide reductive one. The wafer 1 is heated to a temperature of 600° C. or greater, for example, a temperature range of from 730° C. to 780° C. while continuing the supply of ammonia to the chamber. The chamber is then fed with ammonia and monosilane and by reacting these gases, the silicon nitride film 11 is deposited. The time required for the formation of the silicon nitride film 11 is about 10 minutes. The feeding of monosilane is then stopped. The wafer 1 is cooled to 500° C. or less, for example, to 400° C., while continuing the supply of ammonia in the chamber. The chamber is purged with nitrogen, followed by unloading of the wafer. When the atmosphere in the chamber is changed from an ammonia gas to a nitrogen gas at high temperatures, there is a potential danger of sublimation of the W film 25 on the sidewalls of the gate electrodes 7A, 7B and 7C, or the oxide 27 which has remained without being reduced. It is therefore more desired to carry out switchover from an ammonia gas to a nitrogen gas after the temperature of the wafer 1 is lowered to a range of from about 300 to 200° C. It is needless to say that if there is no severe request for the formation time of the silicon nitride film 11, switchover to the nitrogen gas atmosphere after the temperature of the wafer 1 lowers to about 100° C., more preferably to a range of from 70° C. to room temperature is effective for preventing oxidation of the W film 25.

By depositing the silicon nitride film 11 in the above-described manner, the silicon nitride film 11 can be deposited in a high temperature atmosphere without oxidizing the W film 25 and $WN_X$ film 24 constituting the gate electrodes 7A, 7B and 7C. Since the temperature of the wafer 1 is raised under the reductive conditions of the oxide 27 on the sidewalls of the gate electrodes 7A, 7B and 7C, the sublimation amount of the oxide 27 in the chamber can be kept at a markedly low level, making it possible to greatly reduce the contamination of the substrate 1 during the formation step of the silicon nitride film 11.

In the above-described deposition process of the silicon nitride film 11, the wafer 1 is heated or cooled in an ammonia gas atmosphere, but another gas atmosphere which can reduce a W oxide, for example, a hydrogen, Co or $N_2O$ gas atmosphere may be employed. Upon use of the another gas, however, pipes and the like for it must be added to the CVD apparatus. As the purge gas, a noble gas such as argon (Ar), helium (He) or xenon (X) is usable, while as the source gas, a mixed gas of dichlorosilane ($SiH_2Cl_2$) and ammonia is usable.

The contamination concentration of the surface of the substrate 1 with W oxides can thus be reduced to $1 \times 10^{10}$ pieces/cm$^2$ or less, which is a detection limit level, by the above-described process, resulting in an improvement of the refresh time of DRAM from 50 nm, which is the value before the above-described countermeasure is taken, to 200 ms or greater.

The silicon nitride film 11 can also be deposited by the plasma CVD instead of the low-pressure CVD. The plasma CVD hardly produces W oxides, because this method enables formation of a film at lower temperatures (400 to 500° C.) than the low-temperature CVD. In spite of such a merit, it is inferior in denseness of the film to the low-pressure CVD. When the plasma CVD is employed, the contamination of the substrate 1 during the formation step of the silicon nitride film 11 can be suppressed to a remarkably low level by heating and cooling in a W-oxide reductive atmosphere. Upon deposition of the silicon nitride film by the plasma CVD, oxides formed on the surface of the W film 25 are removed prior to the deposition, so that it is effective to form the film after plasma treatment in the ammonia- or hydrogen-containing reductive atmosphere as described above.

Figure 27:
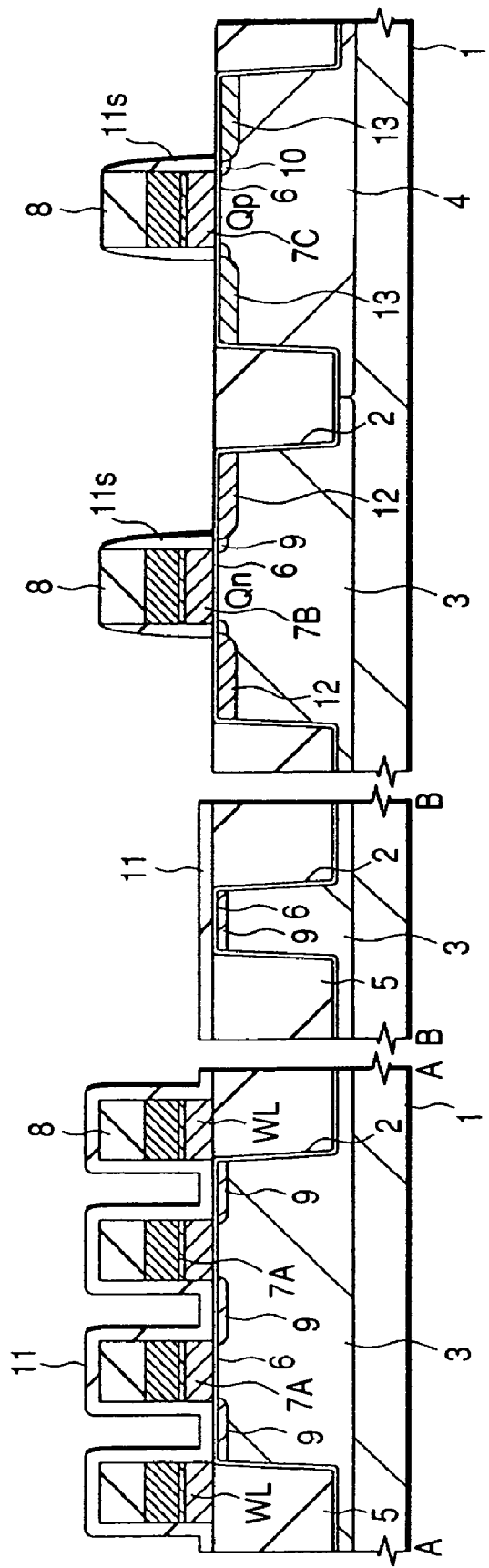
FIG. 27 is a fragmentary cross-sectional view of a semiconductor substrate illustrating the manufacturing process of the semiconductor integrated circuit device according to the one embodiment of the present invention.

The process after the deposition of the silicon nitride film 11 will next be described simply. First, as illustrated in FIG. 27, the upper portion of the substrate 1 of the memory array is covered with a photoresist film (not illustrated) and the silicon nitride film 11 of the peripheral circuit portion is anisotropically etched, whereby the sidewall spacers 11c are formed on the sidewalls of each of the gate electrodes 7B and 7C of the peripheral circuit portion.

By ion implantation of As or P into the p type well 3 of the peripheral circuit portion, n$^+$ type semiconductor regions (source and drain) 12 having a high impurity concentration are formed, while by ion implantation of B into the n type well 4, p$^+$ type semiconductor regions (source and drain) having a high impurity concentration are formed. By the steps so far mentioned, the n-channel type MISFETQn and p-channel type MISFETQP are completed in the peripheral circuit portion.

Figure 28:
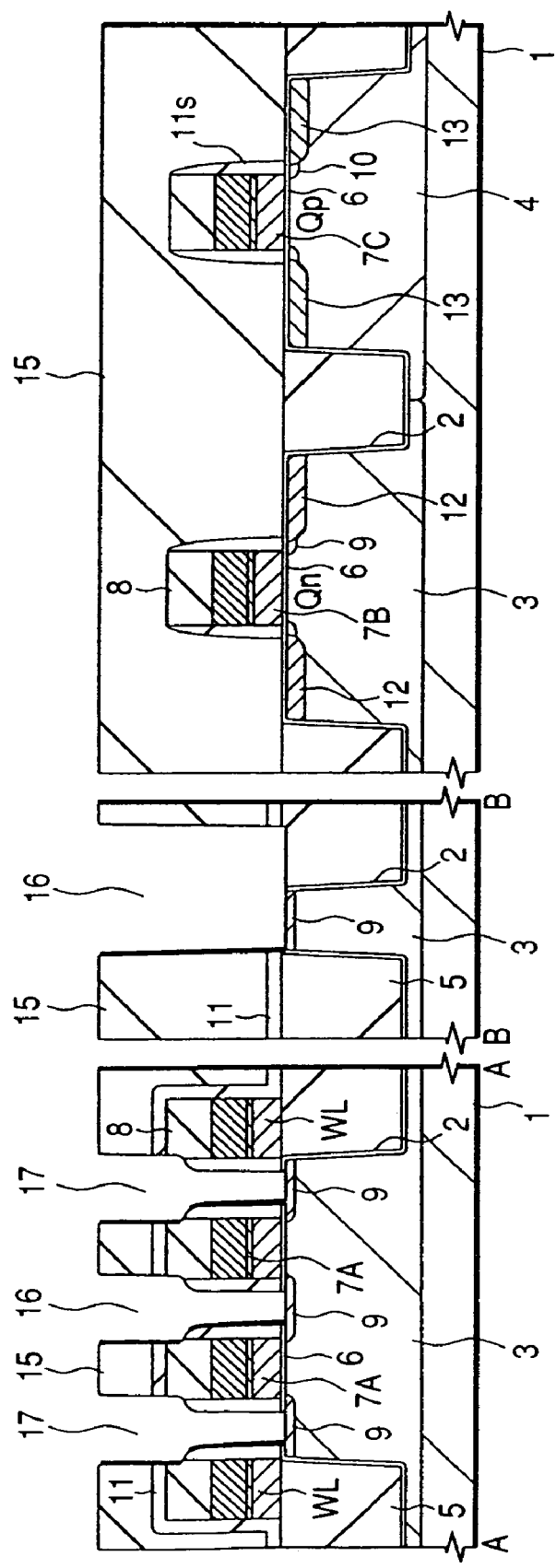
FIG. 28 is a fragmentary cross-sectional view of a semiconductor substrate illustrating the manufacturing process of the semiconductor integrated circuit device according to the one embodiment of the present invention.

As illustrated in FIG. 28, after formation of an interlayer insulating film 15 made of a spin-on-glass film and a double-layer silicon oxide film over the gate electrodes 7A, 7B and 7C, the silicon nitride film 11 over the n$^-$ semiconductor regions 9 is removed by dry etching with a photoresist film (not illustrated) as a mask to expose the surface of the n$^-$ type semiconductor regions 9, whereby contact holes 16 and 17 are formed. The silicon nitride film 11 is etched under such conditions that the etching rate of the silicon nitride film 11 exceeds that of the silicon oxide film 5 embedded in the isolation trench 2, whereby excessive etching of the isolation trench 5 can be prevented. In addition, this etching is conducted under conditions permitting anisotropic etching of the silicon nitride film 11, whereby the silicon nitride film 11 is left on the sidewalls of the gate electrode 7 (word line WL). In such a manner, the contact holes 16 and 17 having a minute diameter are formed in self alignment with the gate electrode 7A (word line WL).

Figure 29:
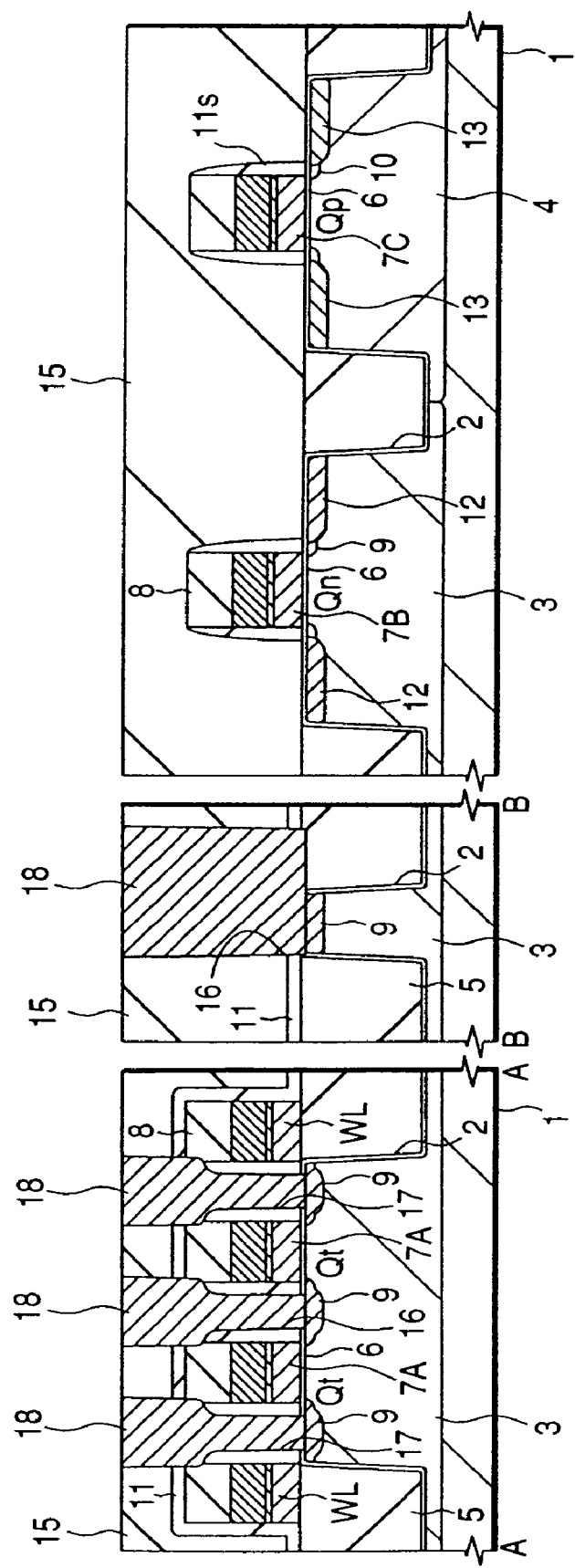
FIG. 29 is a fragmentary cross-sectional view of a semiconductor substrate illustrating the manufacturing process of the semiconductor integrated circuit device according to the one embodiment of the present invention.

As illustrated in FIG. 29, a plug 18 is formed inside of each of the contact holes 16 and 17. The plug 18 is formed by depositing a p-doped polycrystalline silicon film inside of the contact holes 16 and 17 and over the interlayer insulating film 15 by CVD, followed by removal of an unnecessary portion of the polycrystalline silicon film on the interlayer insulating film 15 by dry etching.

The substrate 1 is then heat treated in a nitrogen gas atmosphere to diffuse, into the n$^-$ type semiconductor regions 9, P in the polycrystalline silicon film constituting the plug 18, whereby low-resistance n type semiconductor regions 9 (source and drain) are formed. By the steps so far mentioned, formation of the memory cell selecting MISFETQt in the memory array is completed.

Figure 30:
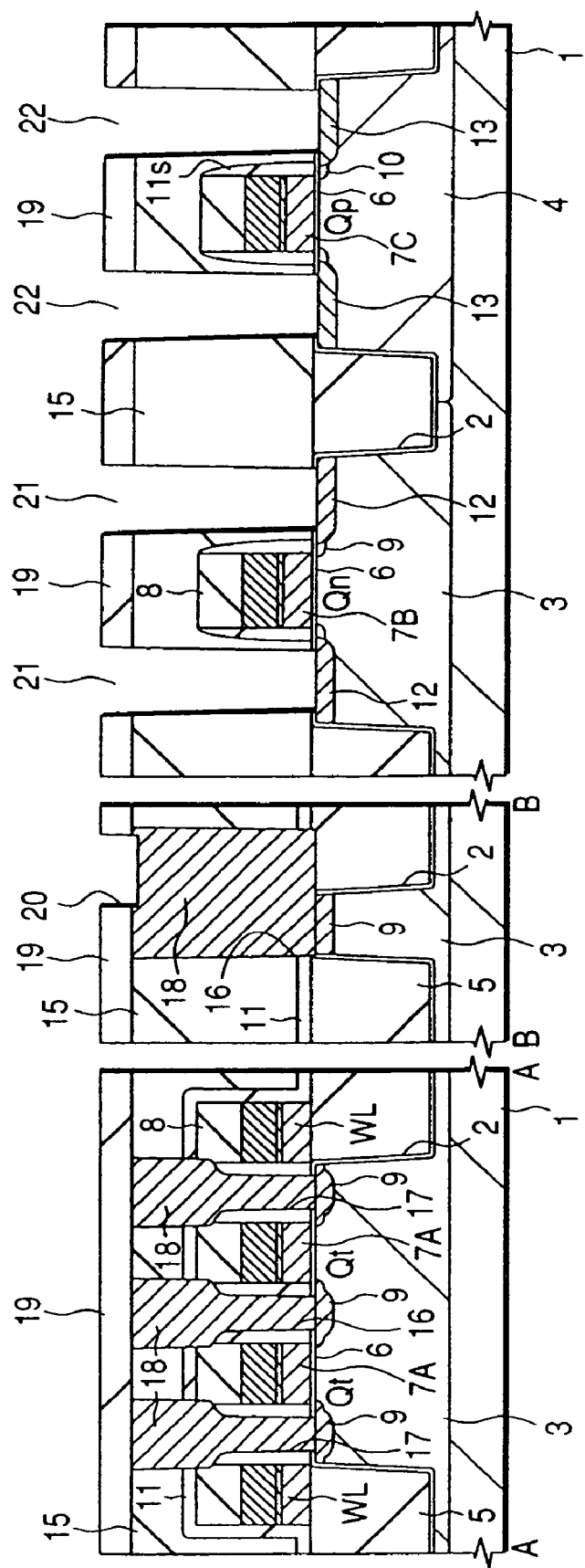
FIG. 30 is a fragmentary cross-sectional view of a semiconductor substrate illustrating the manufacturing process of the semiconductor integrated circuit device according to the one embodiment of the present invention.
Figure 31:
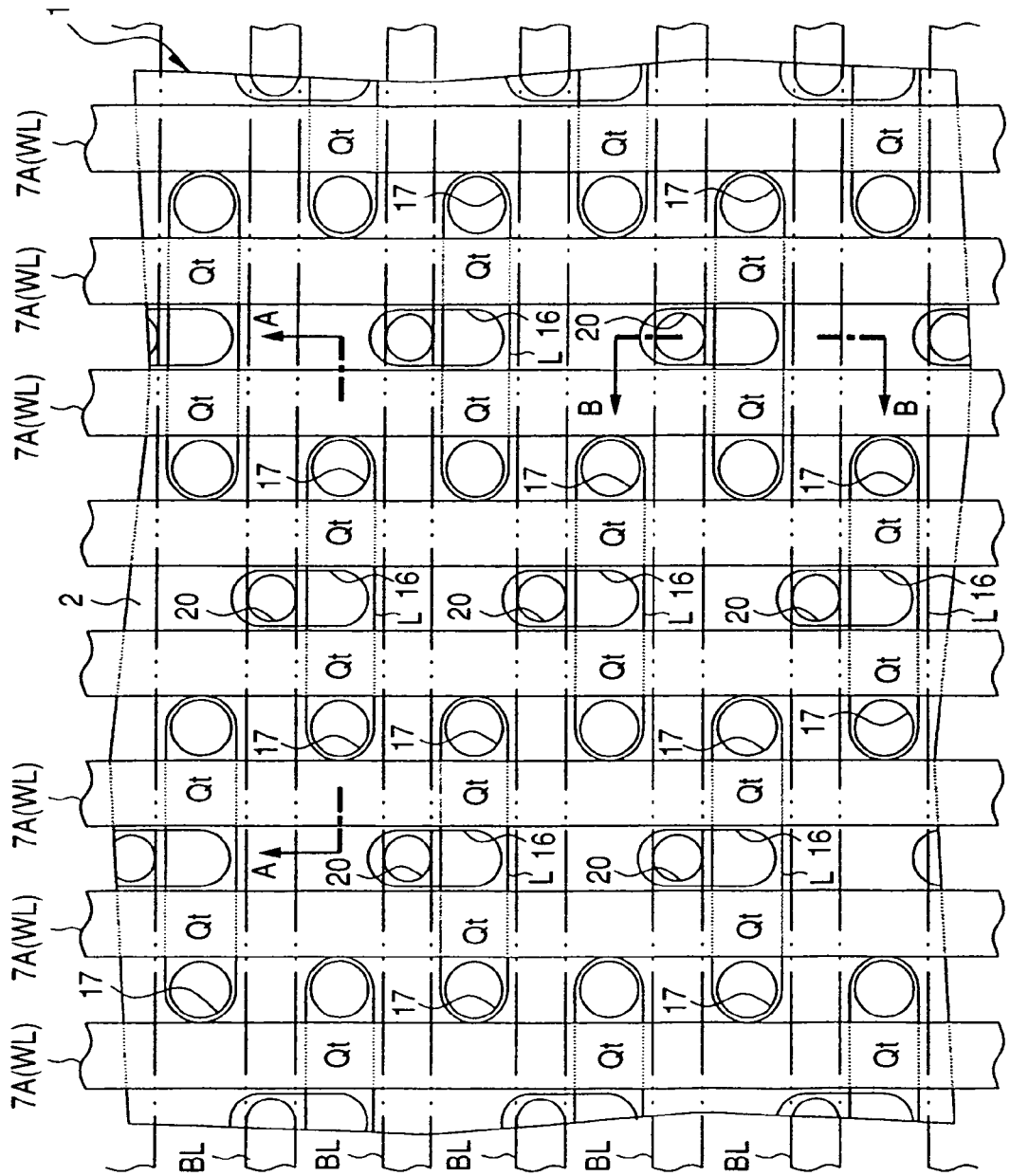
FIG. 31 is a fragmentary plan view of a semiconductor substrate illustrating the manufacturing process of the semiconductor integrated circuit device according to the one embodiment of the present invention.

As illustrated in FIGS. 30 and 31, after deposition of a silicon oxide film 19 over the interlayer insulating film 15 by CVD, the silicon oxide film 19 and the underlying interlayer insulating film 15 of the peripheral circuit portion is dry etched with a photoresist film (not illustrated) as a mask, whereby contact holes 21 are formed over the source and drain (n$^+$ type semiconductor regions 12) of the n-channel MISFETQn and contact holes 22 are formed over the source and drain (p$^+$ type semiconductor regions 13) of the p-channel MISFETQp. Simultaneously with the formation of these contact holes, the silicon oxide film 19 of the memory array is etched to form a through-hole 20 over the contact hole 16.

Figure 32:
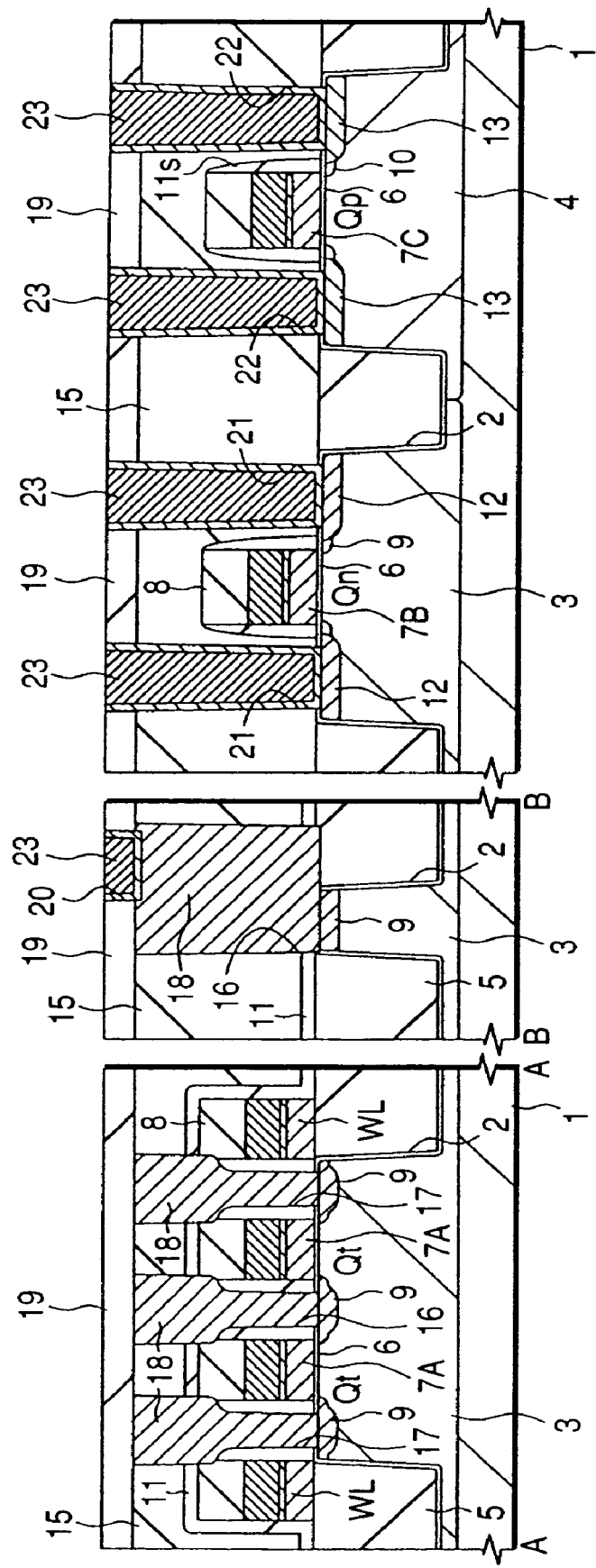
FIG. 32 is a fragmentary cross-sectional view of a semiconductor substrate illustrating the manufacturing process of the semiconductor integrated circuit device according to the one embodiment of the present invention.

As illustrated in FIG. 32, a plug 23 is formed inside of each of the contact holes 21 and 22 formed in the peripheral circuit portion and the through-hole 20 formed in the memory array. The plug 23 is formed, for example, by depositing a TiN film and W film over the silicon oxide film 19 including the insides of the contact holes 21 and 22, and through-hole 20 by sputtering and CVD, and then removing unnecessary portions of the W film and TiN film over the silicon oxide film 19 by chemical mechanical polishing.

Figure 33:
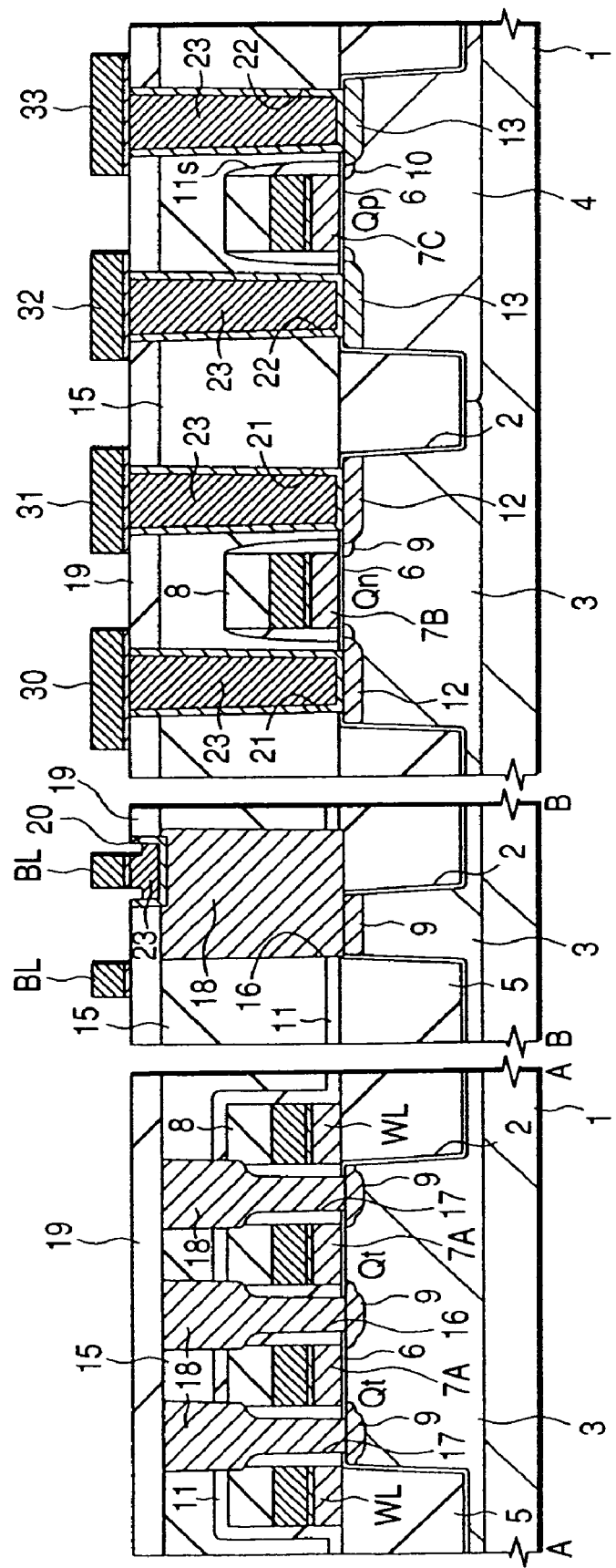
FIG. 33 is a fragmentary cross-sectional view of a semiconductor substrate illustrating the manufacturing process of the semiconductor integrated circuit device according to the one embodiment of the present invention.

As illustrated in FIG. 33, a bit line BL is formed over the silicon oxide film 19 of the memory array, while interconnects 30 to 33 are formed over the silicon oxide film 19 of the peripheral circuit portion. The bit line BL and interconnects 30 to 33 are formed, for example, by depositing a W film and $WN_X$ film over the silicon oxide film 19 by sputtering, and then patterning these films by dry etching with a photoresist film as a mask.

Figure 34:
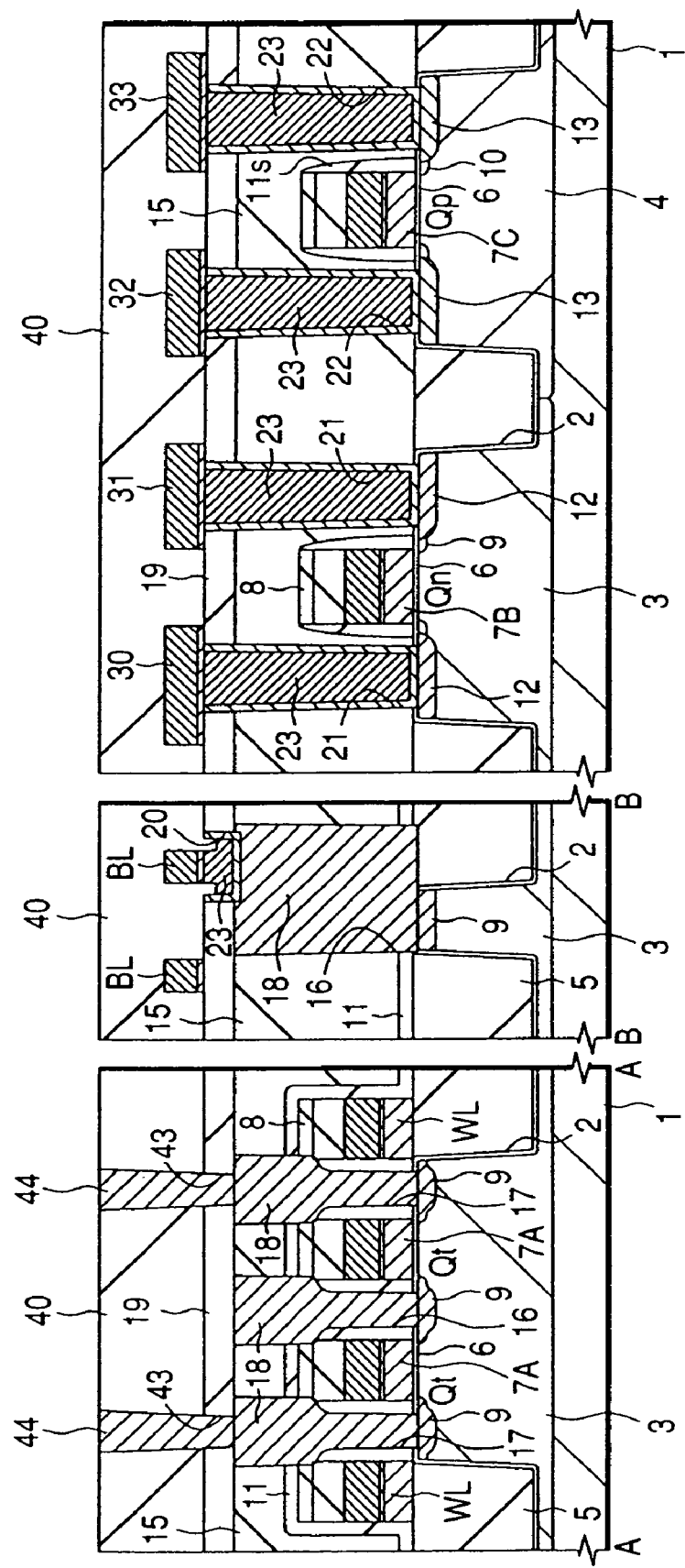
FIG. 34 is a fragmentary cross-sectional view of a semiconductor substrate illustrating the manufacturing process of the semiconductor integrated circuit device according to the one embodiment of the present invention.

As illustrated in FIG. 34, after formation of an interlayer insulating film 40 composed of a spin-on-glass film and a double-layer silicon oxide film over the bit line BL and interconnects 30 to 33, a through-hole 43 is formed over the contact hole 17 by dry etching of the interlayer insulating film 30 and underlying silicon oxide film 19. A plug 44 made of a polycrystalline silicon film is then formed inside of the through-hole 43. The plug 44 is formed by depositing a P-doped polycrystalline silicon film inside of the through-hole 43 and over the interlayer insulating film 40 by CVD, and removing an unnecessary portion of the polycrystalline silicon film over the interlayer insulating film 40 by dry etching.

Figure 35:
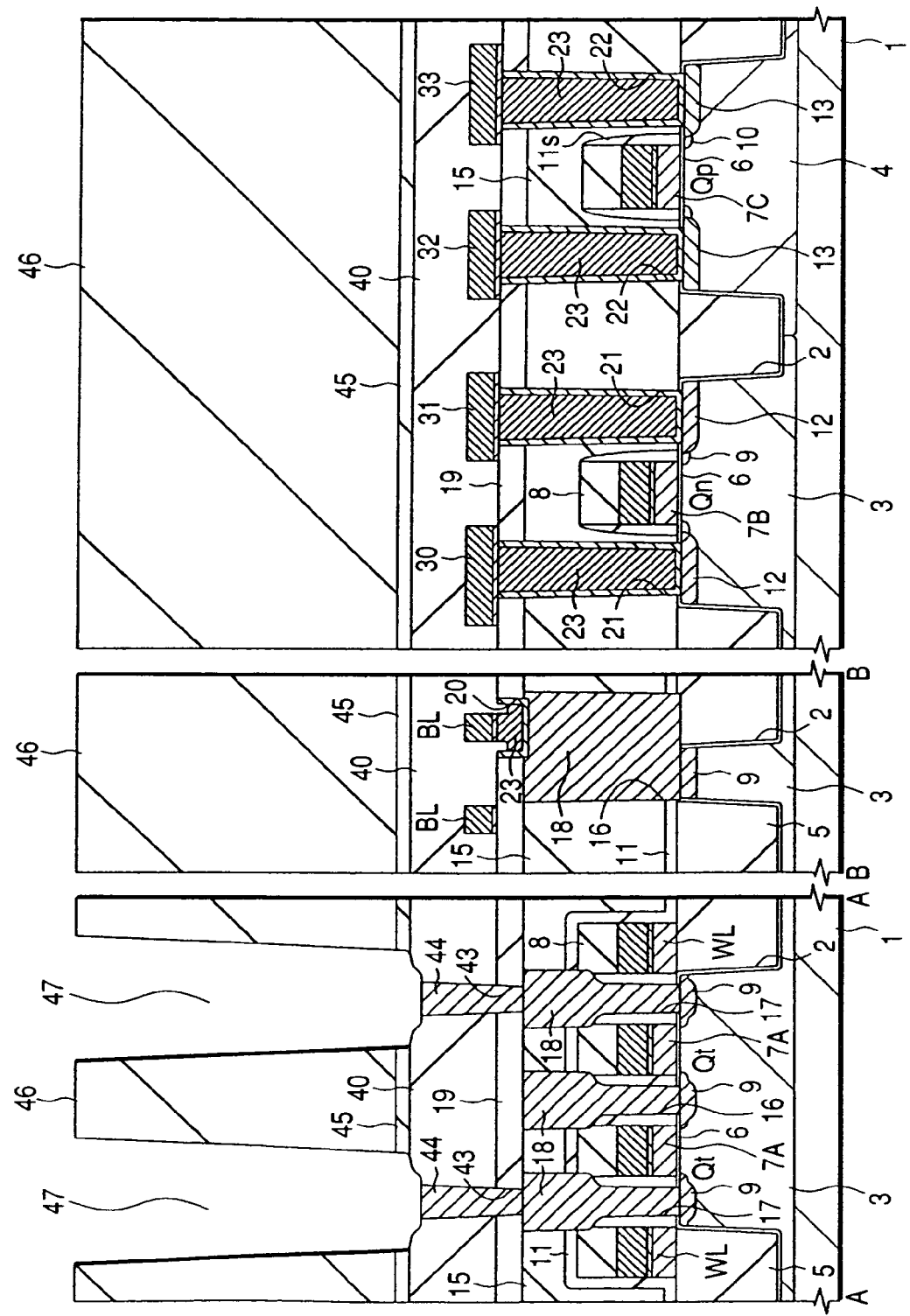
FIG. 35 is a fragmentary cross-sectional view of a semiconductor substrate illustrating the manufacturing process of the semiconductor integrated circuit device according to the one embodiment of the present invention.

As illustrated in FIG. 35, a silicon nitride film 45 is deposited over the interlayer insulating film 40 by CVD, followed by the deposition of a silicon oxide film 46 over the silicon nitride film 45 by CVD. The silicon oxide film 46 of the memory array is dry etched with a photoresist film as a mask and then, the underlying silicon nitride film 45 is dry etched, whereby a trench 47 is formed over the through-hole 44.

Figure 36:
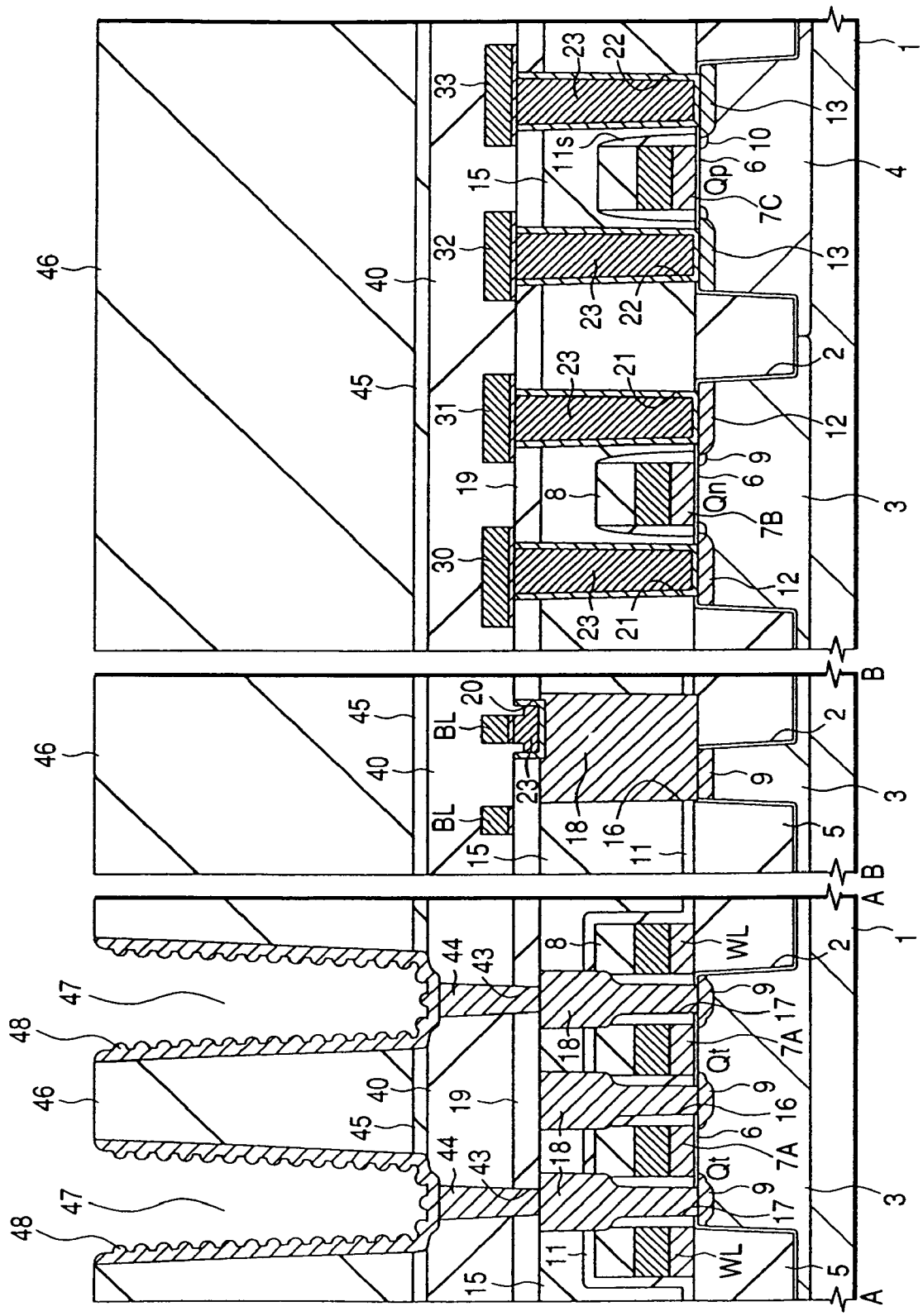
FIG. 36 is a fragmentary cross-sectional view of a semiconductor substrate illustrating the manufacturing process of the semiconductor integrated circuit device according to the one embodiment of the present invention.

As illustrated in FIG. 36, a lower electrode 48 of the information storage capacitor C composed of a polycrystalline silicon film is formed over the inner walls of the trench 47. The lower electrode 48 is formed in the following manner. First, a P (phosphorus)-doped amorphous silicon film (not illustrated) is deposited inside of the trench 47 and over the silicon oxide film 46 by CVD. An unnecessary portion of the amorphous silicon film over the silicon oxide film 46 is then removed by dry etching, followed by wet washing of the surface of the amorphous silicon film, which has remained inside of the trench 47, with a hydrofluoric acid cleaning solution. The surface of the amorphous silicon film is fed with monosilane ($SiH_4$) under a reduced pressure atmosphere. The substrate 1 is heat treated to convert the amorphous silicon film into a polycrystalline film and allow silicon particles to grow on the surface thereof, whereby the lower electrode 48 made of a polycrystalline silicon film having a roughened surface is formed. By roughening of the surface, the polycrystalline silicon film has an enlarged surface area, which leads to an increase in a storage charge amount in spite that the information storage capacitor C is miniaturized.

Figure 37:
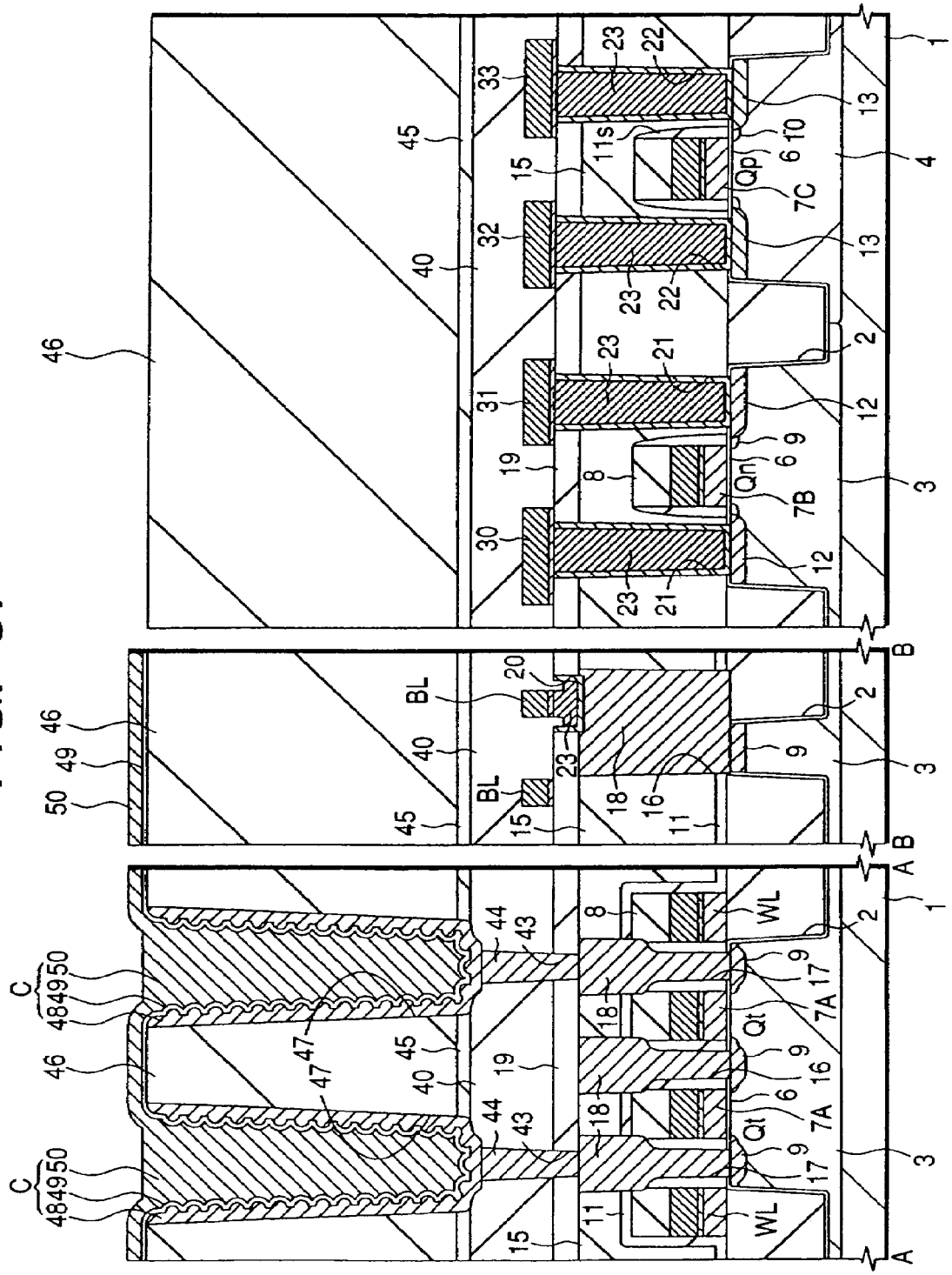
FIG. 37 is a fragmentary cross-sectional view of a semiconductor substrate illustrating the manufacturing process of the semiconductor integrated circuit device according to the one embodiment of the present invention.

As illustrated in FIG. 37, a $Ta_2O_5$ (tantalum oxide) film which will be a capacitive insulating film 49 of the information storage capacitor C is deposited by CVD over the surface of the lower electrode 48 formed inside of the trench 47 and over the silicon oxide film 46 outside the trench 47, followed by heat treatment of the substrate 1 in an oxygen atmosphere, whereby the $Ta_2O_5$ film is modified and crystallized. Then, a TiN film which will be an upper electrode 50 of the information storage capacitor C is deposited over the $Ta_2O_5$ film and the $Ta_2O_5$ film and TiN film of the peripheral circuit portion are removed by etching, whereby the information storage capacitor C formed of the upper electrode 50 made of the TiN film, the capacitive insulating film 49 made of the $Ta_2O_5$ film, and the lower electrode 48 made of the polycrystalline silicon film is formed. By the steps so far mentioned, the memory cell of the DRAM having the memory cell selecting MISFETQt and the information storage capacitor C connected in series therewith is completed.

Over the information storage capacitor C, a silicon oxide film 50 is deposited by CVD and then, about two levels of Al interconnects, which are not illustrated, are formed thereover, whereby the DRAM of this embodiment as illustrated in FIGS. 2 and 3 is completed.

Embodiment 2

In this Embodiment, the present invention is applied to a logic-embedded DRAM. One example of its manufacturing process will next be described in the order of steps based on FIGS. 38 and 45. In each cross-sectional view illustrating the manufacturing process, a memory array of the DRAM is partially illustrated in the left side, while a logic portion is partially illustrated in the right side.

Figure 38:
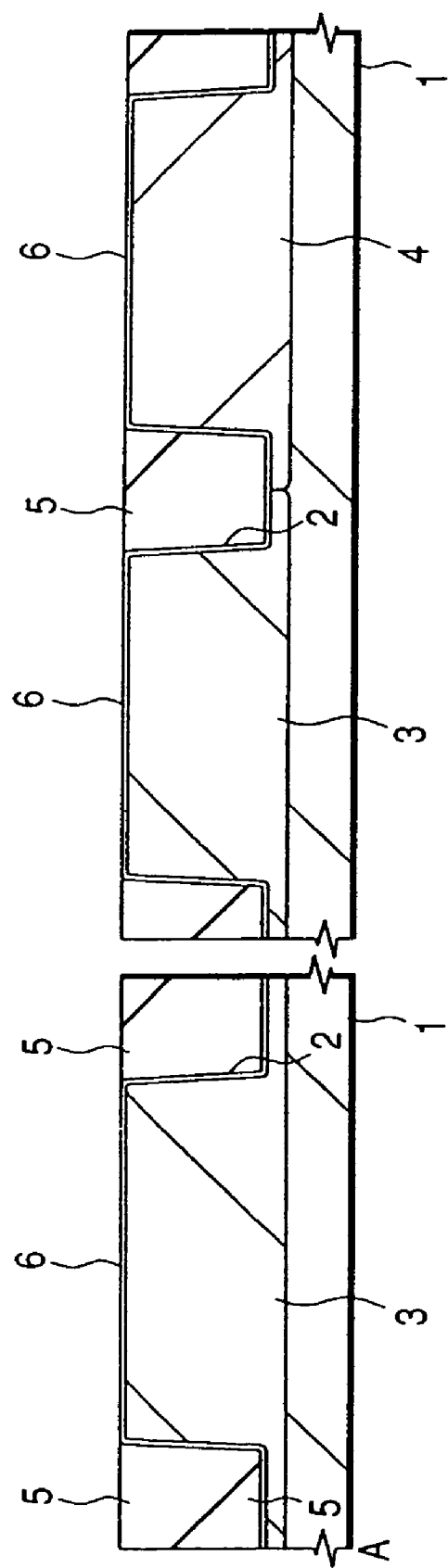
FIG. 38 is a fragmentary cross-sectional view of a semiconductor substrate illustrating a manufacturing process of a semiconductor integrated circuit device according to another embodiment of the present invention.

As illustrated in FIG. 38, a substrate 1 made of, for example, p-type single crystal silicon is prepared. After formation of an isolation trench 2 on the main surface of the substrate 1 in a similar manner to that employed in Embodiment 1, a p-type well 3 is formed in one part of the substrate 1 and an n-type well 4 is formed in the other part. The substrate 1 is then subjected to steam oxidation, whereby a clean gate insulating film 6 made of a silicon oxide film having a thickness of about 6 nm is formed over the surfaces of the p type well 3 and n type well 4. For the formation of the gate insulating film 6, a silicon oxynitride film, silicon nitride film, or a composite insulating film of a silicon oxide film and a silicon nitride film may be used instead of the silicon oxide film.

Figure 39:
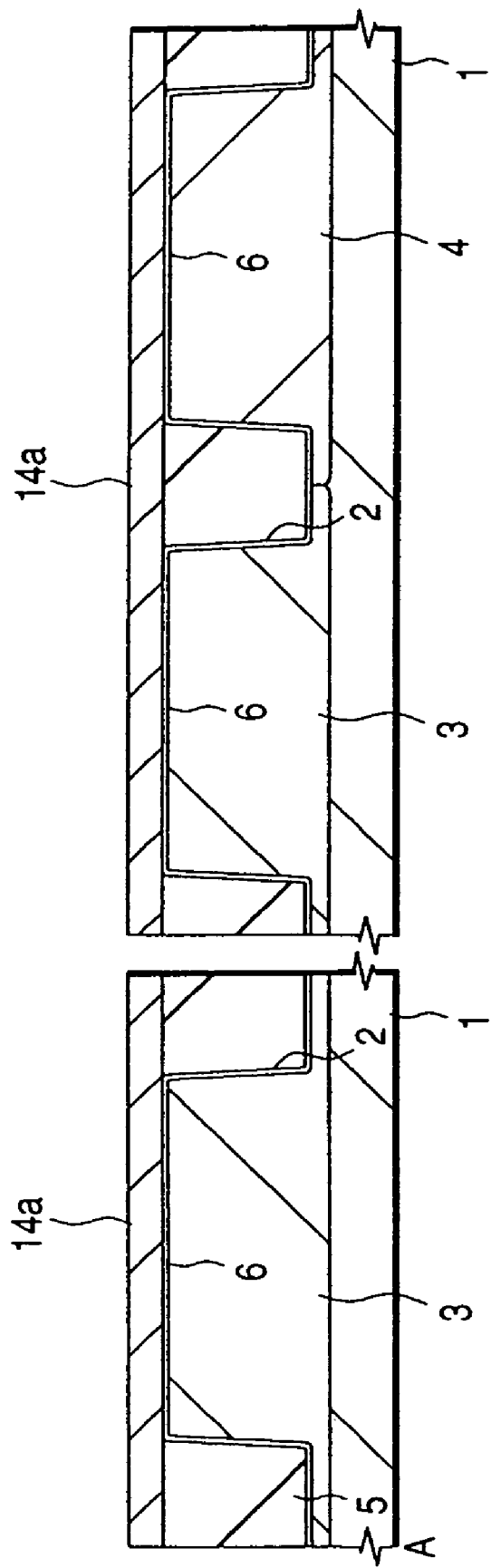
FIG. 39 is a fragmentary cross-sectional view of a semiconductor substrate illustrating the manufacturing process of the semiconductor integrated circuit device according to the another embodiment of the present invention.

As illustrated in FIG. 39, a non-doped amorphous silicon film 14a is deposited over the gate insulating film 6. This amorphous silicon film 14a is deposited, for example, by CVD using monosilane ($SiH_4$) as a source gas to give a film thickness of about 70 nm. When the amorphous silicon film 14a is formed by CVD using monosilane ($SiH_4$) as a source gas, the film forming temperature is set within a range of 500 to 550° C., for example, at 530° C. At a film forming temperature set at 600° C. or greater, the polycrystalline film 14n as described in Embodiment 1 is available. Even when a film formation is conducted by CVD using disilane ($Si_2H_6$) as a source gas, the amorphous silicon film 14a is available by forming at a temperature lower than that permitting the formation of the polycrystalline silicon film, for example, about 520° C. Instead of the non-doped amorphous silicon film 14a, a silicon film containing around 50%, at the maximum, of Ge (germanium) is usable. A Ge-containing amorphous silicon film is available, for example, by depositing a polycrystalline silicon film by CVD and then introducing Ge into the polycrystalline silicon film by ion implantation.

In the logic-embedded DRAM of this Embodiment, as described later, the n-channel type MISFET and p-channel type MISFET of the logic portion are both a surface channel type so that the polycrystalline silicon film which is a constituent of the gate electrode of the n-channel type MISFET is made of n type and the polycrystalline silicon film which is a constituent of the gate electrode of the p-channel type MISFET is made of a p type. If a non-doped type polycrystalline silicon film is deposited over the gate insulating film 6, followed by ion implantation of boron (B) to convert the polycrystalline silicon film of the p-channel type MISFET formation region into a p type, there is a potential danger of a part of boron passing through the polycrystalline silicon film and gate insulating film 6 by the channeling phenomenon, thereby being introduced into the channel region of the substrate 1.

As in this Embodiment, it is desired to use the amorphous silicon film 14a which hardly causes the channeling phenomenon, when a part of the gate electrode of the p-channel type MISFET is made of a p type polycrystalline silicon film. When the silicon oxide film of each of the gate electrodes 7A, 7B and 7C is made of an n conductivity type silicon film as in the DRAM of Embodiment 1, on the other hand, a polycrystalline silicon film may be used instead of the amorphous silicon film 14a because such a problem as passing-through of boron does not occur.

Figure 40:
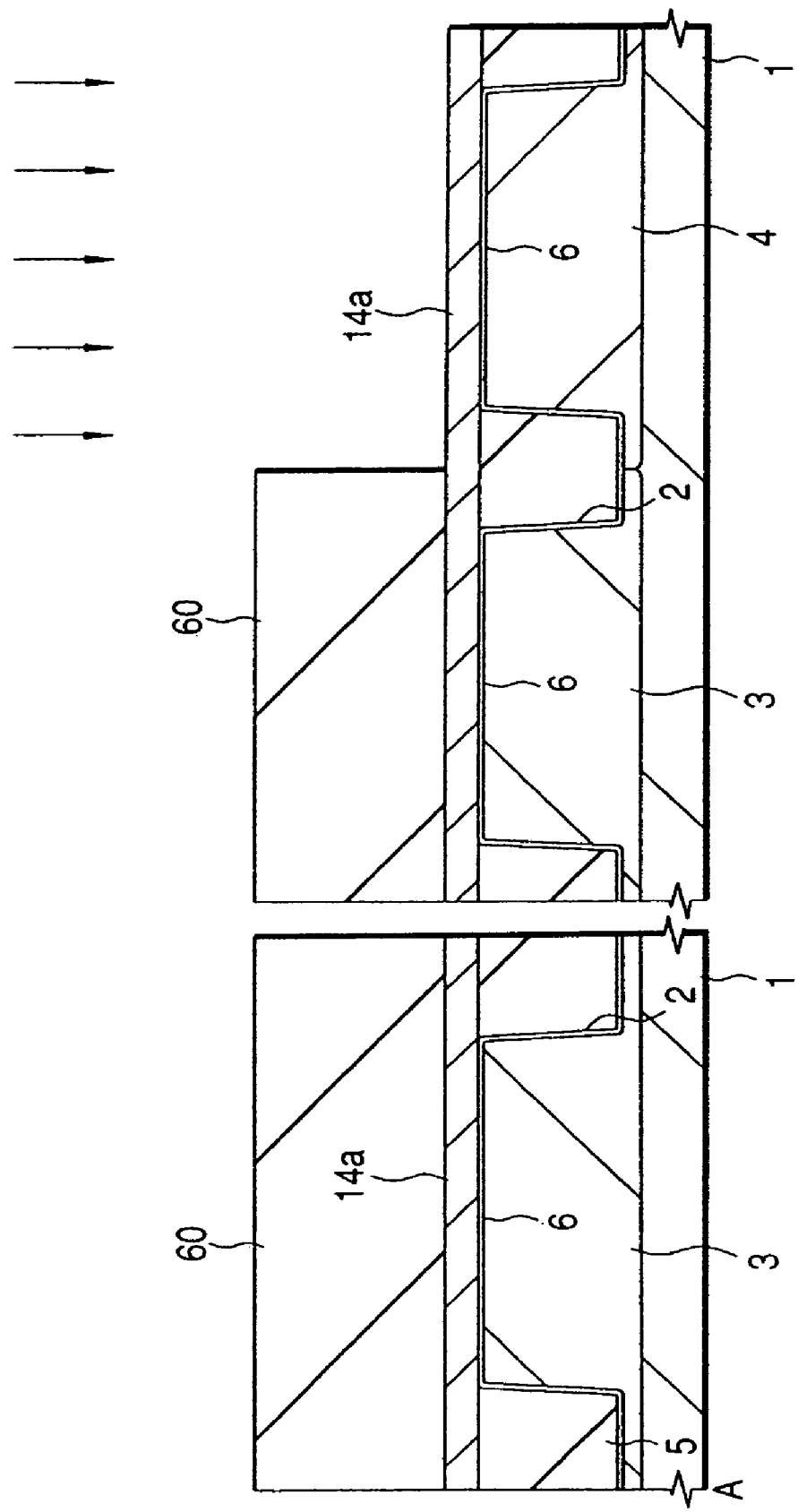
FIG. 40 is a fragmentary cross-sectional view of a semiconductor substrate illustrating a manufacturing process of the semiconductor integrated circuit device according to the another embodiment of the present invention.
Figure 41:
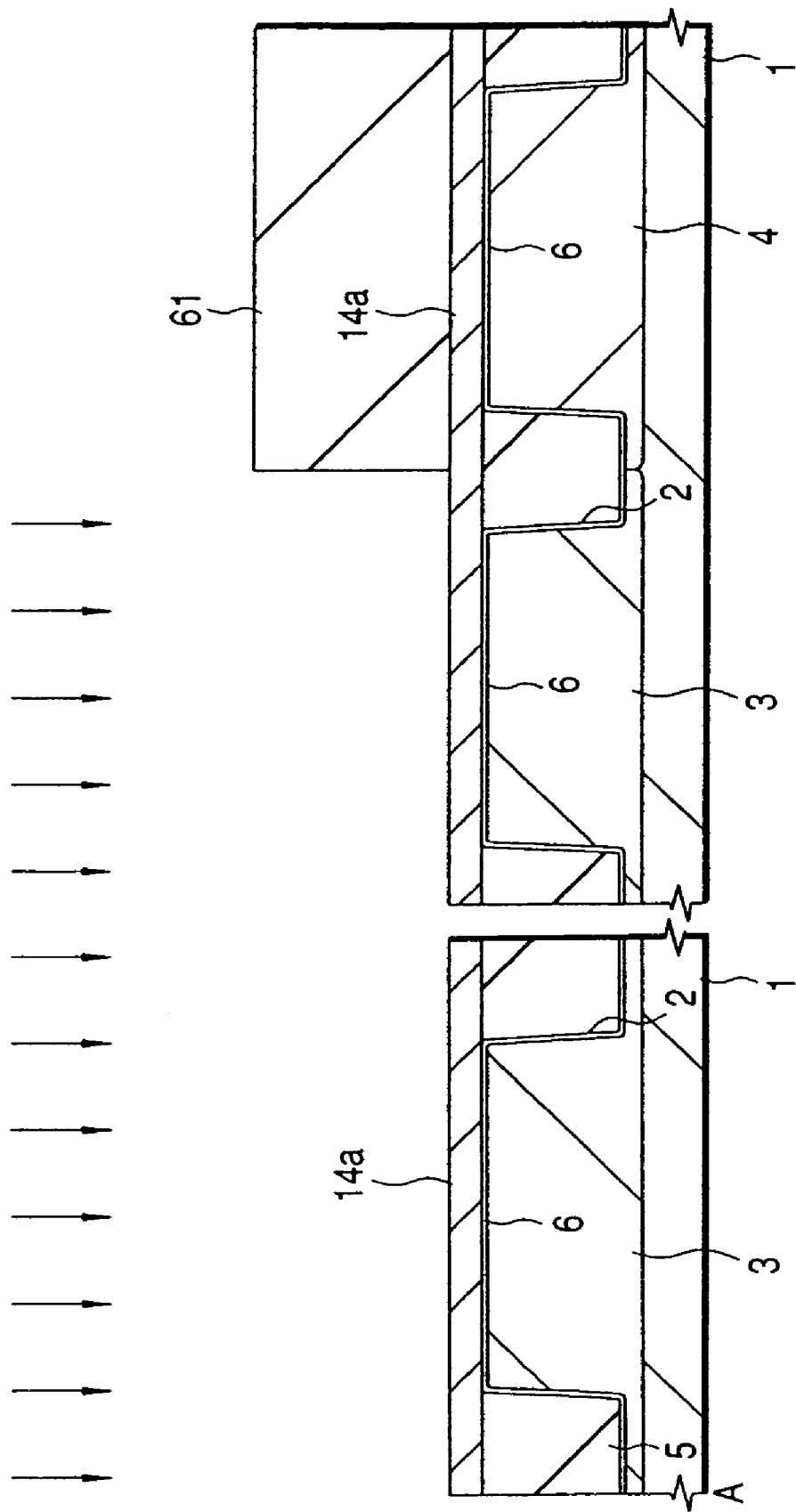
FIG. 41 is a fragmentary cross-sectional view of a semiconductor substrate illustrating the manufacturing process of the semiconductor integrated circuit device according to the another embodiment of the present invention.
Figure 42:
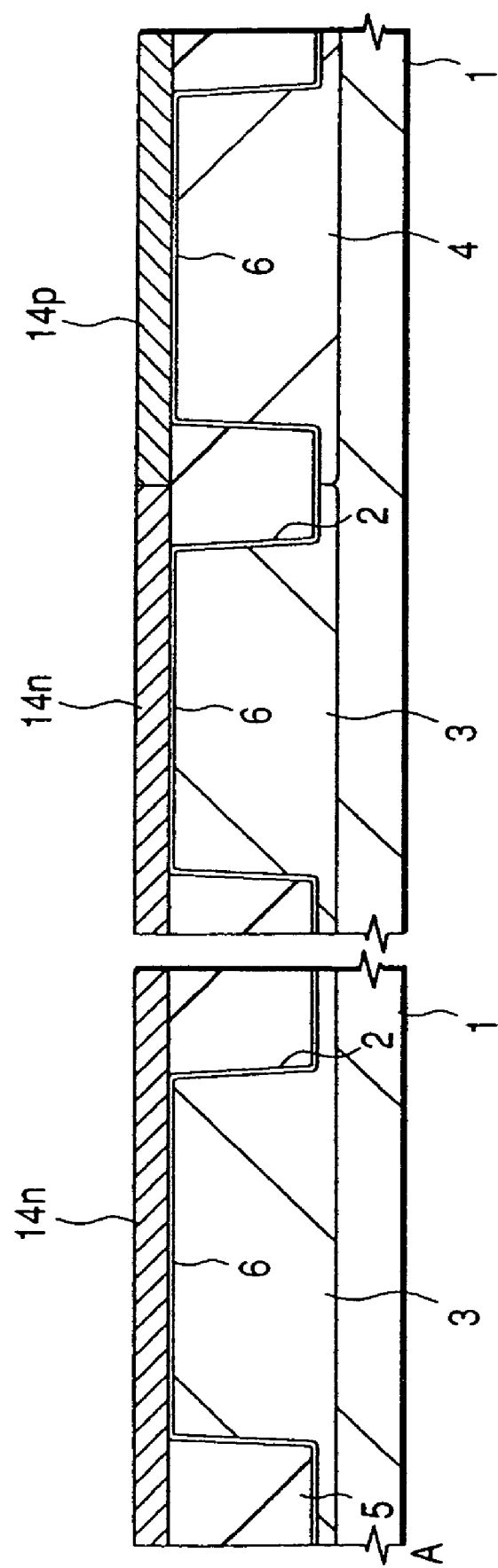
FIG. 42 is a fragmentary cross-sectional view of a semiconductor substrate illustrating the manufacturing process of the semiconductor integrated circuit device according to the another embodiment of the present invention.

As illustrated in FIG. 40, the upper portion of the p type well 3 is covered with a photoresist film 60, and B (boron) is ion-implanted into the amorphous silicon film 14a over the n type well 4. The dose of B is set at, for example, $2 \times 10^{15}$ atoms/cm², while the implantation energy is set at, for example, 5 keV. After removal of the photoresist film 60 by ashing, the upper portion of the n type well 4 is covered with a photoresist film 61 and P (phosphorus) is ion-implanted in the amorphous silicon film 14a over the p type well 3 as illustrated in FIG. 41. The dose of P is set at, for example, $2\times10^{15}$ atoms/cm$^2$, while the implantation energy is set at, for example, 10 keV.

After removal of the photoresist film 61 by ashing, the surface of the polycrystalline silicon film 14 is washed with hydrofluoric acid, followed by lamp annealing for about 1 minute in a nitrogen atmosphere of about 950° C. to crystallize the amorphous silicon film 14a and at the same time, electrically activate the impurities (B and P). By this treatment, the amorphous silicon film 14a in the n-channel type MISFET formation region is converted into the n type polycrystalline silicon film 14n, while the amorphous silicon film 14a in the p-channel type MISFET formation region is converted to the p type polycrystalline silicon film 14p.

Heat treatment for crystallization of the amorphous silicon film 14a after deposition of a $WN_X$ film and W film over the amorphous silicon film 14a presumably causes peeling of the $WN_X$ film or W film owing to a stress change due to crystallization of silicon. It also presumably disturbs attainment of desired device properties, because the impurities (B and P) in the amorphous silicon film 14a are introduced into the $WN_X$ film or W film prior to their diffusion into the interface with the gate-insulating film 6 and voids appear in the vicinity of the interface with the gate insulating film 6. It is therefore desirable to carry out the heat treatment prior to the deposition of the $WN_X$ film and W film over the amorphous silicon film 14a.

Figure 43:
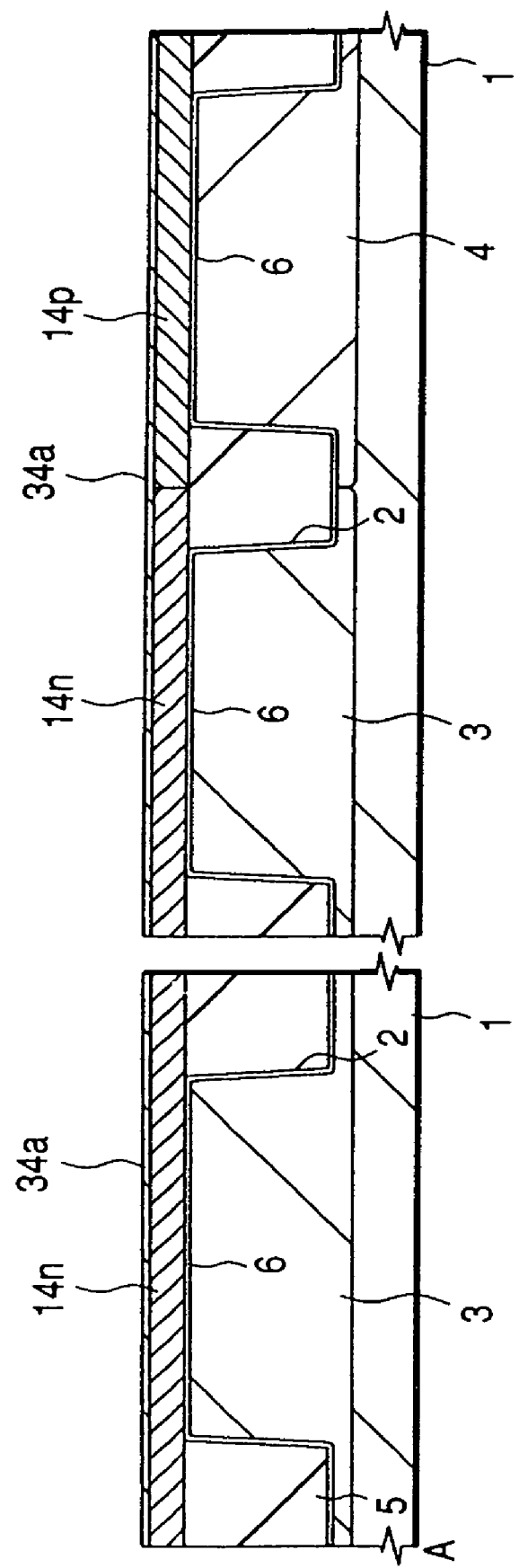
FIG. 43 is a fragmentary cross-sectional view of a semiconductor substrate illustrating the manufacturing process of the semiconductor integrated circuit device according to the another embodiment of the present invention.

After washing the surfaces of the polycrystalline silicon films 14n and 14p with hydrofluoric acid, an amorphous silicon film 34a is deposited over the polycrystalline silicon films 14n and 14p as illustrated in FIG. 43. The amorphous silicon film 34a is deposited (film forming temperature: about 530° C.), for example, by CVD using monosilane (SiH$_4$) as a source gas to give a film thickness of about 10 nm. The amorphous silicon film 34a is made of amorphous silicon having an impurity concentration, just after formation, as low as less than $1.0\times10^{17}$ cm$^3$ or amorphous silicon which is substantially non-doped and having an impurity concentration of $1.0\times10^{14}$ cm$^3$. This amorphous silicon film 34a serves to block the contact between a remarkably thin natural oxide film formed on the surfaces of the polycrystalline silicon films 14n and 14p and the $WN_X$ film 24 deposited thereover by the subsequent step. The amorphous silicon film 34a is not necessarily in a complete amorphous state and it may be an aggregate of ultra-fine silicon crystal particles.

Figure 44:
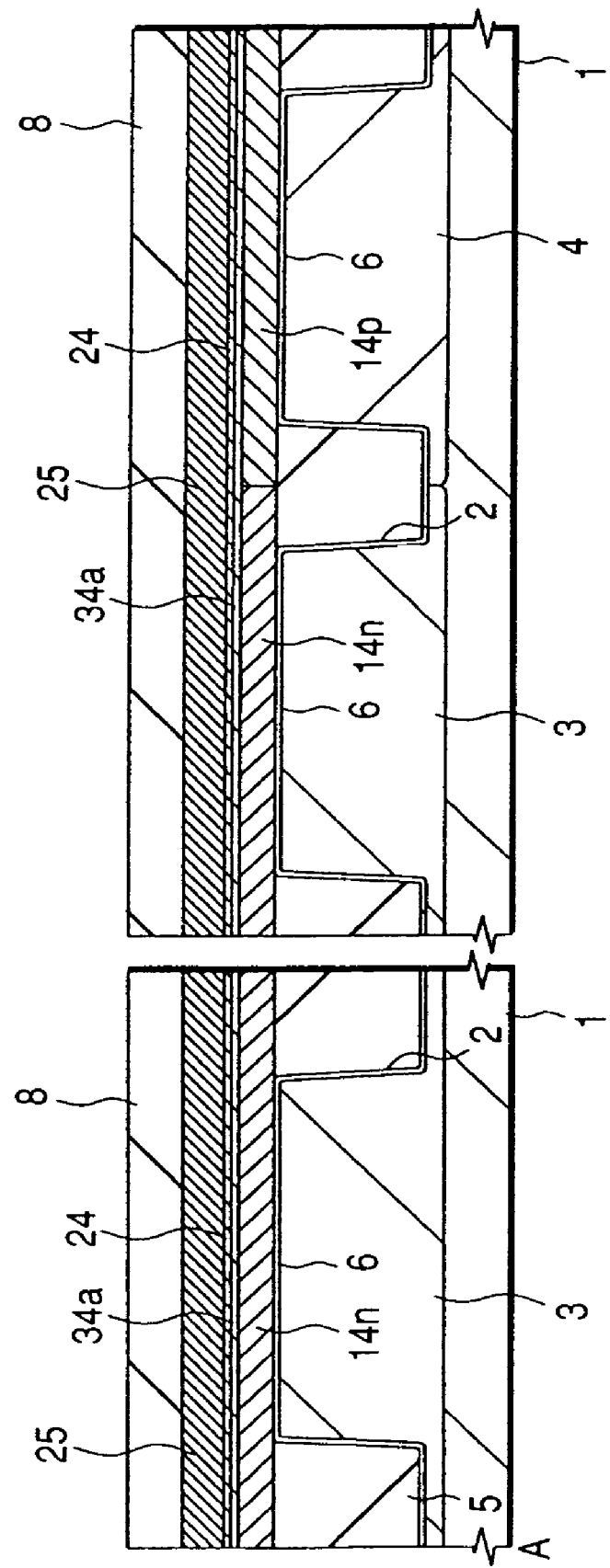
FIG. 44 is a fragmentary cross-sectional view of a semiconductor substrate illustrating the manufacturing process of the semiconductor integrated circuit device according to the another embodiment of the present invention.

After washing the surface of the amorphous silicon film 34a with hydrofluoric acid, the $WN_X$ film 24 and W film 25 are deposited successively over the amorphous silicon film 34a by sputtering, as illustrated in FIG. 44. Over the W film 25, a silicon nitride film 8 is then deposited by CVD. The thickness of the $WN_X$ film 24 is set at from about 5 nm to 10 nm, that of the W film 25 deposited over the $WN_X$ film 24 is set at from 70 to 80 nm, and that of the silicon nitride film 8 is set at about 160 nm. Over the $WN_X$ film 24, an Mo film may be deposited instead of the W film 25.

In this Embodiment, upon formation of the $WN_X$ film 24 by sputtering, the $WN_X$ film 24 is formed under conditions where its nitrogen content upon completion of the element will become at least 7% to 10% or greater, preferably 13% or greater, more preferably 18% or greater. Such a $WN_X$ film 24 is available by forming the film in an atmosphere permitting the incorporation of high concentration nitrogen in the $WN_X$ film 24. In other words, sputtering may be conducted while setting the gas atmosphere so that a flow rate ratio of a nitrogen gas to an argon gas becomes 1.0 or greater. More specifically, the film is formed under the conditions of, for example, a nitrogen gas flow rate of from 50 sccm to 80 sccm, an argon gas flow rate of from 20 sccm to 30 sccm, a vacuum degree in the chamber of 0.5 PA and a temperature of 200 to 500° C.

The thickness of the $WN_X$ film 24 upon film formation is preferably adjusted to a range of from 5 nm to 10 nm. By adjusting the thickness of the $WN_X$ film 24 upon film formation to 5 nm or greater, even if a part of the $WN_X$ film 24 is reacted with the underlying silicon layer in the heat treatment step after film formation, the remaining film thickness upon completion of the element exceeds 1 nm and the film does not lose its function as a barrier layer. The thickness of the $WN_X$ film 24 upon film formation exceeding 10 nm increases the wiring resistance of the gate electrode, becoming a disadvantage for the high-speed operation of a circuit.

Even when the film is formed in an atmosphere permitting the incorporation of a high concentration nitrogen in the $WN_X$ film 24, excessive nitrogen is diffused and released during the heat treatment step after film formation. The $WN_X$ film 24 upon completion of the element is composed mainly of $W_2N$ which is most stable from the stoichiometric view. A portion of the $WN_X$ film reacts with the underlying silicon layer during the heat treatment process, so that upon completion of the element, the $WN_X$ film 24 becomes a mixed crystal containing $W_2N$ and the other $WN_X$, and, in some cases, WSiN further.

Figure 45:
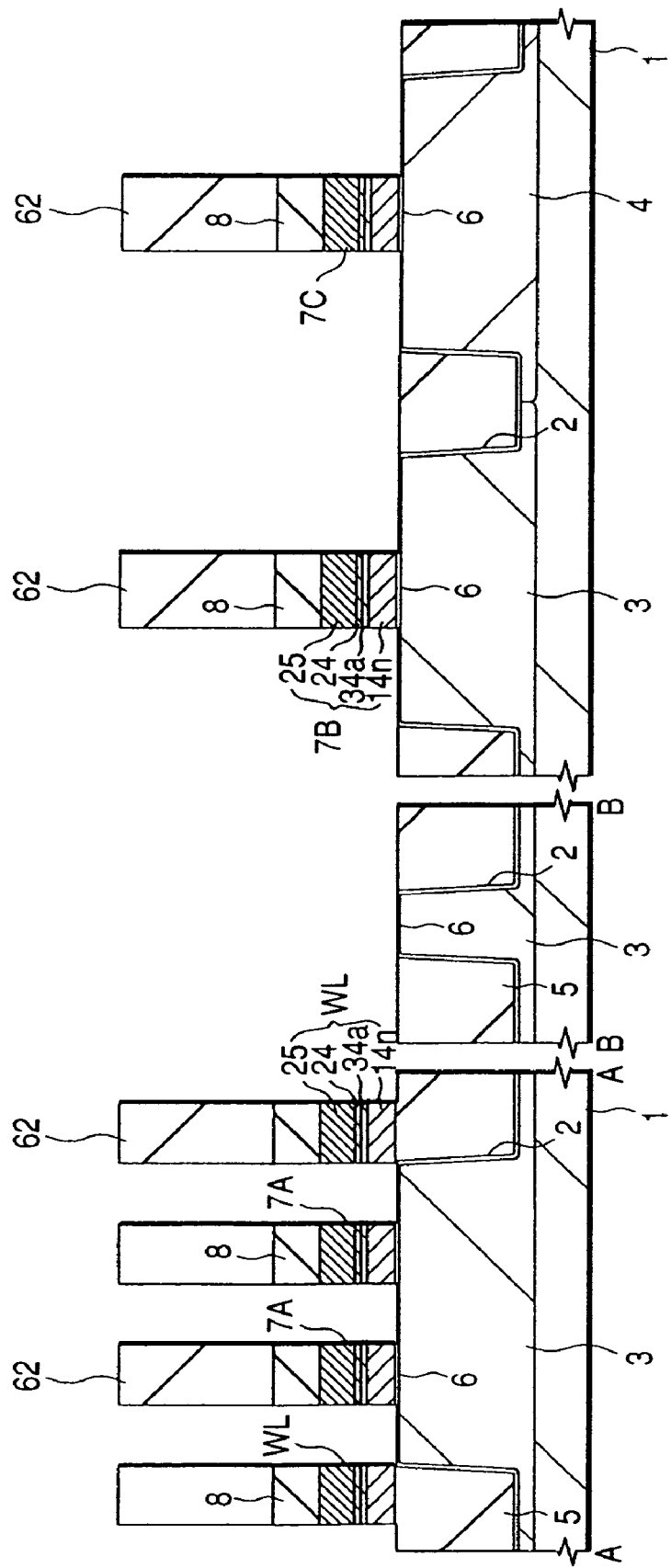
FIG. 45 is a fragmentary cross-sectional view of a semiconductor substrate illustrating the manufacturing process of the semiconductor integrated circuit device according to the another embodiment of the present invention.

As illustrated in FIG. 45, with a photoresist film 62 formed over the silicon nitride film 8 as a mask, the silicon nitride film 8, W film 24, $WN_X$ film 25, amorphous silicon film 34a and polycrystalline silicon films 14n and 14p are dry etched successively, whereby a gate electrode 7A (word line WL) is formed over the gate insulating film 6 of the memory array and gate electrodes 7D and 7E are formed over the gate insulating film 6 of the logic portion.

A memory cell selecting MISFETQt is then formed in the memory array in a manner as described in Embodiment 1 and n-channel type MISFET and p-channel type MISFET are formed in the logic portion. Also in this case, by carrying out re-oxidation treatment of the gate insulating film 6, washing treatment, and deposition of a silicon nitride film in similar manners to Embodiment 1, the contamination of the substrate 1 with the oxides of W can be suppressed to a remarkably low level.

Figure 46:
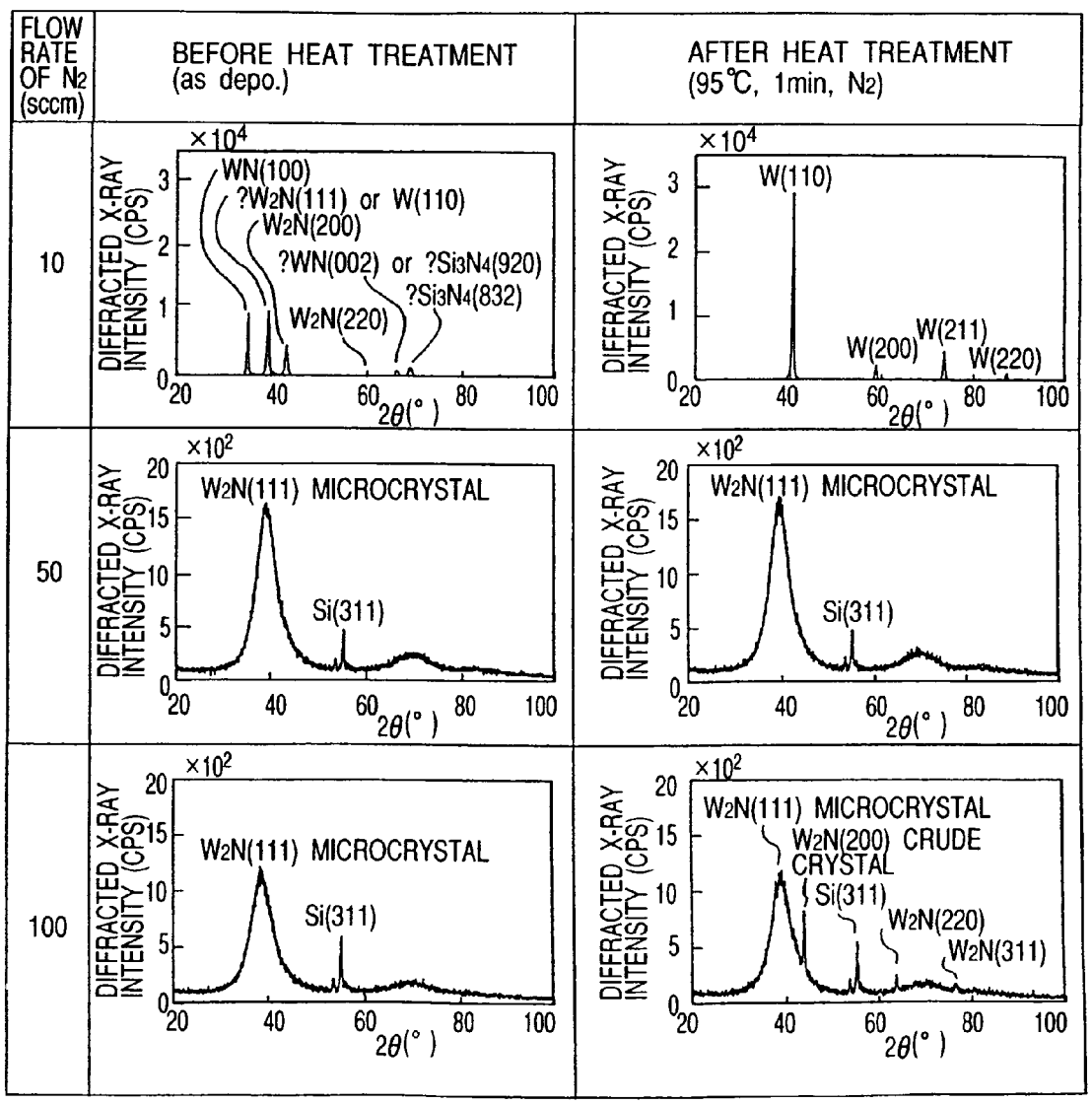
FIG. 46 is a graph showing the investigation results, by X-ray diffraction, of the relationship between a nitrogen flow rate and the crystal structure of an $WN_X$ film upon formation of the $WN_X$ film constituting a part of a gate electrode.

FIG. 46 is a graph showing the investigation results, by X-ray diffraction, of the relationship between a nitrogen flow rate and the crystal structure of the $WN_X$ film 24 upon formation of the $WN_X$ film 24 constituting a part of each of the gate electrodes 7A, 7B and 7C just after the formation of the $WN_X$ film 24 and after 1 minute heat treatment in a nitrogen gas of 950° C. As illustrated, when the nitrogen flow rate upon formation of the $WN_X$ film 24 is 10 sccm, the $WN_X$ film 24 loses its function as a barrier layer because nitrogen is released therefrom during the high temperature heat treatment and the film becomes a W film.

FIG. 47 is a graph of a film stress measured when the $WN_X$ film is heat treated at various temperatures at varied nitrogen gas flow rates while keeping the flow rate of an argon gas at a predetermined value (40 sccm), in which (a) is a film stress when the film is formed at a substrate temperature of 400° C., and (b) is a film stress when the film is formed at a substrate temperature of 200° C. As can be seen from the diagrams, when the nitrogen flow rate upon formation of the $WN_X$ film is small, nitrogen is released from the resulting film by the subsequent heat treatment and film shrinkage occurs, resulting in an increase in film stress.

Figure 48:
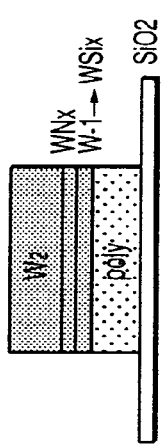
FIG. 48 is a graph illustrating the investigation results of the relationship between breakdown voltage of the gate electrode including an $WN_X$ film formed at varied flow rate ratios of a nitrogen gas to an argon gas and contact resistance on the $WN_X$ film/polycrystalline film interface.

FIG. 48 is a graph illustrating the investigation results of the relationship between breakdown voltage of the gate electrode including the $WN_X$ film formed at varied flow rate ratios of a nitrogen gas to an argon gas and contact resistance on the interface between the $WN_X$ film/polycrystalline film. As is apparent from the diagram, in the case of the $WN_X$ film formed under the conditions of a low flow rate ratio of a nitrogen gas, the breakdown voltage of the gate electrode lowers, leading to an increase in the contact resistance on the interface of the $WN_X$ film/polycrystalline silicon film.

According to this Embodiment in which film formation is conducted in an atmosphere permitting incorporation of a high concentration nitrogen in the $WN_X$ film 24, the $WN_X$ film 24 does not lose its function as a barrier layer owing to N remaining in the $WN_X$ film even after the heat treatment. In addition, by interposing the amorphous silicon film 34a between the $WN_X$ film 24 and polycrystalline silicon films 14n and 14p, the formation of a high resistance layer, which will otherwise occur due to the contact between the $WN_X$ film 24 and a markedly thin natural oxide film appearing on the surfaces of the polycrystalline silicon films 14n and 14p, can be inhibited. After the heat treatment step, the amorphous silicon film 34a becomes a polycrystalline film having a smaller average crystal size than the polycrystalline silicon films 14n and 14p which lie thereunder.

By the process described above, contact resistance on the interface between the $WN_X$ film 24 constituting the gate electrodes 7A, 7D and 7E and polycrystalline silicon films 14n and 14p can be reduced from 5 k$\Omega$/$\mu$m$^2$ to 10 k$\Omega$/$\mu$m$^2$, which is the contact resistance before the countermeasure is taken, to 1 k$\Omega$/$\mu$m$^2$.

Contamination of the substrate 1 by W oxides can be suppressed to an extremely low level by conducting the re-oxidation treatment of the gate insulating film 6, washing treatment, and deposition of the silicon nitride film in similar manners to those of Embodiment 1, resulting in a marked improvement in the refresh time of DRAM.

Embodiment 3

In Embodiment 2, by interposing the amorphous silicon film 34a between the $WN_X$ film 24 and polycrystalline silicon films 14n and 14p, contact resistance between the $WN_X$ film 24 and the polycrystalline silicon films 14n and 14p was reduced. In this Embodiment, on the other hand, by interposing a thin W film 62 between the $WN_X$ film 24 and polycrystalline silicon films 14n and 14p, contact resistance between the $WN_X$ film 24 and the polycrystalline silicon films 14n and 14p is reduced.

Figure 49:
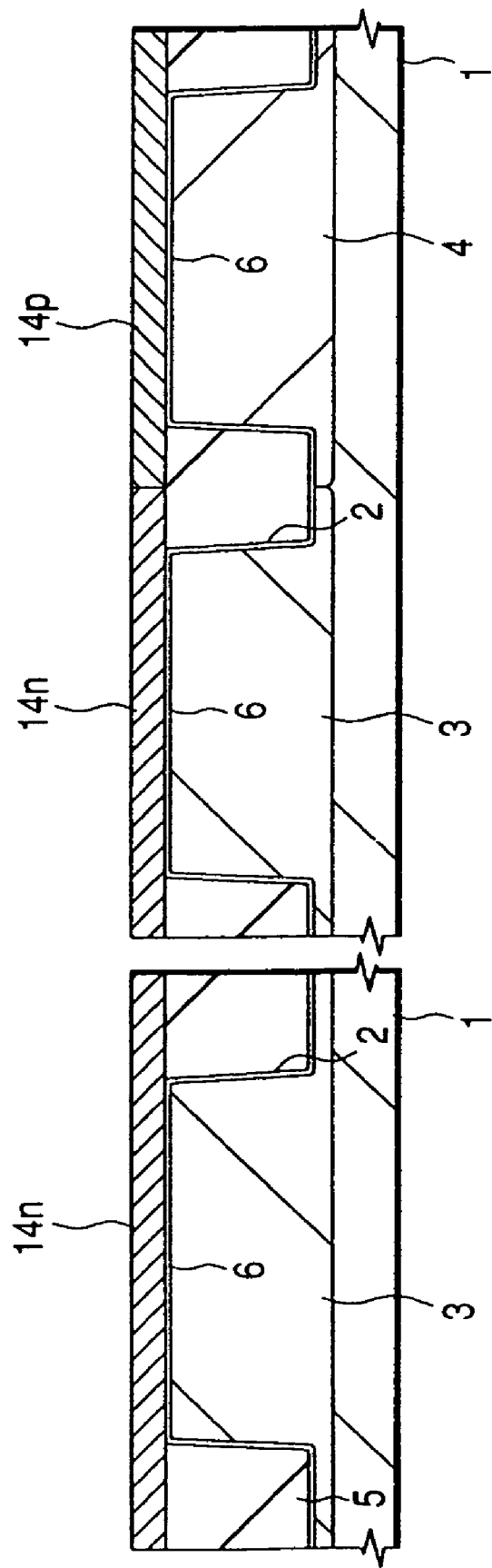
FIG. 49 is a fragmentary cross-sectional view of a semiconductor substrate illustrating a manufacturing process of a semiconductor integrated circuit device according to a further embodiment of the present invention.

A process of this reduction will next be described. First, as illustrated in FIG. 49, the n type polycrystalline silicon film 14n is formed over the gate insulating film 6 in the n-channel type MISFET formation region, while the p-type polycrystalline silicon film 14p is formed over the gate insulating film 6 in the p-channel type MISFET formation region. Steps up to the formation of these polycrystalline silicon films are identical to those shown in FIGS. 38 to 42 of Embodiment 2.

Figure 50:
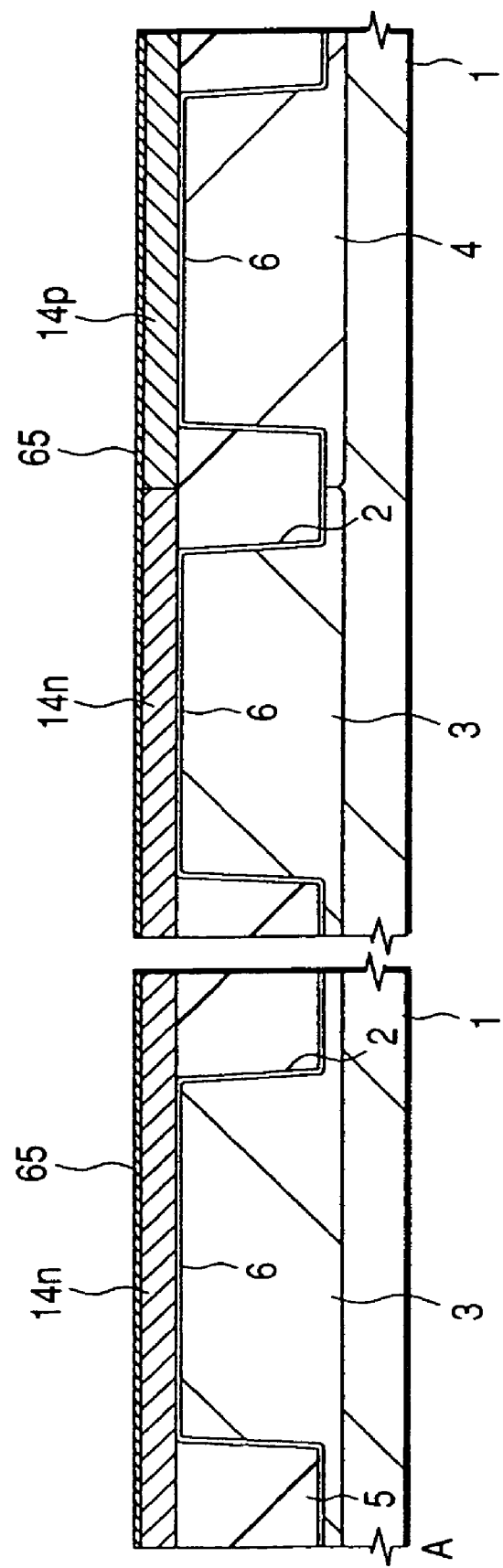
FIG. 50 is a fragmentary cross-sectional view of a semiconductor substrate illustrating the manufacturing process of the semiconductor integrated circuit device according to the further embodiment of the present invention.

After washing of the surfaces of the polycrystalline silicon films 14n and 14p with hydrofluoric acid, a W film 65 is deposited over the polycrystalline silicon films 14n and 14p as illustrated in FIG. 50. The W film 65 is deposited, for example, by sputtering to give a film thickness of about 5 nm.

Figure 51:
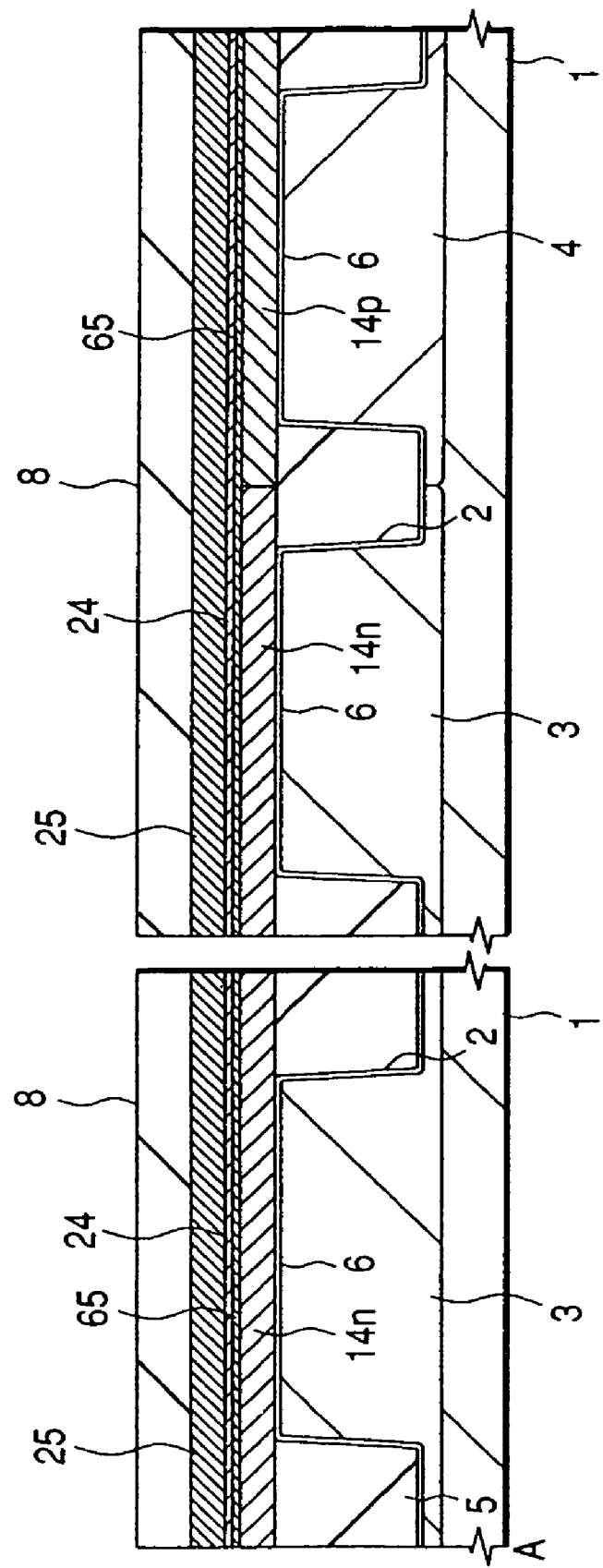
FIG. 51 is a fragmentary cross-sectional view of a semiconductor substrate illustrating the manufacturing process of the semiconductor integrated circuit device according to the further embodiment of the present invention.

As illustrated in FIG. 51, a $WN_X$ film 24, W film 25 and silicon nitride film 8 are deposited successively over the W film 65 in similar manners to those employed in Embodiment 2. The $WN_X$ film 24, W film 25 and silicon nitride film 8 are formed to give a film thickness of about 5 nm to 10 nm, about 70 nm to 80 nm, and about 160 nm, respectively. Over the $WN_X$ film 24, an Mo film may be deposited instead of the W film 25. The $WN_X$ film 24 is formed in an atmosphere permitting incorporation of a high concentration nitrogen in the film as in Embodiment 2 and the nitrogen content upon element completion is set at 7% to 10% or greater, preferably 13% or greater, more preferably 18% or greater. Steps thereafter are identical to those of Embodiment 2.

By interposing the W film 62 between the $WN_X$ film 24 and polycrystalline silicon films 14n and 14p, reaction occurs between the W film 62 and the polycrystalline silicon films 14n and 14p during the heat treatment conducted later, whereby a conductive layer composed mainly of W silicides ($WSi_X$) is formed. This makes it possible to suppress the formation of a high resistance layer attributable to the contact between the $WN_X$ film 24 and a natural oxide film appearing on the surfaces of the polycrystalline silicon films 14n and 14p, leading to a substantially similar effect to that of Embodiment 2.

By such a process, the contact resistance on the interface between the $WN_X$ film 24 constituting the gate electrodes 7A, 7D and 7E and the polycrystalline silicon films 14n and 14p can be reduced from 5 k$\Omega$/$\mu$m$^2$ to 10 k$\Omega$/$\mu$m$^2$, which is a value before the countermeasure is taken, to 1 k$\Omega$/$\mu$m$^2$.

In addition, contamination of the substrate 1 by the oxides of W can be suppressed to an extremely low level by conducting the re-oxidation treatment of the gate insulating film 6, washing treatment and deposition of the silicon nitride film in similar manners to those of Embodiment 1, resulting in a marked improvement in the refresh time of the DRAM.

In this Embodiment, a conductive layer composed mainly of W silicides is formed by interposing the W film 62 between the $WN_X$ film 24 and polycrystalline silicon films 14n and 14p, and reacting the W film 62 with the polycrystalline silicon films 14n and 14p during the heat treatment conducted later. Alternatively, it is possible to form a thin W silicide film over the polycrystalline silicon films 14n and 14p, and then deposit the $WN_X$ film 24 and W film 25 over the W silicide film. This makes it possible to prevent such an inconvenience as formation of a high resistance silicon nitride layer which will otherwise occur owing to diffusion of nitrogen in the $WN_X$ film 24 into the interface with the polycrystalline silicon films 14n and 14p. When a W silicide layer is formed by reacting the W film 62 with the polycrystalline silicon films 14n and 14p during heat treatment, the reaction occurs locally and happens to lower the gate breakdown voltage. Such a local reaction hardly occurs when the W silicide film is deposited in advance. The thickness of this W silicide film may fall within a range of from 5 nm to 20 nm. In $WSi_X$, X preferably stands for about 2.0 to 2.7.

Embodiment 4

In this Embodiment 4, the present invention is applied to a CMOS logic LSI whose circuit is constituted of an n-channel type MISFET and a p-channel type MISFET. One example of its manufacturing process will next be described in the order of steps based on FIGS. 52 to 56.

Figure 52:
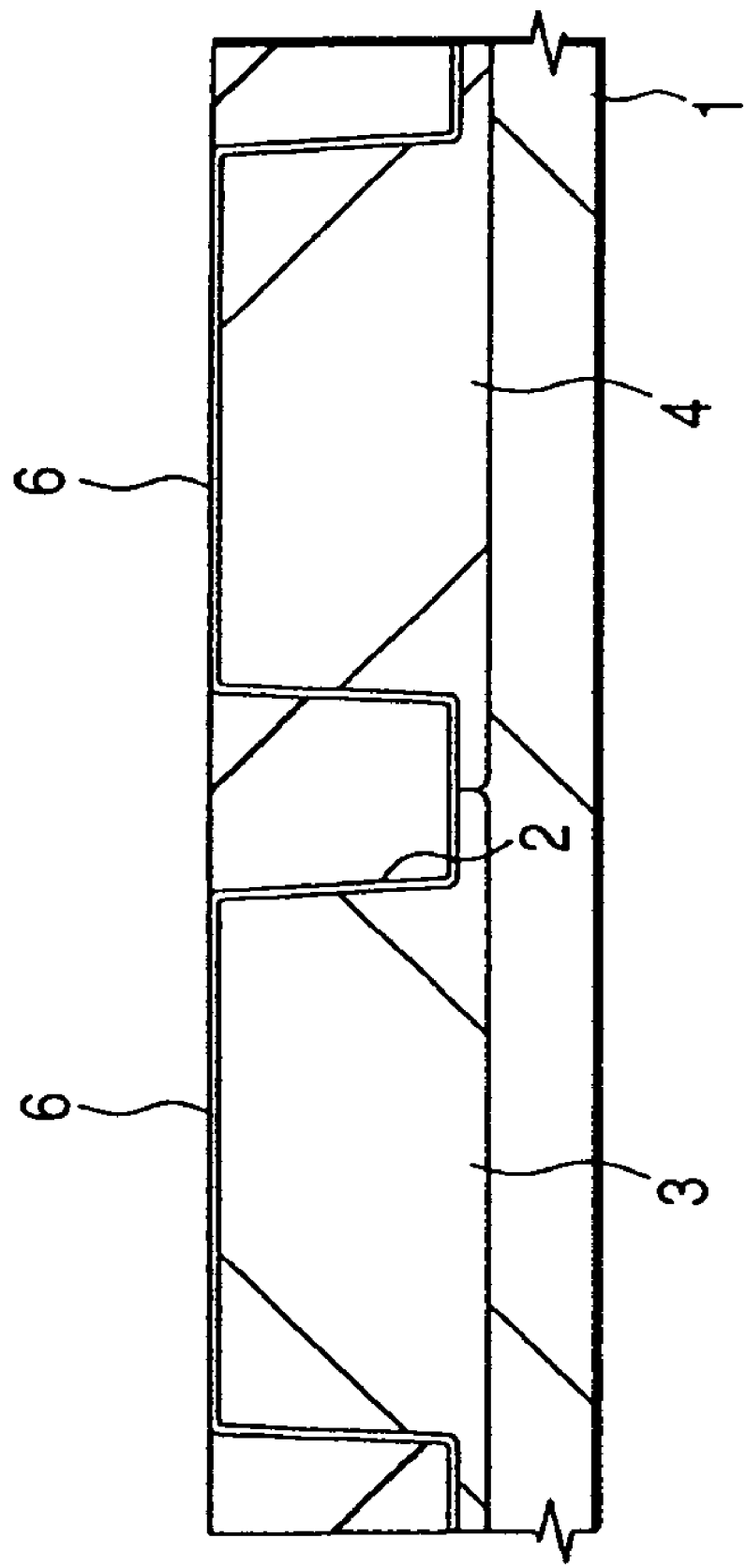
FIG. 52 is a fragmentary cross-sectional view of a semiconductor substrate illustrating a manufacturing process of a semiconductor integrated circuit device according to a still further embodiment of the present invention.

First, as illustrated in FIG. 52, a substrate 1 made of, for example, p type single crystal silicon is prepared. In a similar manner to that employed in Embodiment 1, an isolation trench 2, p type well 3, n type well 4 and gate insulating film 6 are formed successively over the main surface of the substrate 1.

Figure 53:
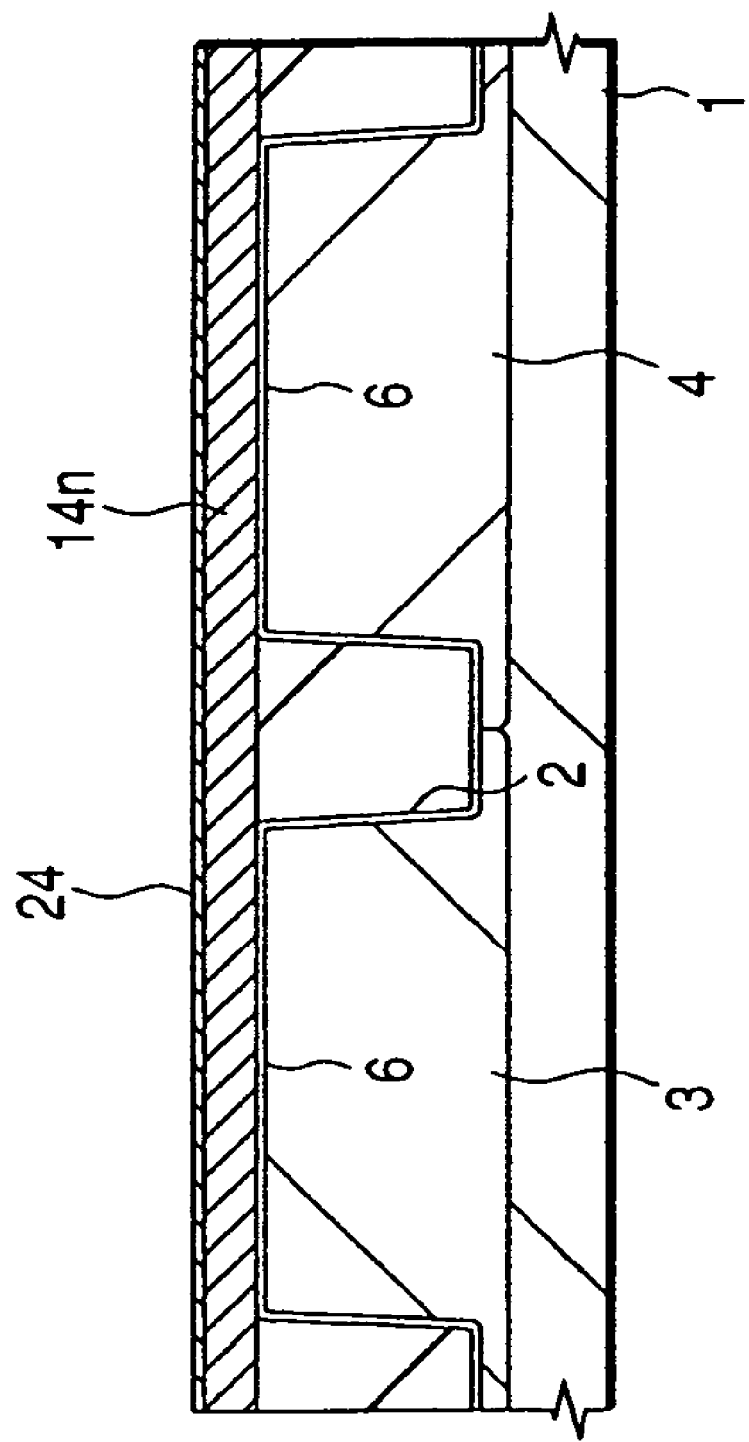
FIG. 53 is a fragmentary cross-sectional view of a semiconductor substrate illustrating the manufacturing process of the semiconductor integrated circuit device according to the still further embodiment of the present invention.

As illustrated in FIG. 53, a low-resistance n type polycrystalline silicon film 14 doped with at least $1.0 \times 10^{19}$ cm$^3$ of P (phosphorus) is deposited over the gate insulating film 6. The surface of the polycrystalline silicon film 14n is washed with hydrofluoric acid, followed by deposition of a WN$_X$ film 24 of about 5 nm to 10 nm thickness over the polycrystalline silicon film 14n by sputtering.

As in Embodiment 2, the WN$_X$ film 24 is formed in an atmosphere permitting incorporation of a high concentration nitrogen in the film and its nitrogen content upon element completion is set at 7% to 10% or greater, preferably 13% or greater, more preferably 18% or greater. The WN$_X$ film 24 is deposited so that its remaining thickness upon element completion will become at least 1 nm.

As in Embodiment 3, it is also possible to form a W film 62 between the WN$_X$ film 24 and polycrystalline silicon film 14n in order to prevent the formation of a high resistance layer attributable to the contact between the WN$_X$ film 24 and a natural oxide film appearing on the surface of the polycrystalline silicon film 14n.

As illustrated in FIG. 54, P (phosphorus) is ion-implanted in the main surface of the substrate 1. This ion implantation is conducted with an energy so that P penetrates through the WN$_X$ film 24 and reach in a region of 10 nm or less deep from the surface of the polycrystalline silicon film 14n. When the thickness of the WN$_X$ film 24 is about 3 nm to 15 nm, the implantation energy of P is set at 2 keV to 10 keV.

This ion implantation is conducted at a dose capable of adjusting the concentration of P in the surface region of the polycrystalline silicon film 14n to $5 \times 10^{19}$ atoms/cm$^3$ or greater. After ion implantation, the impurity (P) in the polycrystalline silicon film 14n may be electrically activated by lamp annealing for about 1 minute in a nitrogen atmosphere of about 950° C. The impurity (P) in the polycrystalline silicon film 14n will be electrically activated in the heat treatment step which will be conducted later so that heat treatment here may be omitted.

The ion implantation may be conducted after deposition of the polycrystalline silicon film 14n but prior to the deposition of the WN$_X$ film 24. When the W film 62 is formed between the WN$_X$ film 24 and polycrystalline silicon film 14n, this ion implantation may be conducted after the formation of the W film, followed by deposition of the WN$_X$ film 24 over the W film.

Figure 55:
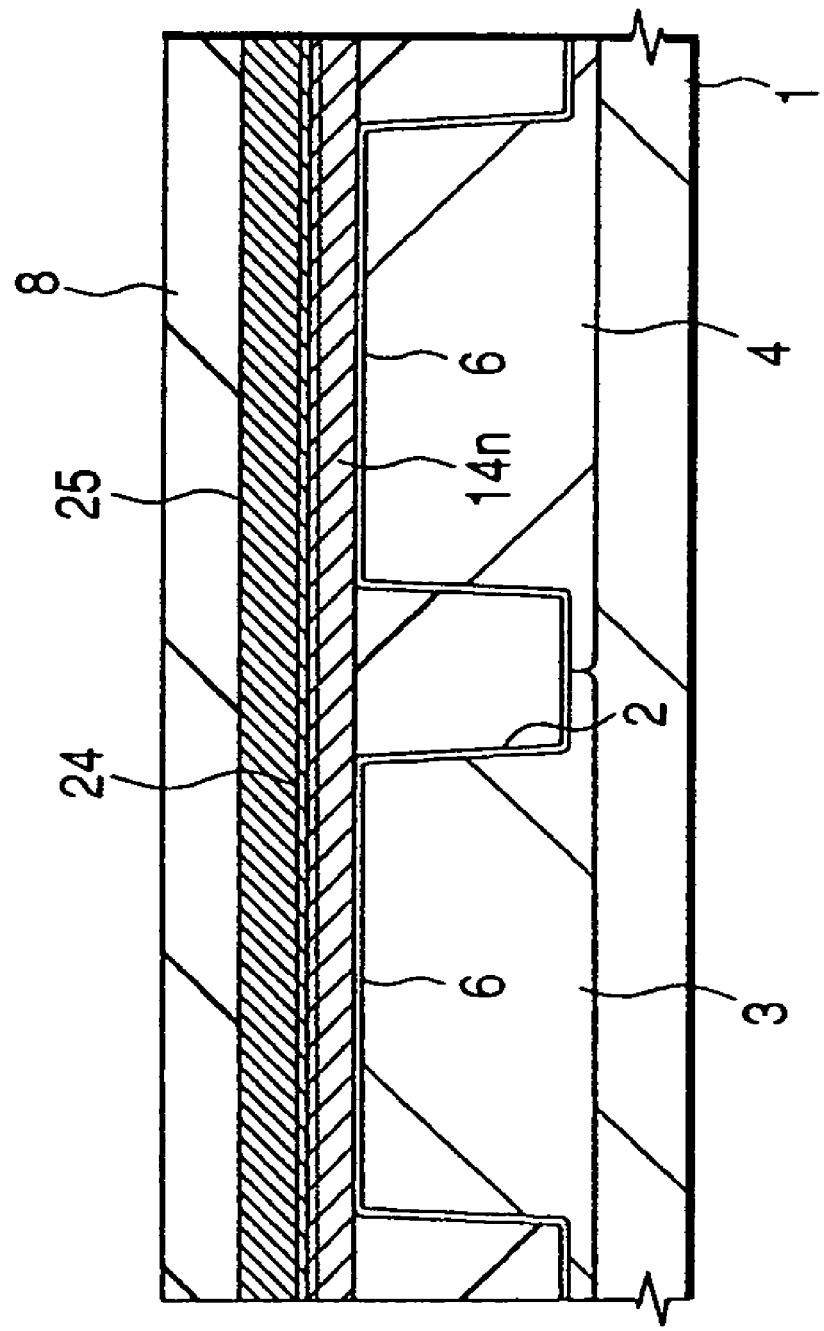
FIG. 55 is a fragmentary cross-sectional view of a semiconductor substrate illustrating the manufacturing process of the semiconductor integrated circuit device according to the still further embodiment of the present invention.

As illustrated in FIG. 55, after deposition of the W film 25 of about 70 nm thickness over the WN$_X$ film 24 by sputtering, a silicon nitride film 8 of about 160 nm thickness is deposited over the W film 25 by CVD. Instead of the W film 25, an Mo film may be deposited over the WN$_X$ film 24. It is also possible to lower the resistance of the surface region of the polycrystalline silicon film 14n by carrying out ion implantation again into the main surface of the wafer 1, thereby doping P in the polycrystalline silicon film 14n via the W film 25 and WN$_X$ film 24.

Figure 56:
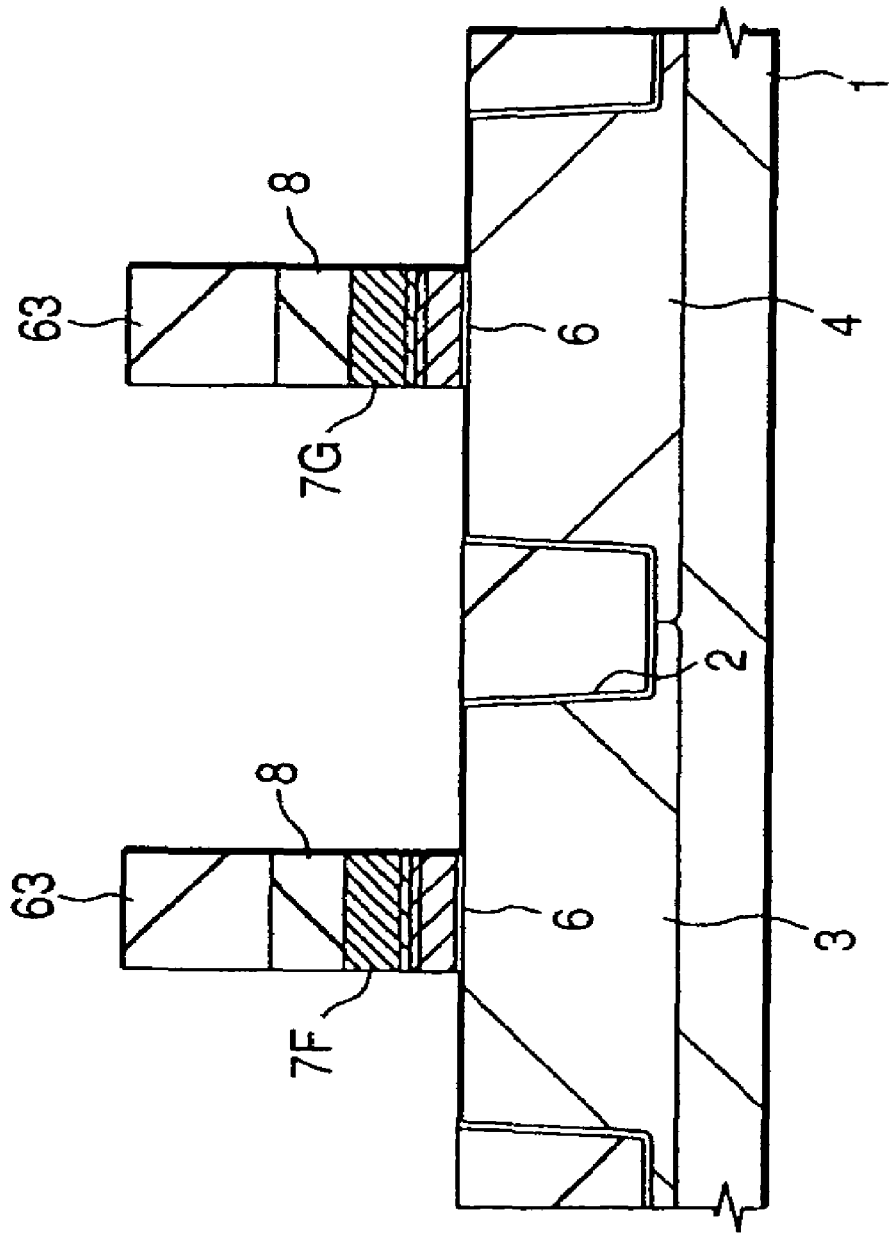
FIG. 56 is a fragmentary cross-sectional view of a semiconductor substrate illustrating the manufacturing process of the semiconductor integrated circuit device according to the still further embodiment of the present invention.

As illustrated in FIG. 56, using a photoresist film 63 formed over the silicon nitride film 8 as a mask, the silicon nitride film 8, W film 24, WN$_X$ film 25 and polycrystalline silicon film 14n are dry etched successively, whereby a gate electrode 7F of the n-channel type MISFET is formed over the p type well 3 and a gate electrode 7G of the p-channel type MISFET is formed over the n type well 4.

In order to suppress the contamination of the substrate 1 by the oxides of W to a remarkably low level, the re-oxidation treatment of the dry-etched gate insulating film 6, subsequent washing treatment and deposition of a silicon nitride film are then carried out in similar manners to those of Embodiment 1.

In this Embodiment, the polycrystalline silicon film constituting a part of each of the gate electrodes 7F and 7G was formed as n type, but it is also possible to constitute the polycrystalline silicon film constituting a part of the gate electrode 7F of the n-channel type MISFET as an n type and the polycrystalline silicon film constituting a part of the gate electrode 7G of the p-channel type MISFET as a p type in order to make both of the n-channel type MISFET and p-channel type MISFET as surface channel type. In this case, penetration of B due to the channeling phenomenon can be prevented by depositing a non-doped amorphous silicon film over the gate insulating film 6 and carrying out ion implantation, with a photoresist film as a mask, to introduce P into the amorphous silicon film of the n-channel type MISFET formation region and B in the amorphous silicon film of the p-channel type MISFET.

Embodiment 5

In Embodiment 4, the resistance of the surface of the polycrystalline silicon film 14n is lowered by ion implantation of impurities. The resistance lowering of the surface region of the polycrystalline silicon film 14n can also be effected in the following manner.

Figure 57:
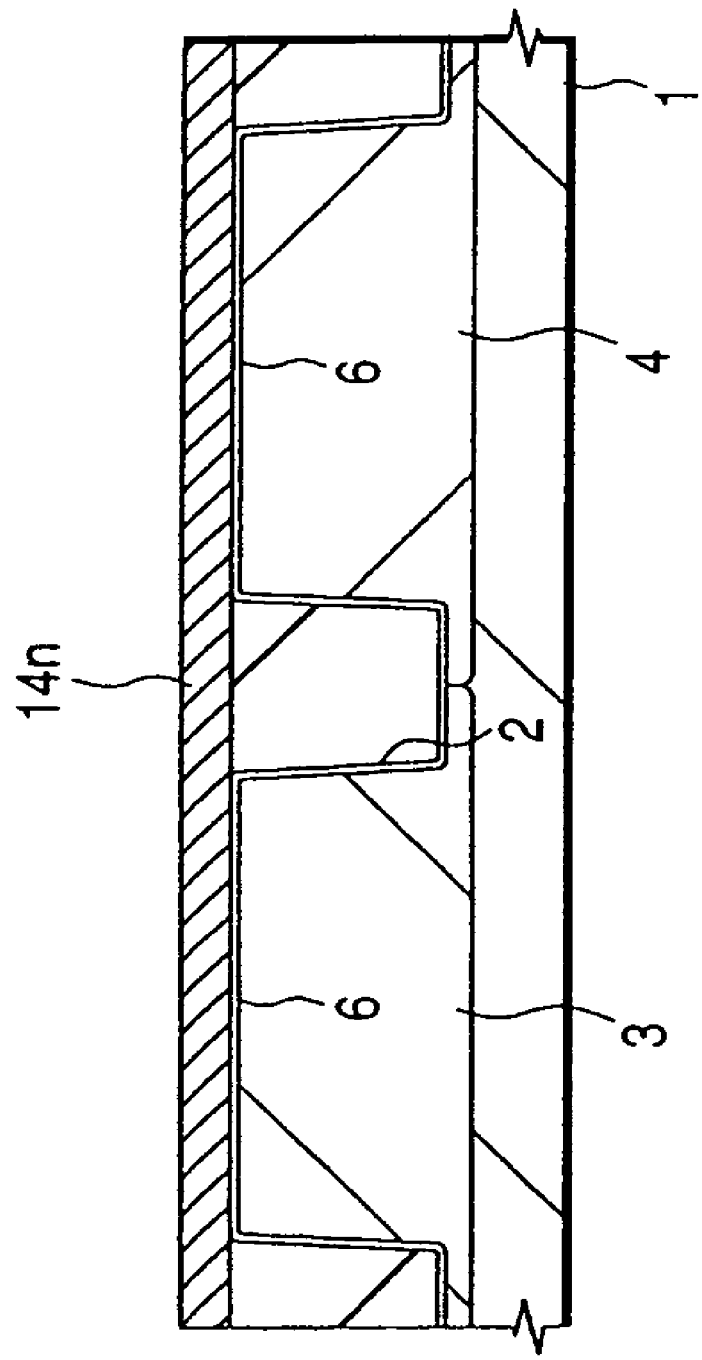
FIG. 57 is a fragmentary cross-sectional view of a semiconductor substrate illustrating a manufacturing process of a semiconductor integrated circuit device according to a still further embodiment of the present invention.

As illustrated in FIG. 57, over the main surface of a substrate 1 made of, for example, p type single crystal silicon, isolation trench 2, p type well 3, n type well 4 and gate insulating film 6 are formed successively. A low-resistance n type polycrystalline silicon film 14n doped with at least $1.0 \times 10^{19}$ cm$^3$ of P (phosphorus) is deposited over the gate insulating film 6. Steps up to the formation of this polycrystalline silicon film is identical to those of Embodiment 4.

Figure 58:
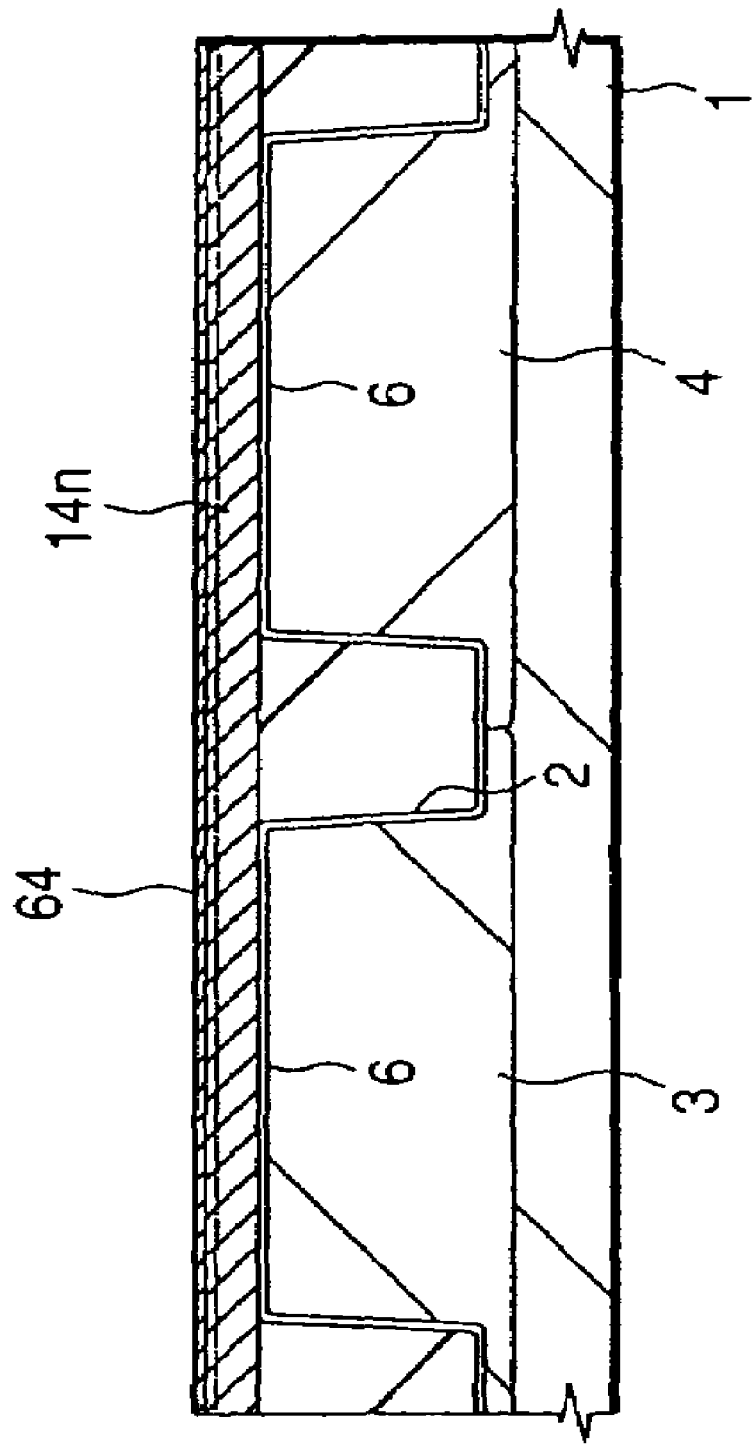
FIG. 58 is a fragmentary cross-sectional view of a semiconductor substrate illustrating the manufacturing process of the semiconductor integrated circuit device according to the still further embodiment of the present invention.

As illustrated in FIG. 58, after deposition of a low-resistance n type polycrystalline silicon film 64 doped with at least $5.0 \times 10^{19}$ cm$^3$ of P (phosphorus) over the polycrystalline silicon film 14n by CVD, the substrate 1 is heat treated to diffuse P in the n type polycrystalline silicon film 64 into the surface region not deeper than 10 nm from the surface of the polycrystalline silicon film 14n. By this treatment, the P concentration in this surface region is adjusted to $5 \times 10^{19}$ cm$^3$ or greater. After this heat diffusion treatment, P in the polycrystalline silicon film 14n may be electrically activated by lamp annealing for about 1 minute in a nitrogen atmosphere of about 950° C. The P in the polycrystalline silicon film 14n will however be electrically activated in the heat treatment step which will be conducted later so that heat treatment here may be omitted.

Figure 59:
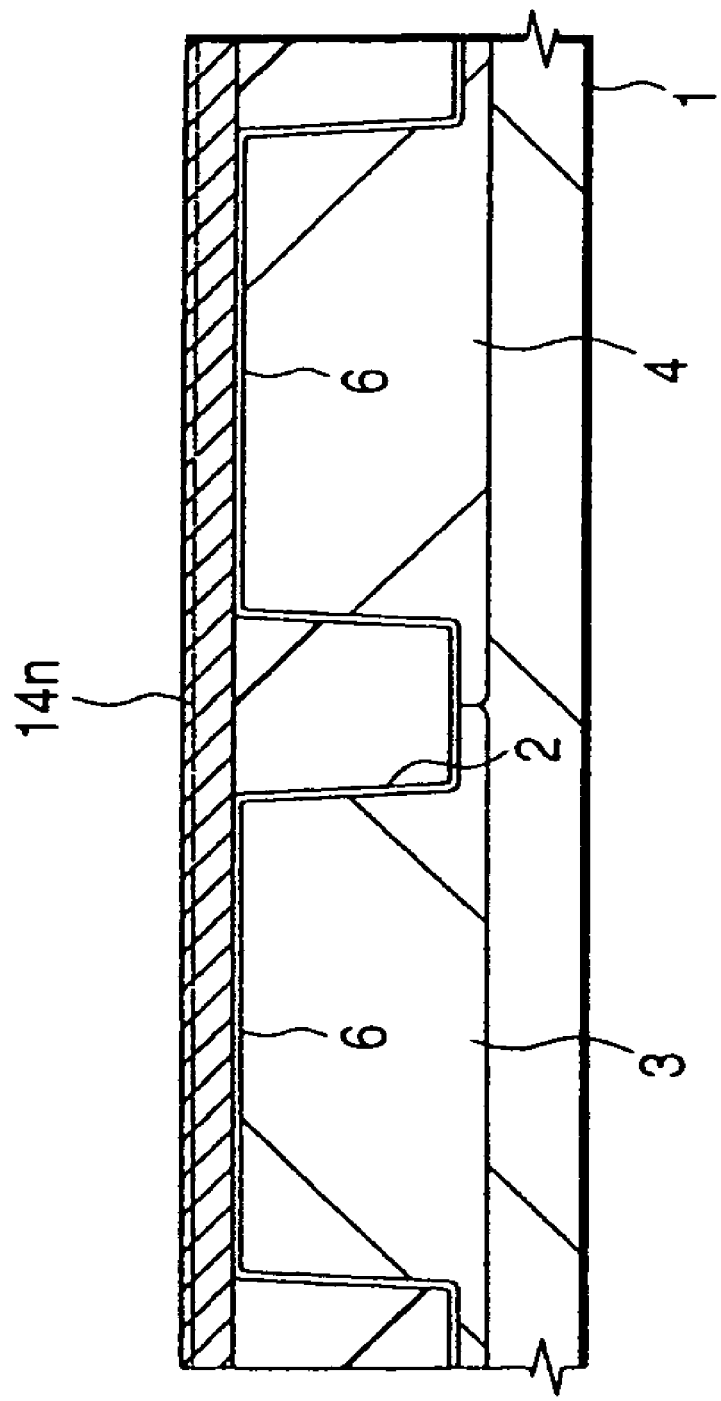
FIG. 59 is a fragmentary cross-sectional view of a semiconductor substrate illustrating the manufacturing process of the semiconductor integrated circuit device according to the still further embodiment of the present invention.

After the n type polycrystalline silicon film 64 is removed by dry etching as illustrated in FIG. 59, the surface of the polycrystalline silicon film 14n exposed from the surface of the substrate 1 is washed with hydrofluoric acid.

Figure 60:
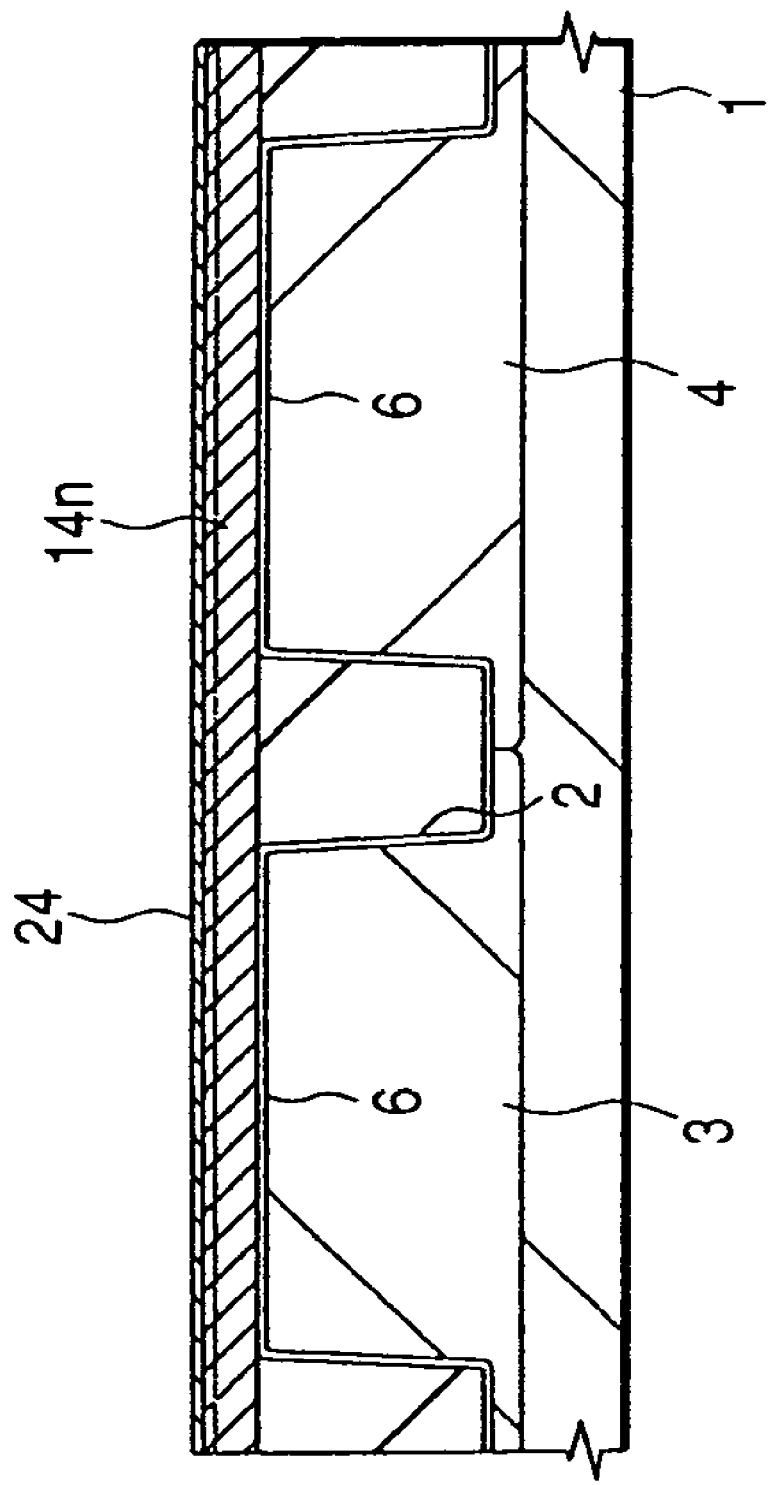
FIG. 60 is a fragmentary cross-sectional view of a semiconductor substrate illustrating the manufacturing process of the semiconductor integrated circuit device according to the still further embodiment of the present invention.

As illustrated in FIG. 60, a WN$_X$ film 24 of about 5 nm to 10 nm thickness is deposited over the polycrystalline silicon film 14n by sputtering. As in Embodiment 4, the WN$_X$ film 24 is formed in an atmosphere permitting incorporation of a high concentration nitrogen in the film so that the film will have a nitrogen content of 7% to 10% or greater, preferably 13% or greater, more preferably 18% or greater upon element completion. The WN$_X$ film 24 is deposited so that its remaining thickness upon element completion becomes at least 1 nm.

As in Embodiment 3, a W film may be formed between the WN$_X$ film 24 and polycrystalline silicon film 14n in order to prevent the formation of a high resistance layer attributable to the contact between the WN$_X$ film 24 and a natural oxide film appearing on the surface of the polycrystalline silicon film 14n.

Figure 61:
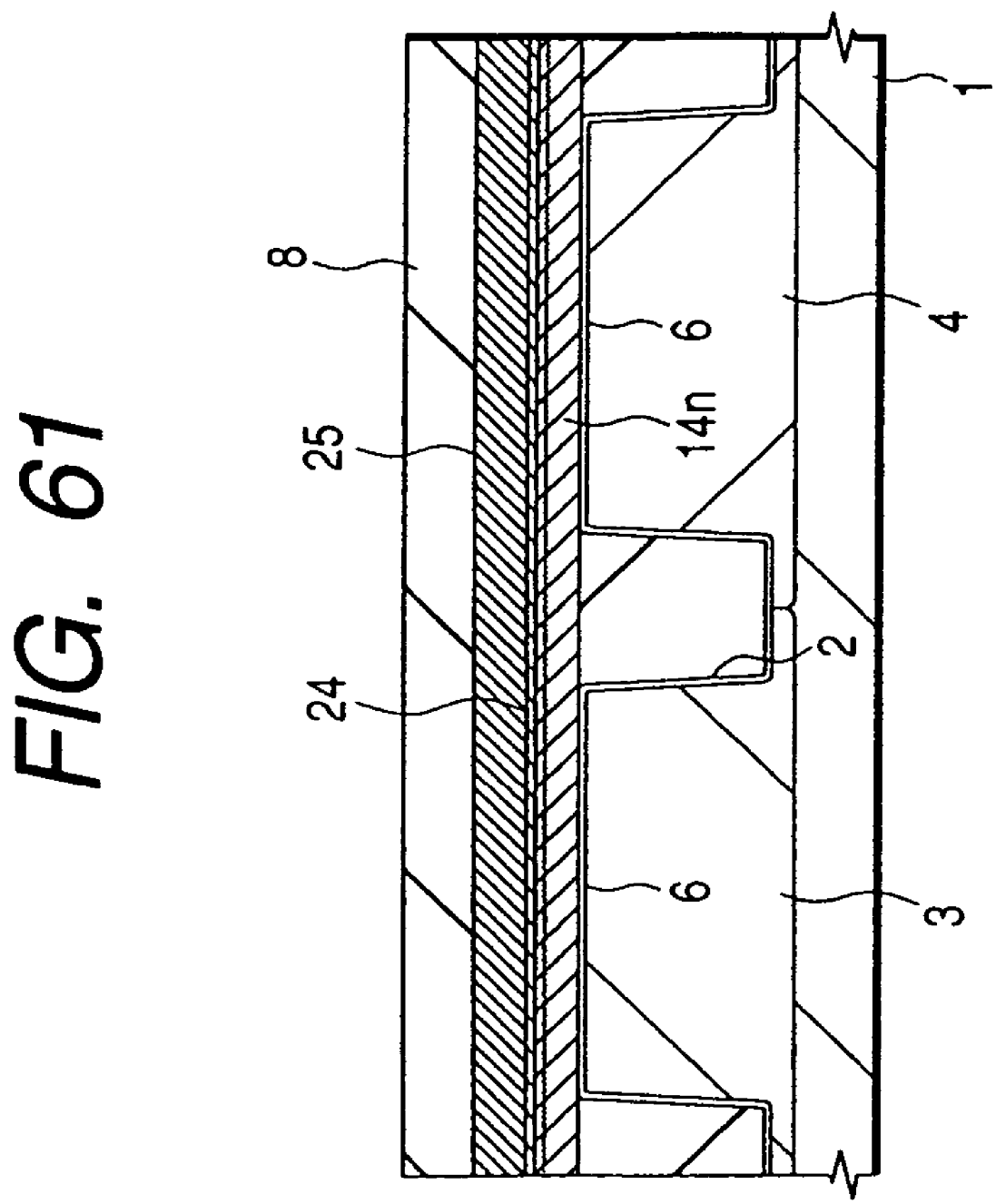
FIG. 61 is a fragmentary cross-sectional view of a semiconductor substrate illustrating the manufacturing process of the semiconductor integrated circuit device according to the still further embodiment of the present invention.

As illustrated in FIG. 61, a W film 25 of about 70 nm thickness is deposited over the WN$_X$ film 24 by sputtering, followed by deposition of a silicon nitride film 8 of about 160 nm thickness over the W film 25 by CVD.

Figure 62:
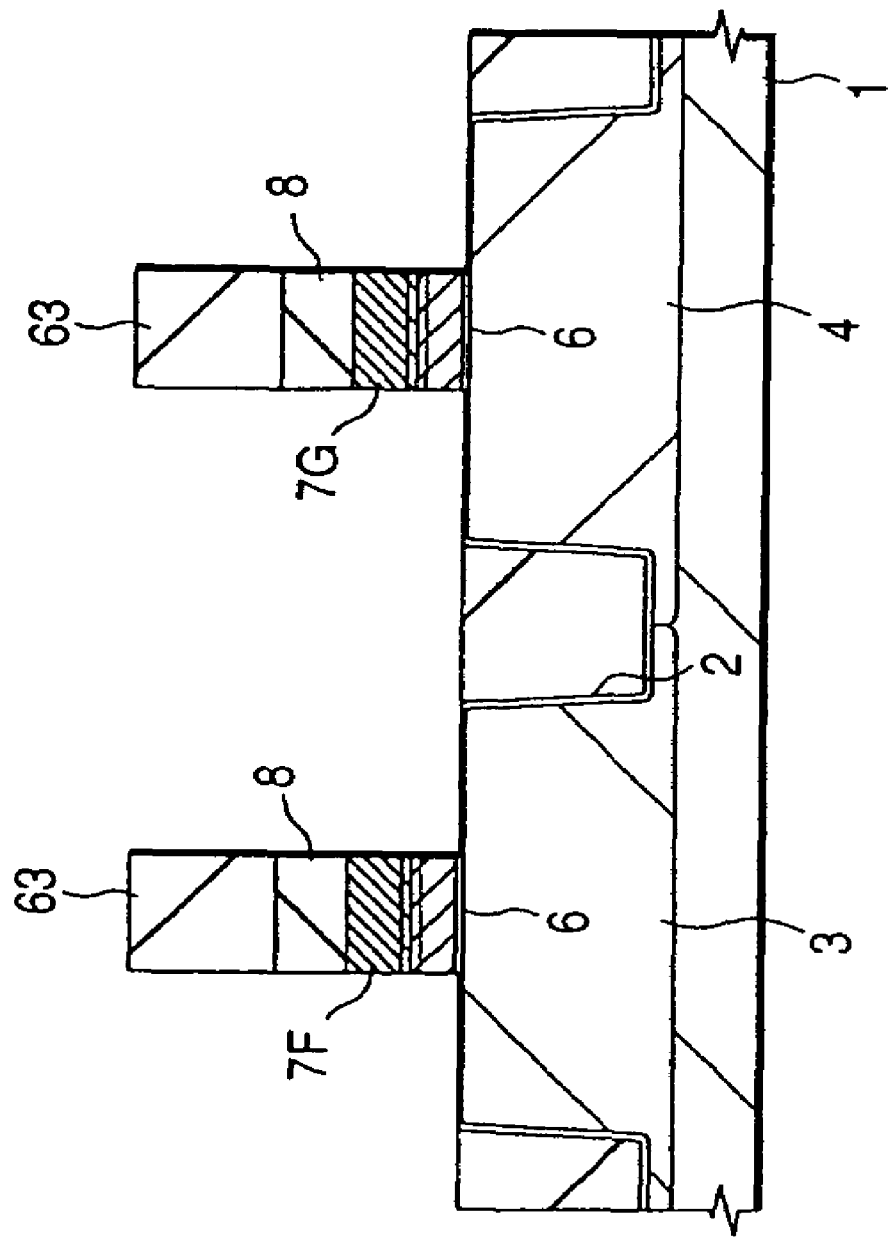
FIG. 62 is a fragmentary cross-sectional view of a semiconductor substrate illustrating the manufacturing process of the semiconductor integrated circuit device according to the still further embodiment of the present invention.

As illustrated in FIG. 62, using a photoresist film 63 formed over the silicon nitride film 8 as a mask, the silicon nitride film 8, W film 24, WN$_X$ film 25 and polycrystalline silicon film 14n are dry etched successively, whereby a gate electrode 7F of the n-channel type MISFET is formed over the p type well 3 and a gate electrode 7G of the p-channel type MISFET is formed over the n type well 4.

In order to suppress the contamination of the substrate 1 by the oxides of W to an extremely low level, the re-oxidation treatment of the dry-etched gate insulating film 6, subsequent washing treatment and deposition of a silicon nitride film are carried out in similar manners to those of Embodiment 1.

In this Embodiment, the resistance of the surface region of the polycrystalline silicon film 14n is lowered by diffusing thereinto P in the polycrystalline silicon film 64 deposited over the polycrystalline silicon film 14n. The resistance of the surface region of the polycrystalline silicon film 14n may be lowered, for example, by introducing P into the surface region of the polycrystalline silicon film 14n by ion implantation, forming an insulating film such as a silicon oxide film over the polycrystalline silicon film 14n, carrying out heat treatment to cause segregation, in the vicinity of the interface with the insulating film, of the P thus introduced into the surface region of the polycrystalline silicon film 14n, and then removing the insulating film. The insulating film is made of, for example, a silicon oxide film formed by thermal oxidation of the surface of the polycrystalline silicon film 14n or by deposition over the polycrystalline silicon film 14n by CVD, but it is not limited thereto.

Embodiment 6

In this Embodiment, the present invention is applied to a flash memory. One example of its manufacturing process will next be described in the order of steps based on FIGS. 63 to 76.

Figure 63:
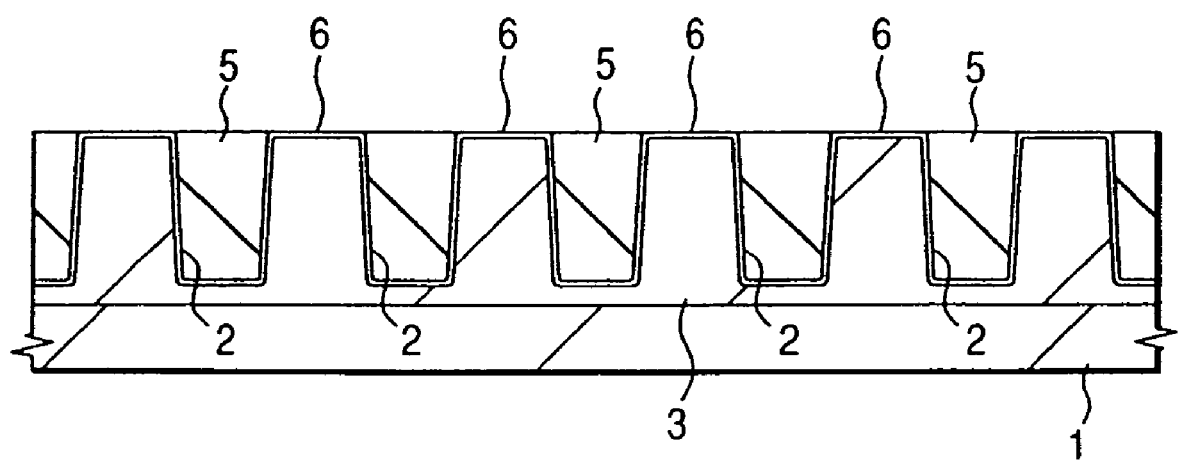
FIG. 63 is a fragmentary cross-sectional view of a semiconductor substrate illustrating a manufacturing process of a semiconductor integrated circuit device according to a still further embodiment of the present invention.
Figure 64:
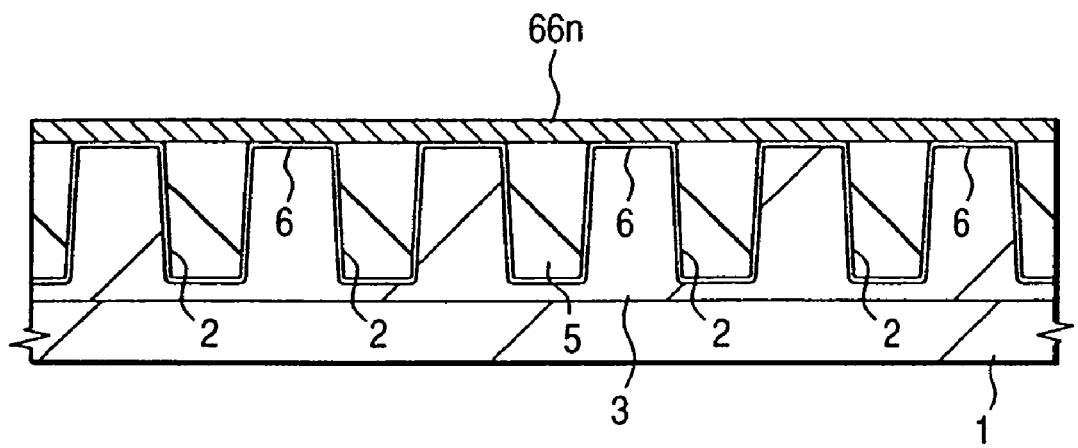
FIG. 64 is a fragmentary cross-sectional view of a semiconductor substrate illustrating the manufacturing process of the semiconductor integrated circuit device according to the still further embodiment of the present invention.
Figure 65:
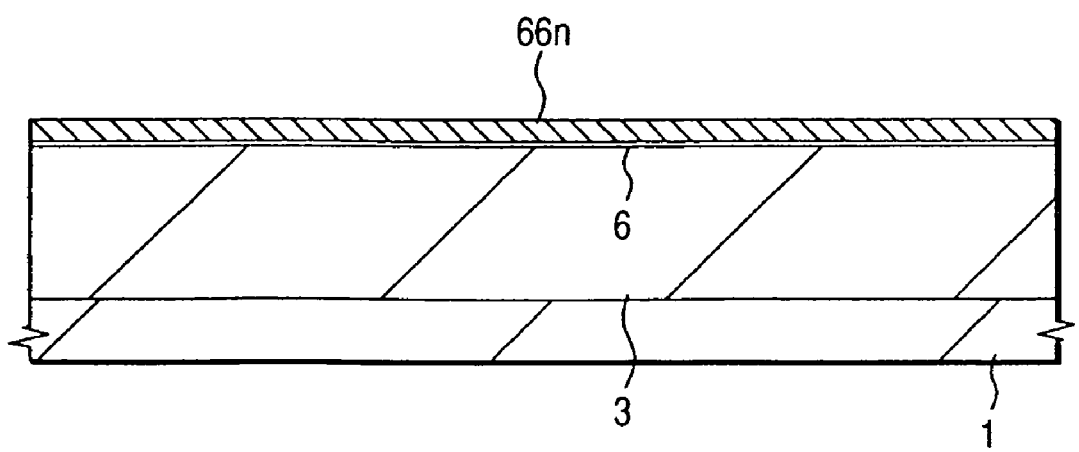
FIG. 65 is a fragmentary cross-sectional view of a semiconductor substrate illustrating the manufacturing process of the semiconductor integrated circuit device according to the still further embodiment of the present invention.

As illustrated in FIG. 63, an element isolation 2, p type well 3 and gate insulating film 6 are formed over the main surface of the substrate 1 in similar manners to those employed in Embodiment 1. As illustrated in FIGS. 64 and 65, an n type polycrystalline silicon film 66n of about 70 to 100 nm thickness is then deposited over the substrate 1 by CVD. Into the polycrystalline silicon film 66n, an n type impurity such as phosphorus (P) is doped during the deposition step of the film. Alternatively, after deposition of a non-doped polycrystalline silicon film, an n type impurity may be doped thereinto by ion implantation. The polycrystalline silicon film 66n is used as a floating gate electrode of the MISFET constituting the memory cell.

Figure 66:
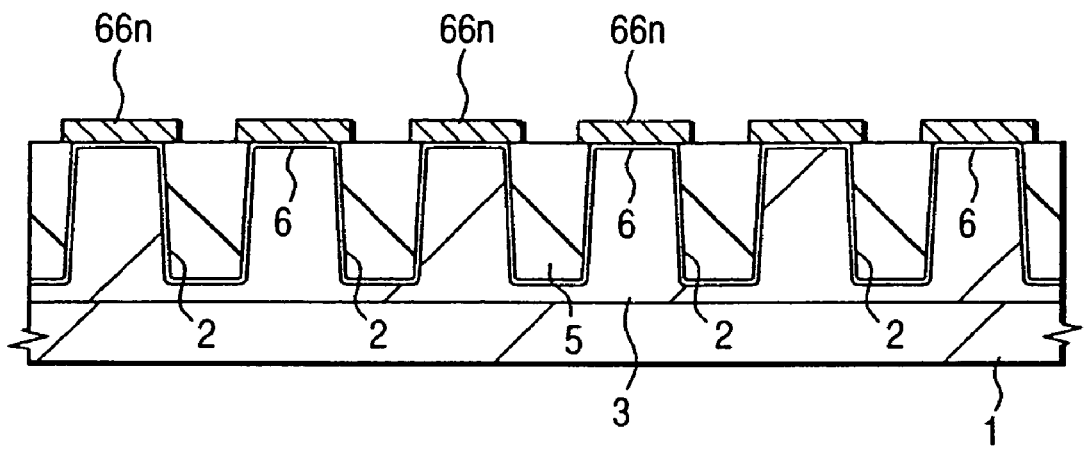
FIG. 66 is a fragmentary cross-sectional view of a semiconductor substrate illustrating the manufacturing process of the semiconductor integrated circuit device according to the still further embodiment of the present invention.
Figure 67:
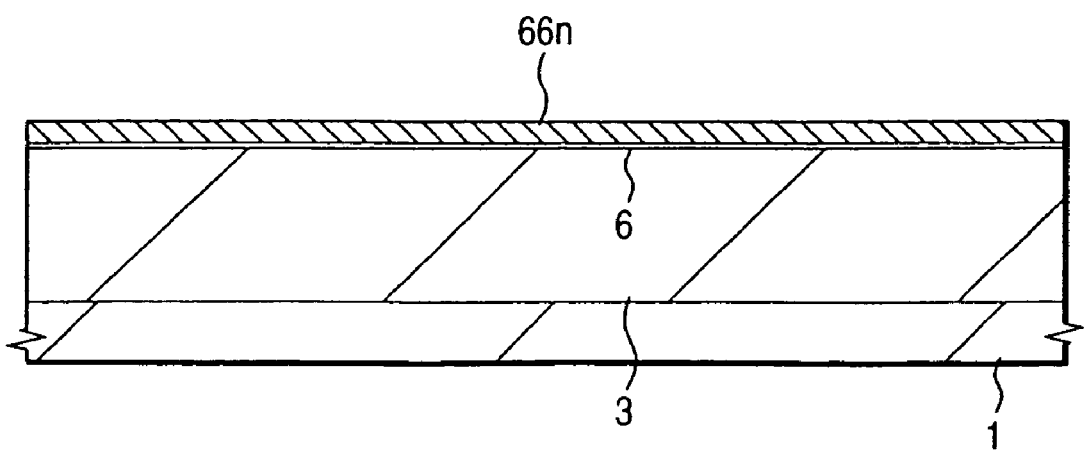
FIG. 67 is a fragmentary cross-sectional view of a semiconductor substrate illustrating the manufacturing process of the semiconductor integrated circuit device according to the still further embodiment of the present invention.

As illustrated in FIGS. 66 and 67, with a photoresist film as a mask, the polycrystalline silicon film 66n is dry etched, whereby the polycrystalline silicon film 66n having, over the active region L, a long strip-like plane pattern extending along the extending direction of the active region is formed.

Figure 68:
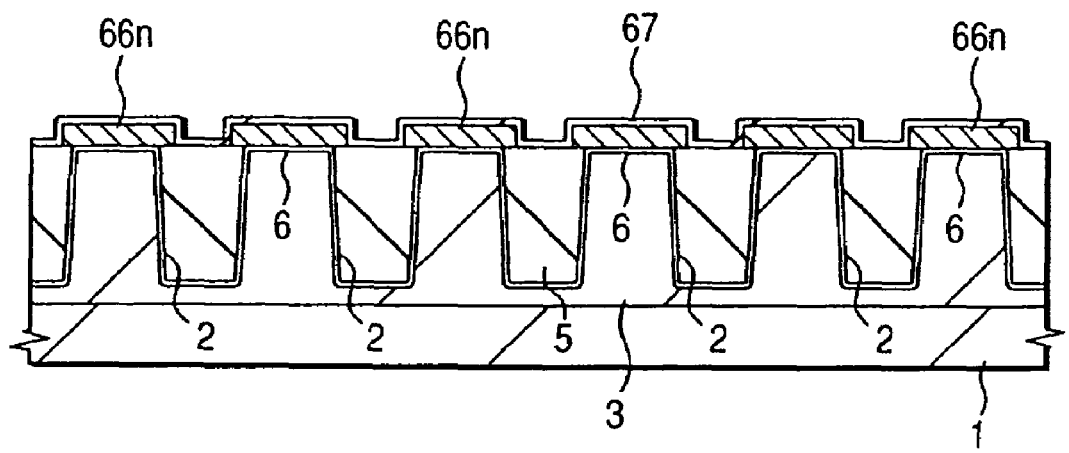
FIG. 68 is a fragmentary cross-sectional view of a semiconductor substrate illustrating the manufacturing process of the semiconductor integrated circuit device according to the still further embodiment of the present invention.
Figure 69:
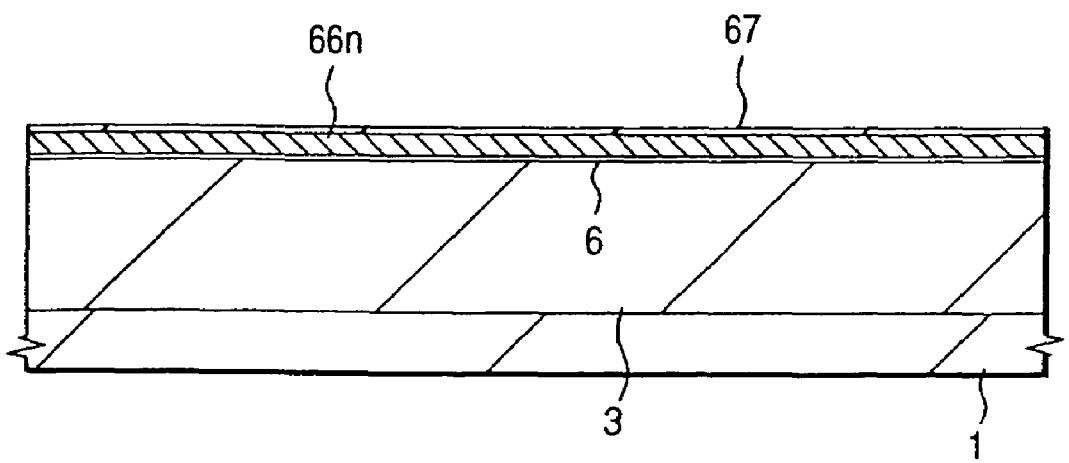
FIG. 69 is a fragmentary cross-sectional view of a semiconductor substrate illustrating the manufacturing process of the semiconductor integrated circuit device according to the still further embodiment of the present invention.

As illustrated in FIGS. 68 and 69, an ONO film 67 made of a silicon oxide film, a silicon nitride film and a silicon oxide film is formed over the substrate 1 having the polycrystalline silicon film 66n formed thereover. The ONO film 67 serves as a second gate insulating film of MISFET constituting the memory cell and it is formed, for example, by successively depositing, over the substrate 1, a 5 nm thick silicon oxide film, a 7 nm thick silicon nitride film and a 4 nm thick silicon oxide film by CVD.

Figure 70:
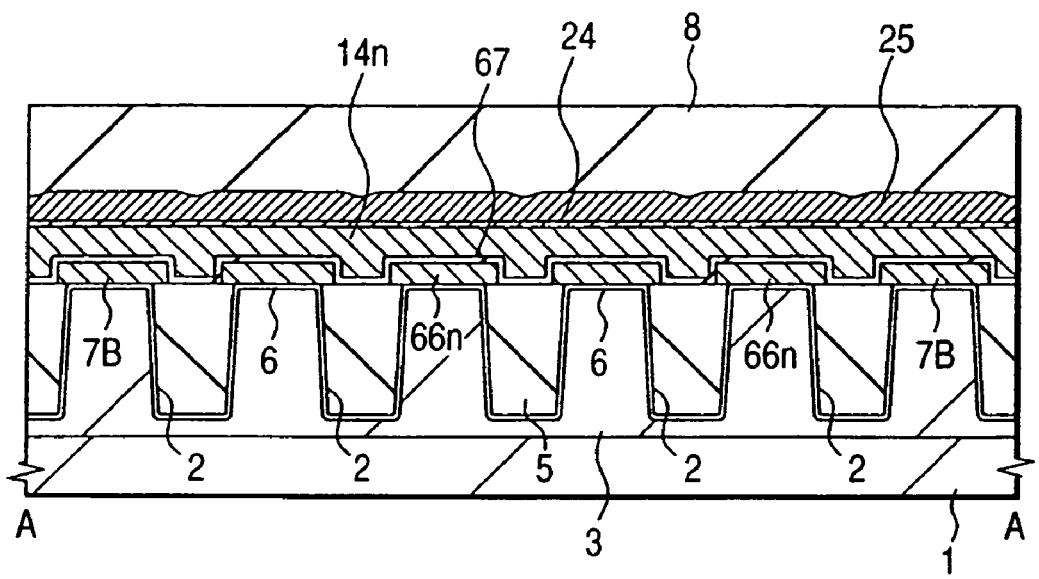
FIG. 70 is a fragmentary cross-sectional view of a semiconductor substrate illustrating the manufacturing process of the semiconductor integrated circuit device according to the still further embodiment of the present invention.
Figure 71:
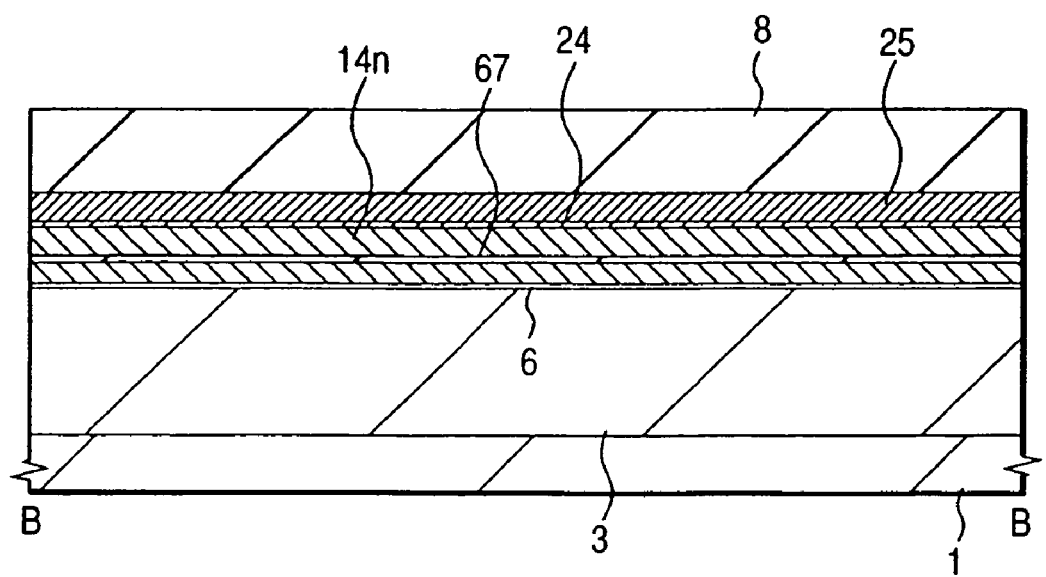
FIG. 71 is a fragmentary cross-sectional view of a semiconductor substrate illustrating the manufacturing process of the semiconductor integrated circuit device according to the still further embodiment of the present invention.

As illustrated in FIGS. 70 and 71, a P (phosphorus)-doped n type polycrystalline silicon film 14n, WN$_X$ film 24, W film 25 and silicon nitride film 8 are then successively deposited over the ONO film 67. The polycrystalline silicon film 14n, W film 25 and silicon nitride film 8 are deposited in similar manners to those employed in Embodiment 1. The WN$_X$ film 24 is deposited in a similar manner to that employed in Embodiment 2 in order to reduce the contact resistance with the polycrystalline silicon film 14n. Described specifically, the WN$_X$ film 24 is formed under the conditions so that it will have a nitrogen content of 7% to 10% or greater, preferably 13% or greater, more preferably 18% or greater upon completion of the element. The thickness of the WN$_X$ film 24 upon film formation is preferably adjusted to within a range of from 5 nm to 10 nm to leave a film of at least 1 nm thickness upon element completion. The process as described in Embodiment 3, 4 or 5 may be adopted in order to reduce the contact resistance between the WN$_X$ film 24 and the polycrystalline silicon film 14n.

The polycrystalline silicon film 14n is used as a control gate electrode and word line WL of the MISFET constituting the memory cell, while the silicon nitride film 8 is used as an insulating film for protecting the upper portion of the control gate electrode. The polycrystalline silicon film 14n may be constituted of a silicon film containing Ge (germanium) in an amount around 50% at the maximum.

Figure 72:
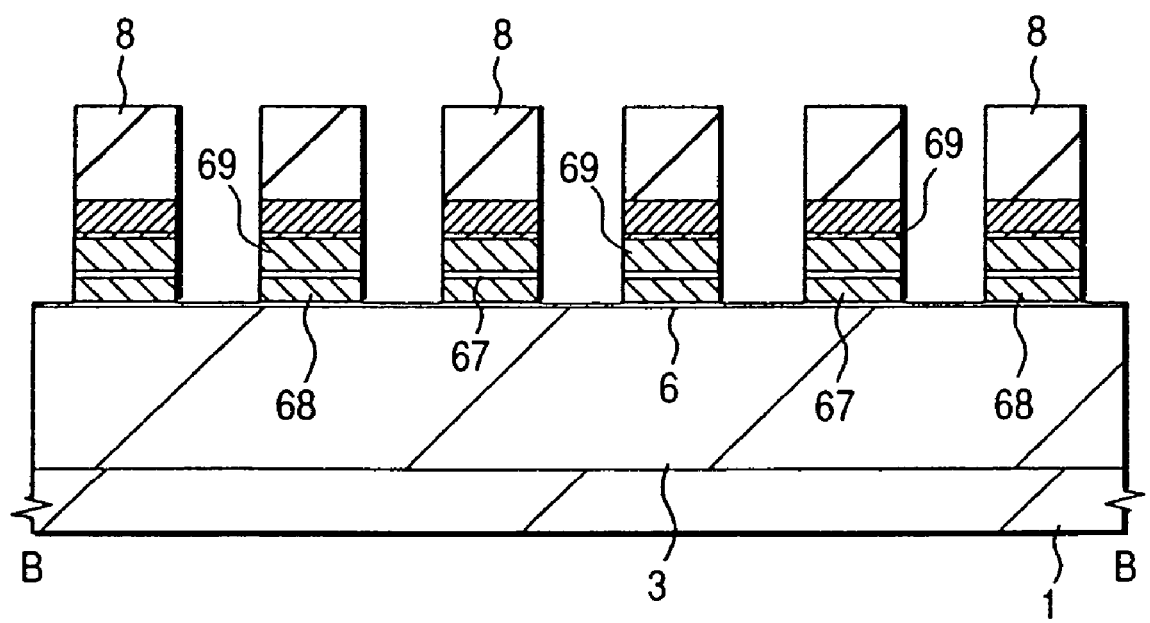
FIG. 72 is a fragmentary cross-sectional view of a semiconductor substrate illustrating the manufacturing process of the semiconductor integrated circuit device according to the still further embodiment of the present invention.

As illustrated in FIG. 72, with a photoresist film (not illustrated) formed over the silicon nitride film 8 as a mask, the silicon nitride film 8, W film 24, WN$_X$ film 25, polycrystalline silicon film 14n, ONO film 67 and polycrystalline silicon film 66n are dry etched successively, whereby a floating gate electrode 68 formed of the polycrystalline silicon film 66n and a control gate electrode 69 (word line WL) of a polymetal structure formed of the WN film 24, WN$_X$ film 25 and polycrystalline silicon film 14n are formed.

Figure 73:
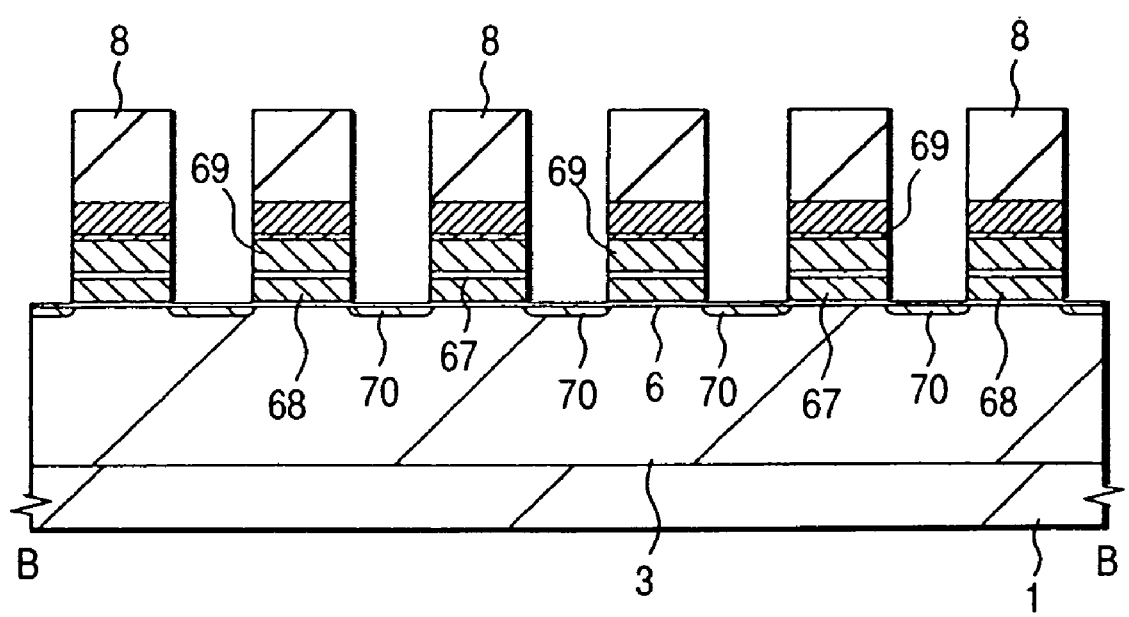
FIG. 73 is a fragmentary cross-sectional view of a semiconductor substrate illustrating the manufacturing process of the semiconductor integrated circuit device according to the still further embodiment of the present invention.
Figure 74:
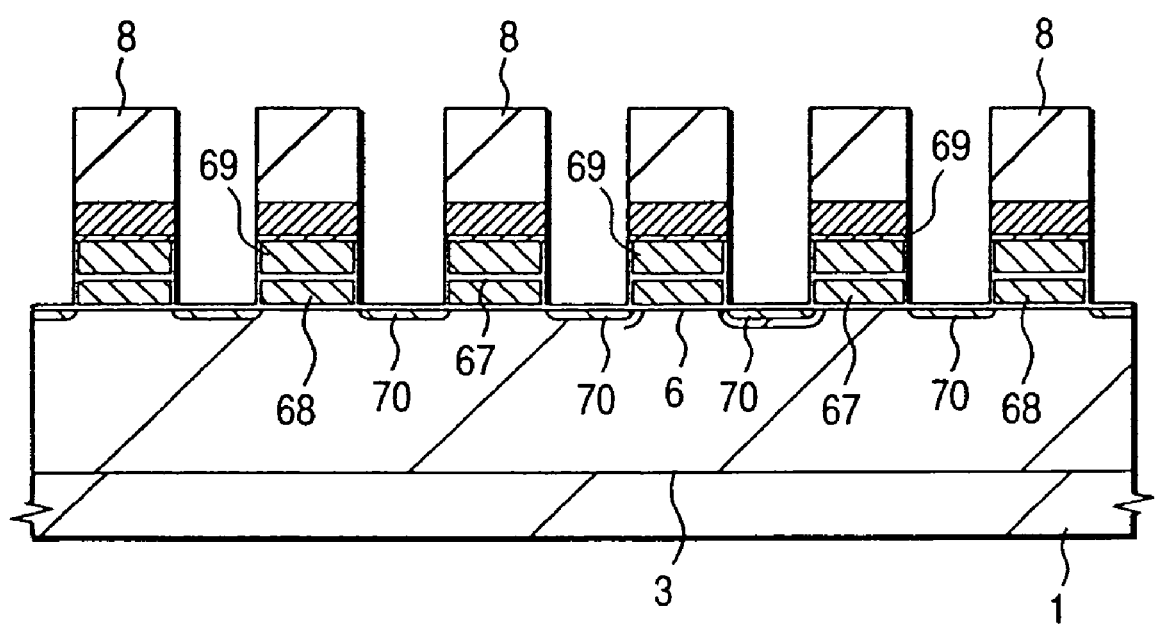
FIG. 74 is a fragmentary cross-sectional view of a semiconductor substrate illustrating the manufacturing process of the semiconductor integrated circuit device according to the still further embodiment of the present invention.
Figure 75:
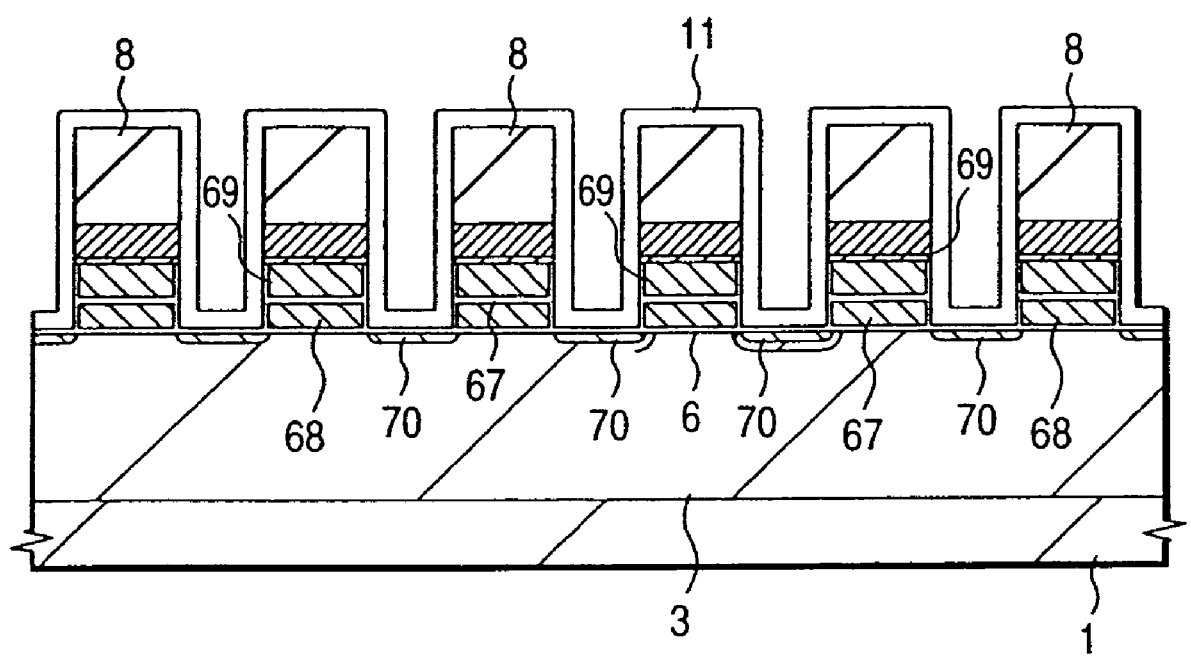
FIG. 75 is a fragmentary cross-sectional view of a semiconductor substrate illustrating the manufacturing process of the semiconductor integrated circuit device according to the still further embodiment of the present invention.

As illustrated in FIG. 73, n type semiconductor regions 70 constituting the source and drain of MISFET are formed. The n type semiconductor regions 70 are formed by carrying out ion implantation of an n type impurity (for example, arsenic (As)) into the p type well 3, and heat treating the substrate 1 at about 900° C., thereby diffusing the n type impurity into the p type well 3.

By the steps so far described, damages appear in the gate insulating film 6 in the space region of the gate electrodes (floating gate electrode 68 and control gate electrode) during the formation step of the gate electrodes or ion implantation step of the impurity. It is necessary to thoroughly remove these damages, because they deteriorate the quality of the gate insulating film 6 by, for example, becoming a leak path of electrons, which have injected into the floating gate electrode 68, from the end portion of the floating gate electrode 68 toward the substrate 1.

After etching the gate insulating film 6 with hydrofluoric acid, the re-oxidation treatment is conducted to make up for or regenerate a thinned portion of the gate insulating film 6. This re-oxidation treatment is carried out in a similar manner to that employed in Embodiment 1, whereby oxidation of each of the W film 25 and WN$_X$ film 24 is prevented and at the same time, the contamination of the surface of the substrate 1 with oxides can be suppressed to a remarkably low level. By this re-oxidation treatment, the gate insulating film 6 is re-formed in the space region of the gate electrodes (floating gate electrode 68 and control gate electrode 69), that is, on the surface of the n type semiconductor regions (source and drain) and the lower end portion of the side walls of the floating gate electrode 68.

After washing the surface of the substrate 1, a silicon nitride film 11 is deposited over the substrate 1 by low pressure CVD. By carrying out this washing treatment and deposition of the silicon nitride film 11 in similar manners to those employed in Embodiment 1, the contamination of the substrate 1 with oxides of W can be suppressed to an extremely low level.

The present inventions completed by the present inventors have so far been described specifically based on Embodiments. It should however be borne in mind that the present invention is not limited to these Embodiments, but can be modified within an extent not departing from the gist of the invention.

In the above-described embodiments, the present invention is applied to DRAM, DRAM-embedded logic LSI, CMOS logic LSI and flash memory. The present invention can however be applied widely not only to these LSIs but also LSIs with an MISFET having a gate electrode formed of a conductive film of a polymetal structure.

It is needless to say that the invention as described in this application can be applied to a non-polysilicon metal gate electrode free of a polysilicon layer except that the nature of the invention is closely associated with a polysilicon layer and the polysilicon layer is essential.

INDUSTRIAL APPLICABILITY

The present invention can be applied to the manufacture of, for example, integrated circuit devices having a polymetal gate.

The invention claimed is:

1. A process for manufacturing a semiconductor integrated circuit device, comprising the steps of:
  (a) forming a gate insulating film over a silicon-base surface region having silicon as one of principal constituents over a first main surface of a wafer;
  (b) forming, over the gate insulating film, a first silicon-base film having silicon as one of principal constituents;
  (c) doping an impurity into the first silicon-base film by ion implantation;
  (d) after the step (c), forming, over the first silicon-base film, a non-doped second silicon-base film having silicon as one of principal constituents;
  (e) forming, over the second silicon-base film, a first tungsten film to be a film having tungsten silicide as a principal component;
  (f) forming, over the first tungsten film, a tungsten nitride film, which will have a nitrogen content of 7% or greater upon completion of the element, by sputtering; and
  (g) forming, over the nitride film, a refractory metal film thicker than the first tungsten film and having tungsten or molybdenum as a principal component.

2. A process for manufacturing a semiconductor integrated circuit device according to claim 1, wherein the impurity concentration of the non-doped second silicon-base film just after formation is less than $1.0 \times 10^{17}$ cm$^3$.

3. A process for manufacturing a semiconductor integrated circuit device according to claim 1, wherein the non-doped second silicon-base film just after formation is in the amorphous form or an aggregate of ultra-fine crystal particles.

4. A process for manufacturing a semiconductor integrated circuit device according to claim 2, wherein the impurity concentration of the non-doped second silicon-base film just after formation is less than $1.0 \times 10^{14}$ cm$^3$.

5. A process for manufacturing a semiconductor integrated circuit device according to claim 1, wherein the nitride film has a nitrogen content of 10% or greater.

6. A process for manufacturing a semiconductor integrated circuit device according to claim 5, wherein the nitride film has a nitrogen content of 13% or greater.

7. A process for manufacturing a semiconductor integrated circuit device according to claim 6, wherein the nitride film has a nitrogen content of 18% or greater.

8. A process for manufacturing a semiconductor integrated circuit device, comprising the steps of:
  (a) forming a gate insulating film over a silicon-base surface region having silicon as one of principal constituents over a first main surface of a wafer;
  (b) forming, over the gate insulating film, a first silicon-base film having silicon as one of principal constituents and doped with an impurity;
  (c) forming, over the first silicon-base film, a non-doped second silicon-base film having silicon as one of principal constituents;
  (d) forming, over the second silicon-base film, a first tungsten film to be a film having tungsten silicide as a principal component;
  (e) forming, over the first tungsten film, a tungsten nitride film, which will have a nitrogen content of 7% or greater upon completion of the element, by sputtering; and
  (f) forming, over the nitride film, a refractory metal film thicker than the first tungsten film and having tungsten or molybdenum as a principal component.

9. A process for manufacturing a semiconductor integrated circuit device according to claim 8, wherein the impurity concentration of the non-doped second silicon-base film just after formation is less than $1.0 \times 10^{17}$ cm$^3$.

10. A process for manufacturing a semiconductor integrated circuit device according to claim 8, wherein the non-doped second silicon-base film just after formation is in the amorphous form or an aggregate of ultra-fine crystal particles.

11. A process for manufacturing a semiconductor integrated circuit device according to claim 9, wherein the impurity concentration of the non-doped second silicon-base film just after formation is less than $1.0 \times 10^{14}$ cm$^3$.

12. A process for manufacturing a semiconductor integrated circuit device according to claim 8, wherein the nitride film has a nitrogen content of 10% or greater upon completion of the element.

13. A process for manufacturing a semiconductor integrated circuit device according to claim 12, wherein the nitride film has a nitrogen content of 13% or greater upon completion of the element.

14. A process for manufacturing a semiconductor integrated circuit device according to claim 13, wherein the nitride film has a nitrogen content of 18% or greater upon completion of the element.

15. A process for manufacturing a semiconductor integrated circuit device according to claim 8, wherein the impurity concentration of the first silicon-base film just after formation is less than $1.0 \times 10^{19}$ cm$^3$.

16. A process for manufacturing a semiconductor integrated circuit device, comprising the steps of:
- (a) forming a gate insulating film over a silicon-base surface region having silicon as one of principal constituents over a first main surface of a wafer;
- (b) forming, over the gate insulating film, an n-conductivity type or p-conductivity type silicon-base film having silicon as one of principal constituents;
- (c) after the step (b), introducing an impurity having the same conductivity type as that of an impurity contained in the silicon-base film into the surface region of the silicon-base film by ion implantation;
- (d) after the step (c), forming, over the silicon-base film, a first refractory metal film having tungsten as one of principal components;
- (e) forming, over the first refractory metal film, a nitride film containing tungsten nitride; and
- (f) forming, over the nitride film, a second refractory metal film having tungsten or molybdenum as a principal component wherein an impurity concentration of the silicon-base film after ion implantation of the step (c) is $5 \times 10^{19}$ atoms/cm$^3$ or greater, and wherein a region having the impurity concentration of $5 \times 10^{19}$ atoms/cm$^3$ or greater is maintained at least in the silicon-base region of 10 nm or less deep from an interface with a metallic conductor layer.

17. A process for manufacturing a semiconductor integrated circuit device according to claim 16, wherein said metallic conductor layer is one of metal, metal nitride, and a metal compound.

18. A process for manufacturing a semiconductor integrated circuit device according to claim 16, wherein the step (b) comprises the steps of:
  forming, over the gate insulating film, a silicon-base film having silicon as one of principal constituents and containing an n-type impurity or a p-type impurity; and
  heat treating the silicon-base film, thereby electrically activating the n-type impurity or p-type impurity.

19. A process for manufacturing a semiconductor integrated circuit device according to claim 16, further comprising, after the step (b) but prior to the step (d), a step of forming, over the silicon-base film, a refractory metal film having tungsten or molybdenum as a principal component.

20. A process for manufacturing a semiconductor integrated circuit device, comprising the steps of:
- (a) forming a gate insulating film over a silicon-base surface region having silicon as one of principal constituents over a first main surface of a wafer;
- (b) forming, over the gate insulating film, an n-conductivity type or p-conductivity type silicon-base film having silicon as one of principal constituents;
- (c) after the step (b), forming, over the silicon-base film, a film containing an impurity having the same conductivity type as that of an impurity contained in the silicon-base film;
- (d) heat treating the film formed in the step (c) thereby diffusing the impurity contained in the film into the surface region of the silicon-base film;
- (e) after the step (d), removing the film over the silicon-base film;
- (f) after the step (e), forming, over the silicon-base film, a first refractory metal film having tungsten as one of principal components;
- (g) forming, over the first refractory metal film, a nitride film containing tungsten nitride; and
- (h) forming, over the nitride film, a second refractory metal film having tungsten or molybdenum as a principal component.

21. A process for manufacturing a semiconductor integrated circuit device according to claim 20, wherein the impurity concentration of the surface region of the silicon-base film after heat treatment of the step (d) is $5 \times 10^{19}$ atoms/cm$^3$ or greater.

22. A process for manufacturing a semiconductor integrated circuit device according to claim 21, wherein the surface region having the impurity concentration of $5 \times 10^{19}$ atoms/cm$^3$ or greater is maintained at least in the silicon-base region of 10 nm or less deep from the interface with a metallic conductor layer.

23. A process for manufacturing a semiconductor integrated circuit device according to claim 22, wherein said metallic conductor layer is one of metal, metal nitride, and a metal compound.

24. A process for manufacturing a semiconductor integrated circuit device according to claim 20, wherein the step (b) comprises the steps of:
  forming, over the gate insulating film, a silicon-base film having silicon as one of principal constituents and containing an n-type impurity or a p-type impurity; and
  heat treating the silicon-base film, thereby electrically activating the n-type impurity or p-type impurity.

25. A process for manufacturing a semiconductor integrated circuit device according to claim 20, wherein the film formed in the step (c) has silicon as a principal component.

26. A process for manufacturing a semiconductor integrated circuit device, comprising the steps of:
- (a) forming a gate insulating film over a silicon-base surface region having silicon as one of principal constituents over a first main surface of a wafer;
- (b) forming, over the gate insulating film, an n-conductivity type silicon-base film having silicon as one of principal constituents;
- (c) after the step (b), introducing an n-type impurity into the surface region of the silicon-base film by ion implantation;
- (d) after the step (c), forming a film over the silicon-base film;
- (e) heat treating the silicon-base film, thereby causing segregation of the n-type impurity, which has been introduced into the surface region of the silicon-base film, in the vicinity of the interface with the film formed in the step (d);
- (f) after the step (e), removing the film over the silicon-base film;
- (g) after the step (f), forming, over the silicon-base film, a nitride film containing tungsten nitride; and
- (h) forming, over the nitride film, a refractory metal film having tungsten or molybdenum as a principal component.

27. A process for manufacturing a semiconductor integrated circuit device according to claim 26, wherein the concentration of the n-type impurity segregated in the vicinity of the interface with the silicon oxide film is $5 \times 10^{19}$ atoms/cm$^3$ or greater.

28. A process for manufacturing a semiconductor integrated circuit device according to claim 26, wherein the step (b) comprises the steps of:
  forming, over the gate insulating film, a silicon base film having silicon as one of principal constituents and containing an n-type impurity; and
  heat treating the silicon-base film, thereby electrically activating the n-type impurity.

29. A process for manufacturing a semiconductor integrated circuit device according to claim 26, further comprising, after the step (f) but prior to the step (g), a step of forming, over the silicon-base film, a refractory metal film having tungsten or molybdenum as a principal component.

30. A process for manufacturing a semiconductor integrated circuit device according to claim 26, wherein the nitride film has a nitrogen content of 10% or greater upon element completion.

31. A process for manufacturing a semiconductor integrated circuit device according to claim 30, wherein the nitride film has a nitrogen content of 13% or greater upon element completion.

32. A process for manufacturing a semiconductor integrated circuit device according to claim 31, wherein the nitride film has a nitrogen content of 18% or greater upon element completion.

33. A process for manufacturing a semiconductor integrated circuit device according to claim 26, wherein the film formed in the step (d) is a silicon oxide film formed by thermal oxidation of the silicon-base film or a silicon oxide film deposited by chemical vapor deposition over the silicon-base film.

* * * * *